United States Patent
Nishimura

(10) Patent No.: US 9,921,273 B2
(45) Date of Patent: Mar. 20, 2018

(54) HALL ELECTROMOTIVE FORCE SIGNAL DETECTION CIRCUIT, CURRENT SENSOR THEREOF, AND HALL ELEMENT DRIVING METHOD

(71) Applicant: ASAHI KASEI MICRODEVICES CORPORATION, Tokyo (JP)

(72) Inventor: Yoshiyasu Nishimura, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 294 days.

(21) Appl. No.: 14/778,852

(22) PCT Filed: Jan. 17, 2014

(86) PCT No.: PCT/JP2014/000227
§ 371 (c)(1),
(2) Date: Sep. 21, 2015

(87) PCT Pub. No.: WO2014/155908
PCT Pub. Date: Oct. 2, 2014

(65) Prior Publication Data
US 2016/0047864 A1 Feb. 18, 2016

(30) Foreign Application Priority Data

Mar. 28, 2013 (JP) .................. 2013-069501
Jul. 30, 2013 (JP) .................. 2013-157826

(51) Int. Cl.
*G01R 33/07* (2006.01)
*G01R 33/00* (2006.01)
*G01R 15/20* (2006.01)

(52) U.S. Cl.
CPC ....... *G01R 33/0029* (2013.01); *G01R 15/202* (2013.01); *G01R 33/07* (2013.01)

(58) Field of Classification Search
CPC ................... G01R 33/07; G01R 15/202
(Continued)

(56) References Cited

U.S. PATENT DOCUMENTS 5,621,319 A 4/1997 Bilotti et al.
5,844,427 A 12/1998 Theus et al.
(Continued)

FOREIGN PATENT DOCUMENTS

JP H09-196699 A 7/1997
JP 2005-274491 A 10/2005
(Continued)

OTHER PUBLICATIONS

Popovic, "Hall Effect Devices: Magnetic Sensors and Characterization of Semiconductors", Inst of Physics Pub, Inc., pp. 186-191, 1991.
(Continued)

*Primary Examiner* — Reena Aurora
(74) *Attorney, Agent, or Firm* — Morgan, Lewis & Bockius LLP

(57) ABSTRACT

The present embodiment relates to a Hall electromotive force signal detection circuit. The third switch circuit selects a terminal position for applying a driving current out of four terminals of the third Hall element and switches the terminal position among the first terminal, the second terminal, the fourth terminal, and the third terminal in this order. The fourth switch circuit switches a terminal position for applying the driving current to the terminal in turn, among the first to the fourth terminal of the fourth Hall element, such that this terminal position is different from that selected by the third switch circuit and faces the terminal position for injecting the driving current in the third Hall element. A chopper clock generation circuit supplies a chopper clock
(Continued)

signal with different four phases to the third switch circuit and to the fourth switch circuit.

7 Claims, 37 Drawing Sheets

(58) Field of Classification Search
USPC .............................................. 324/251, 207.2
See application file for complete search history.

(56) References Cited

U.S. PATENT DOCUMENTS

| | | | |
|---|---|---|---|
| 6,927,572 | B2 | 8/2005 | Motz |
| 2003/0155912 | A1 | 8/2003 | Motz |
| 2007/0029999 | A1 | 2/2007 | Middelhoek et al. |
| 2008/0030191 | A1 | 2/2008 | Nishikawa |
| 2009/0009164 | A1 | 1/2009 | Utsuno |
| 2011/0101975 | A1 | 5/2011 | Popovic et al. |
| 2012/0112740 | A1* | 5/2012 | Han .................. G01R 33/07 324/251 |
| 2012/0194179 | A1 | 8/2012 | Motz |

FOREIGN PATENT DOCUMENTS

| | | |
|---|---|---|
| JP | 2008-309626 A | 12/2008 |
| JP | 2009-229302 A | 10/2009 |
| JP | 2011-516873 A | 5/2011 |
| JP | 2011-169698 A | 9/2011 |
| JP | 2012-150003 A | 8/2012 |
| WO | 2012/148646 A1 | 11/2012 |

OTHER PUBLICATIONS

Bilotti, et al., "Monolithic Magnetic Hall Sensor Using Dynamic Quadrature Offset Cancellation", IEEE Journal of Solid-State Circuits, vol. 32, pp. 829-836, 1997.

International Search Report dated Apr. 8, 2015 for corresponding International application No. PCT/JP2014/000227.

International Preliminary Report on Patentability dated Oct. 8, 2015, for the corresponding International application No. PCT/JP2014/000227.

* cited by examiner

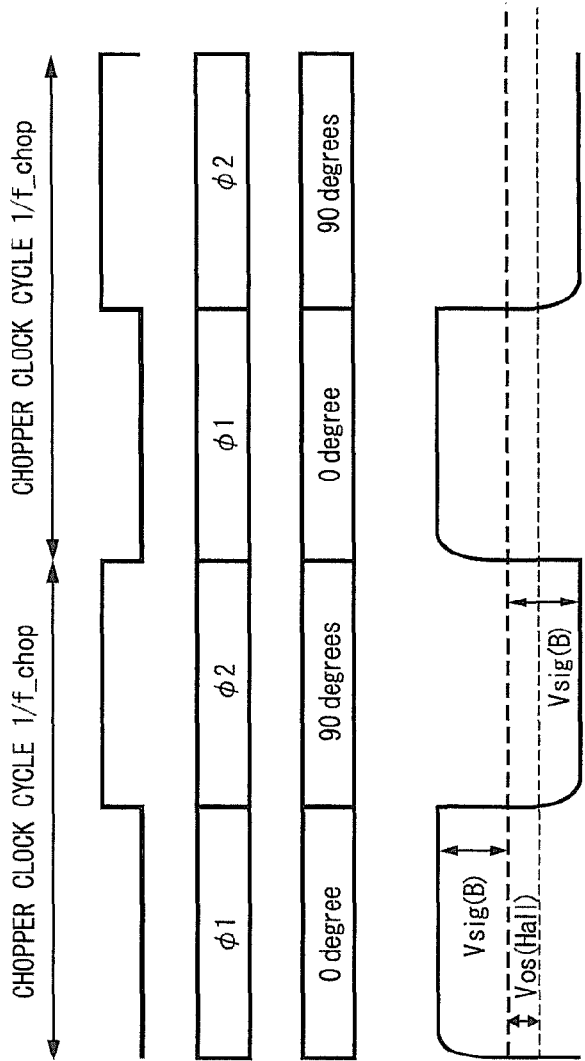

PRIOR ART

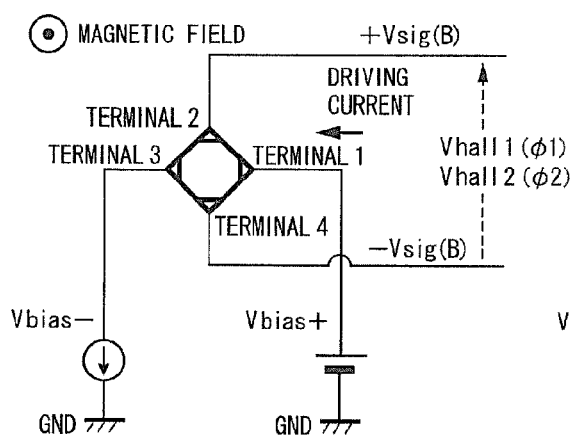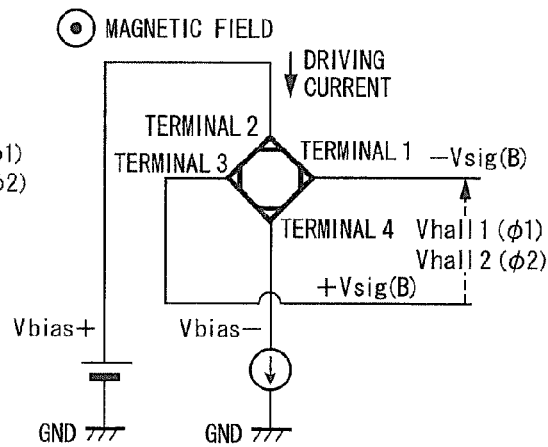
FIG. 5A
PRIOR ART
FIG. 5B
PRIOR ART

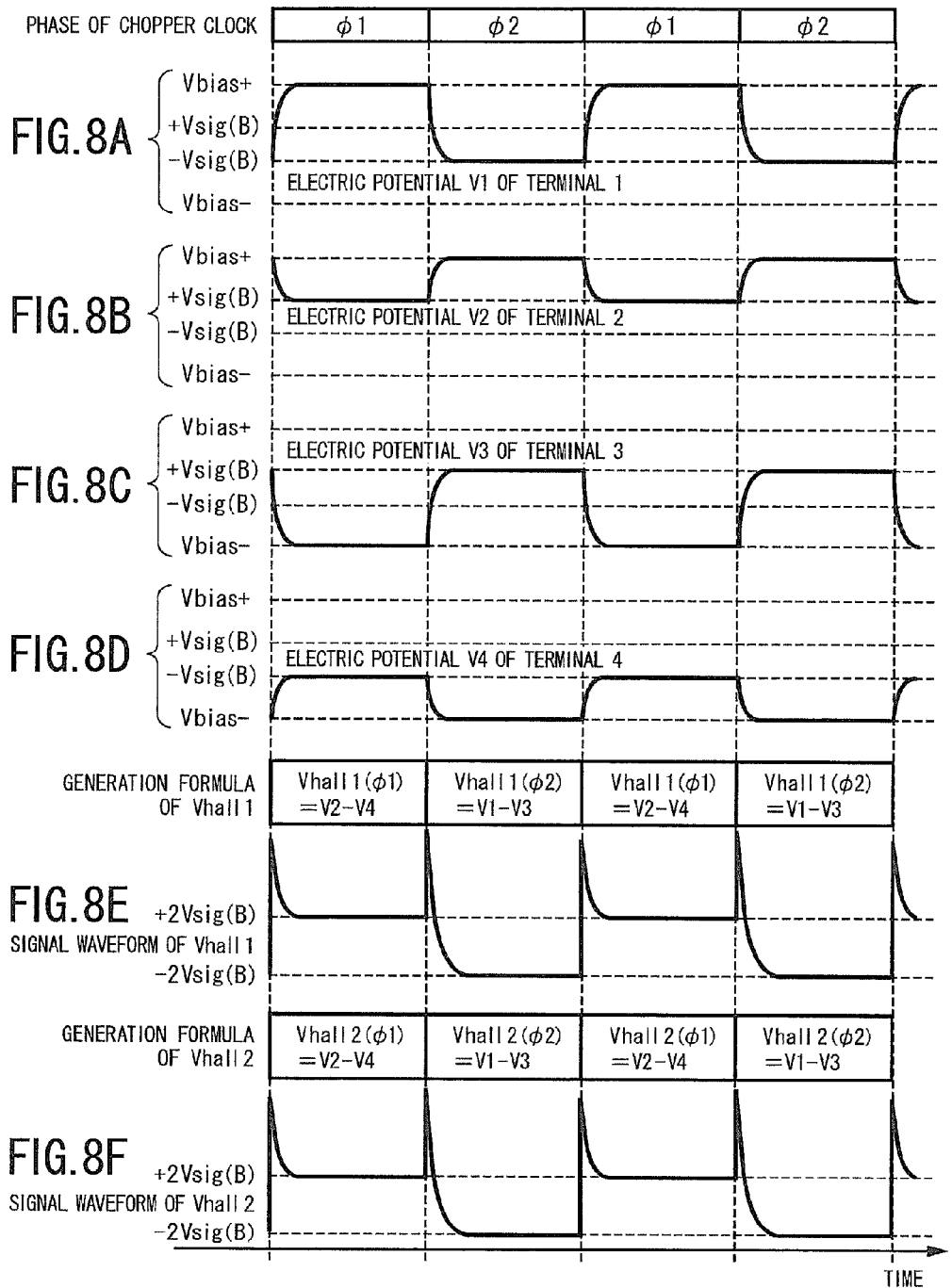

FIG. 9A
SIGNAL WAVEFORM OF Vhall 1 AFTER DEMODULATION

FIG. 9B
SIGNAL WAVEFORM OF Vhall 2 AFTER DEMODULATION

FIG. 9C
SIGNAL WAVEFORM OF OUTPUT SIGNAL Vhall_sum

SIGNAL WAVEFORM OF Vhall 1 AFTER DEMODULATION + Vhall 2 AFTER DEMODULATION

SUCH A SPIKE-LIKE ERROR SIGNAL IS OBSTACLE TO IMPROVEMENT OF ACCURACY

PHASE OF CHOPPER CLOCK: $\phi 1$, $\phi 2$, $\phi 1$, $\phi 2$

TIME

PRIOR ART

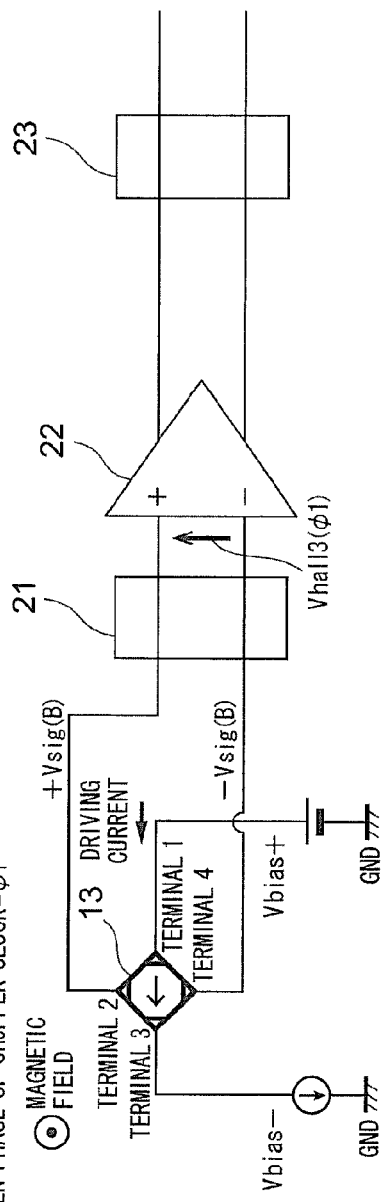
FIG. 11Aa  STATE OF 0 DEGREE
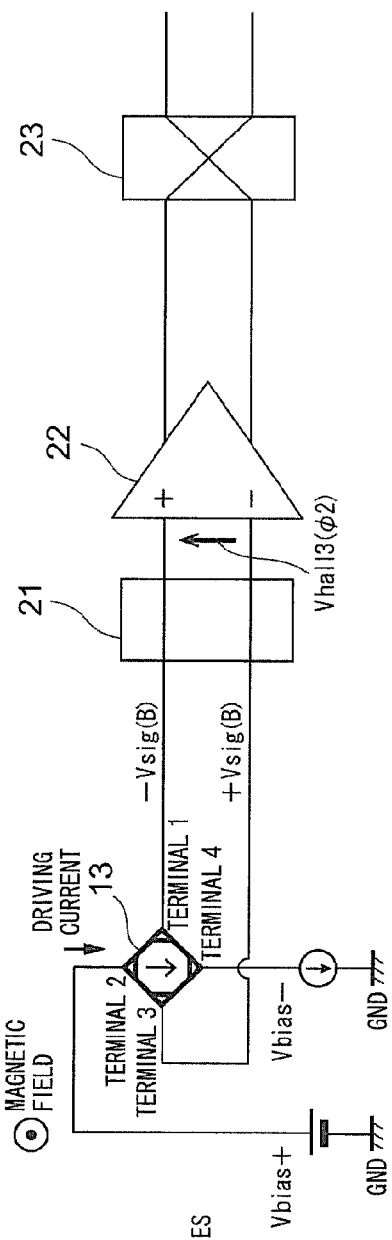
FIG. 11Ab  STATE OF 90 DEGREES

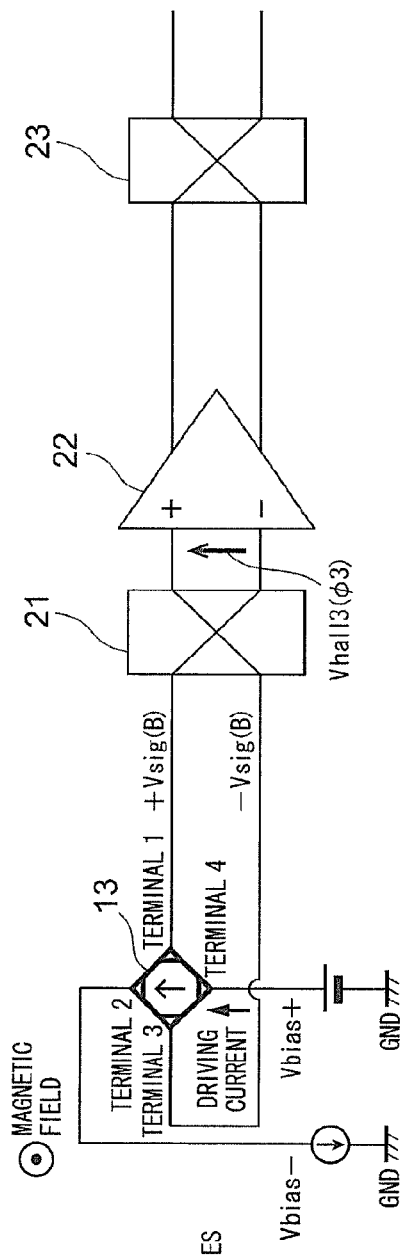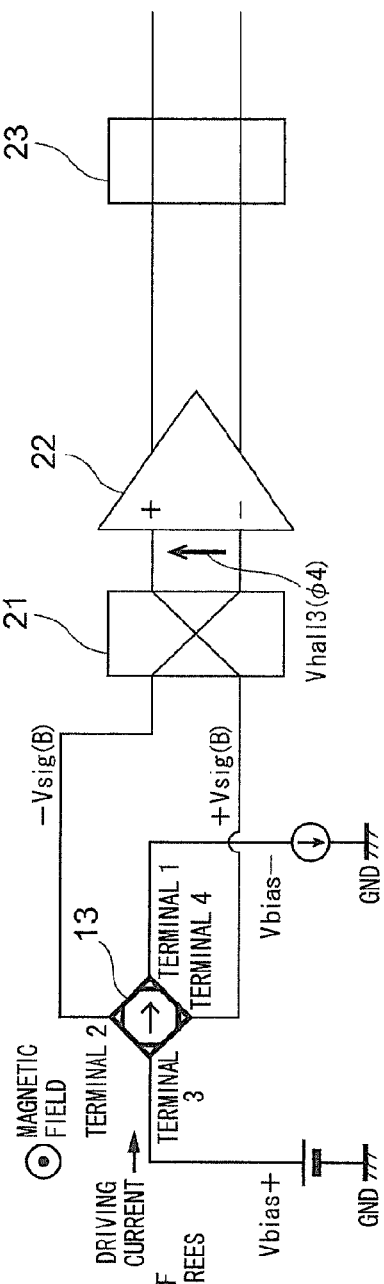

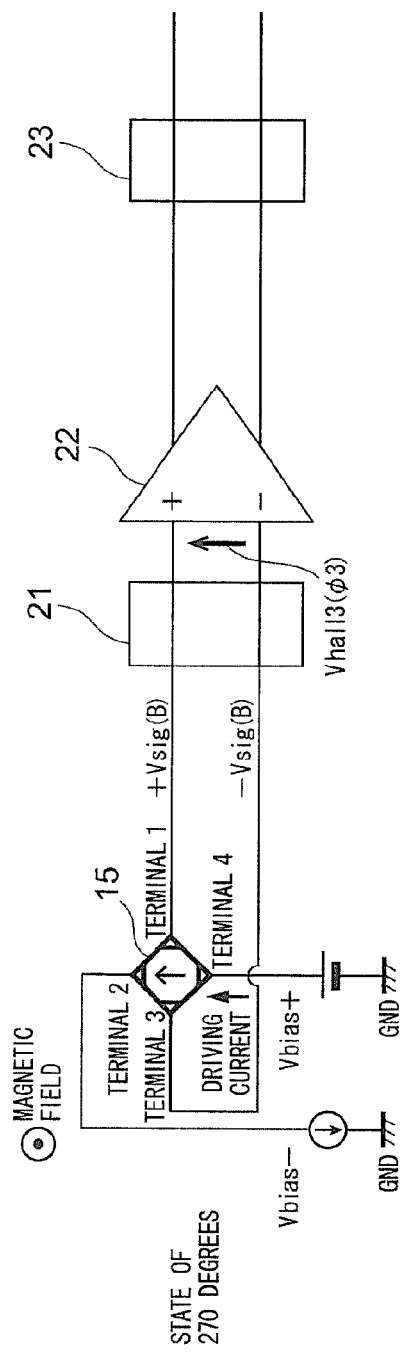
FIG. 12Aa STATE OF 270 DEGREES
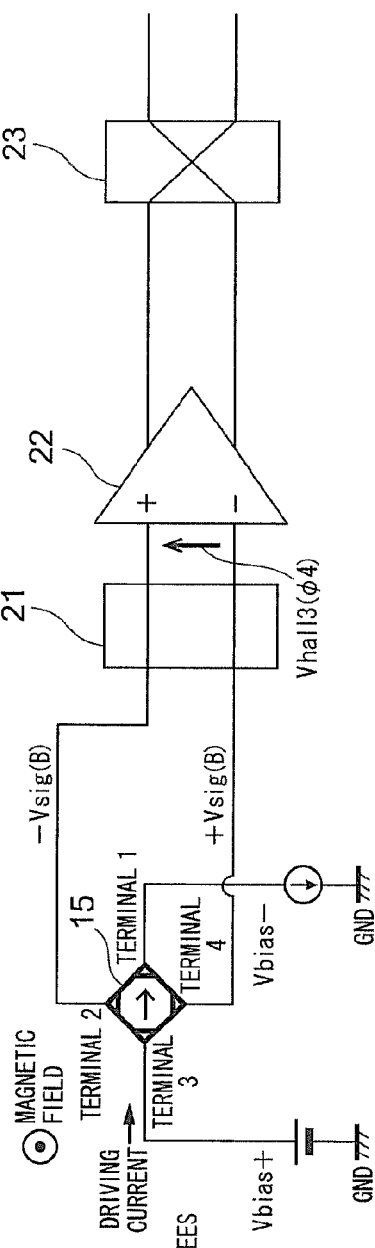
FIG. 12Ab STATE OF 180 DEGREES

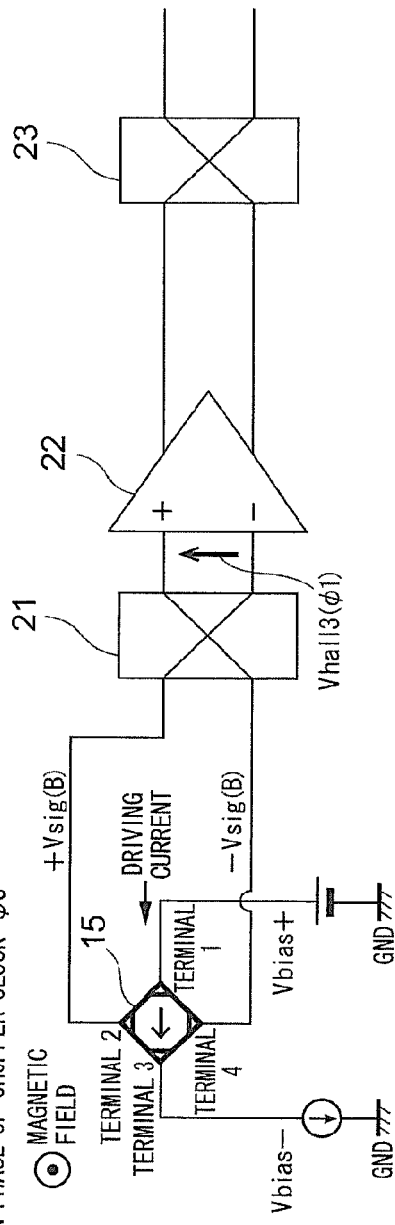
F I G. 12Bc  STATE OF 0 DEGREE
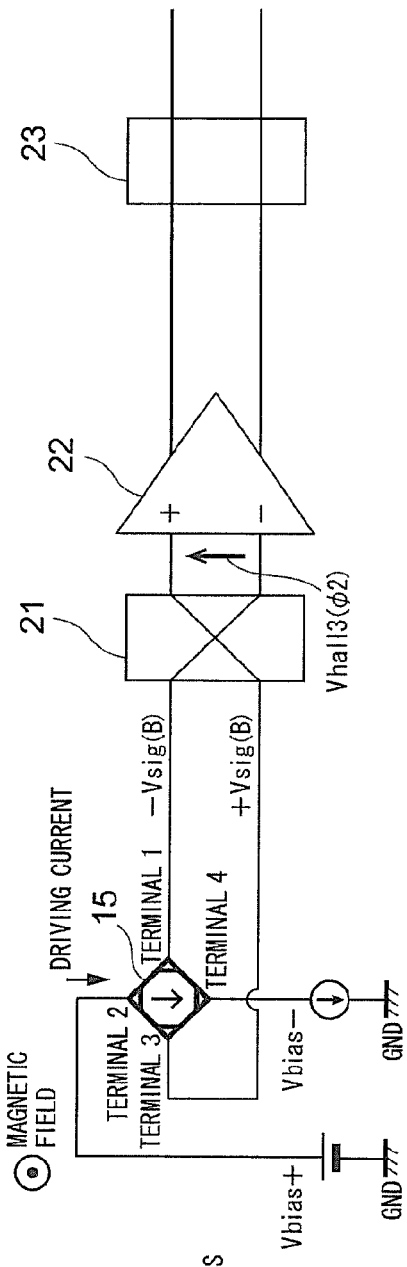
F I G. 12Bd  STATE OF 90 DEGREES

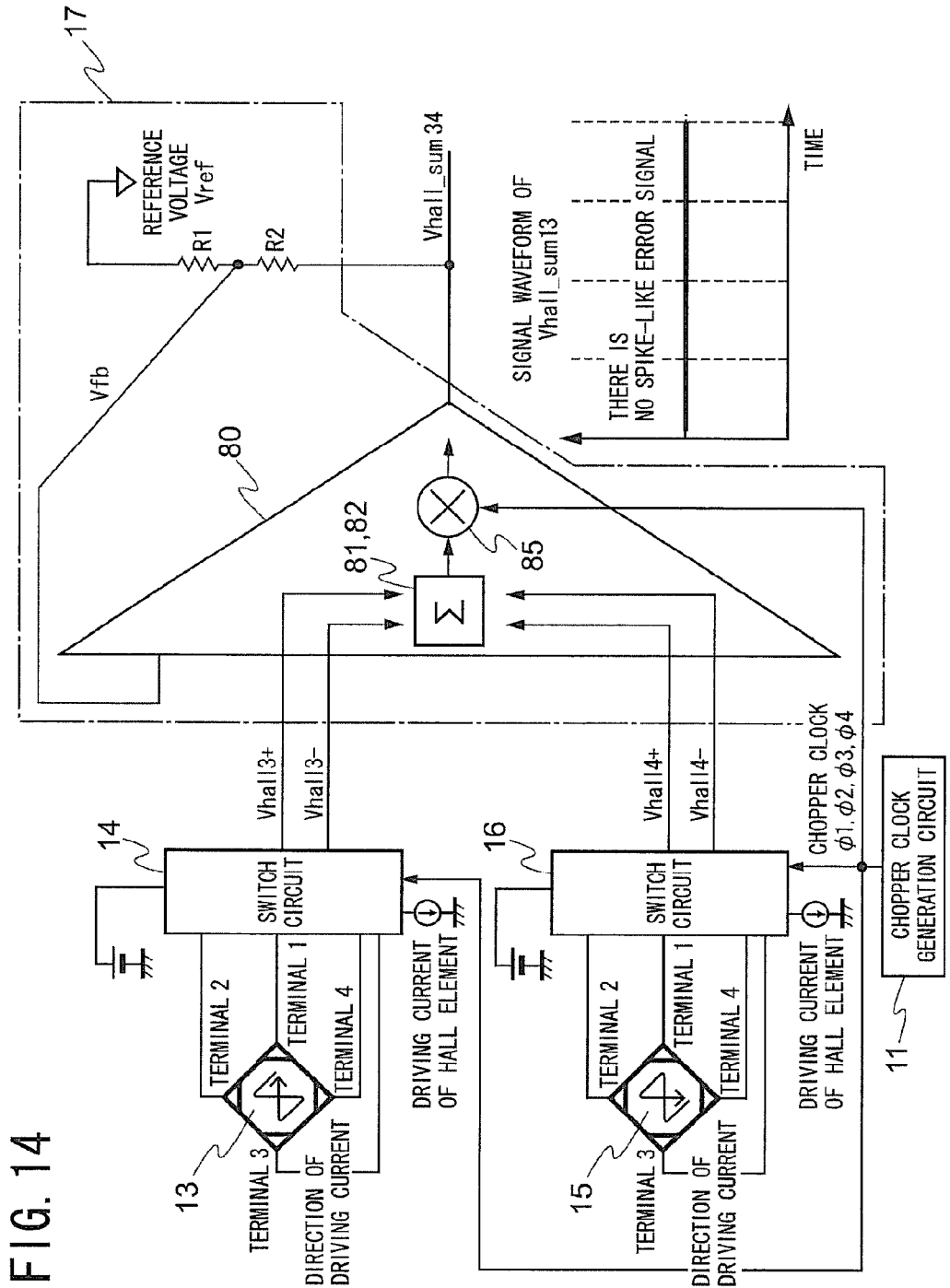

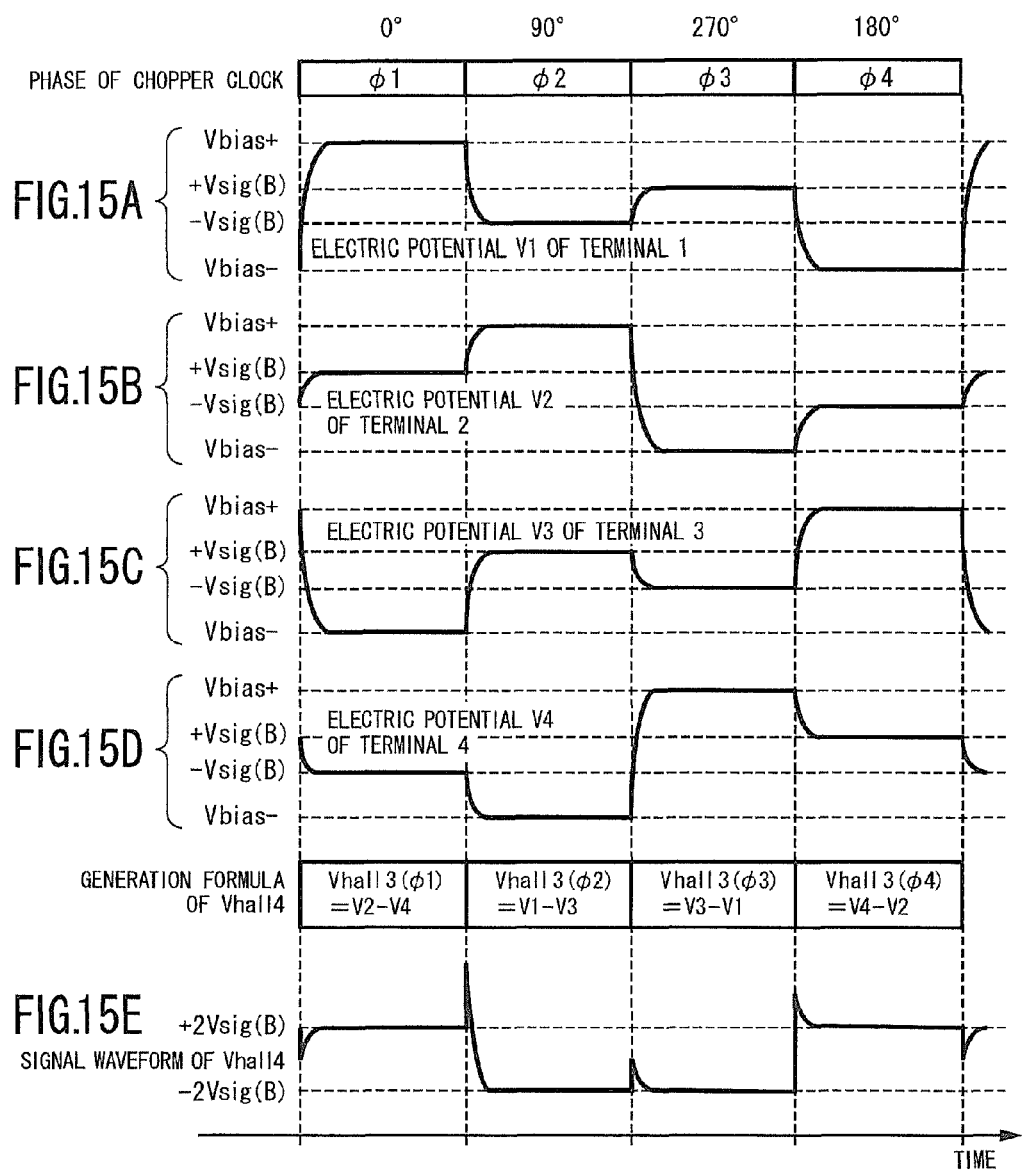

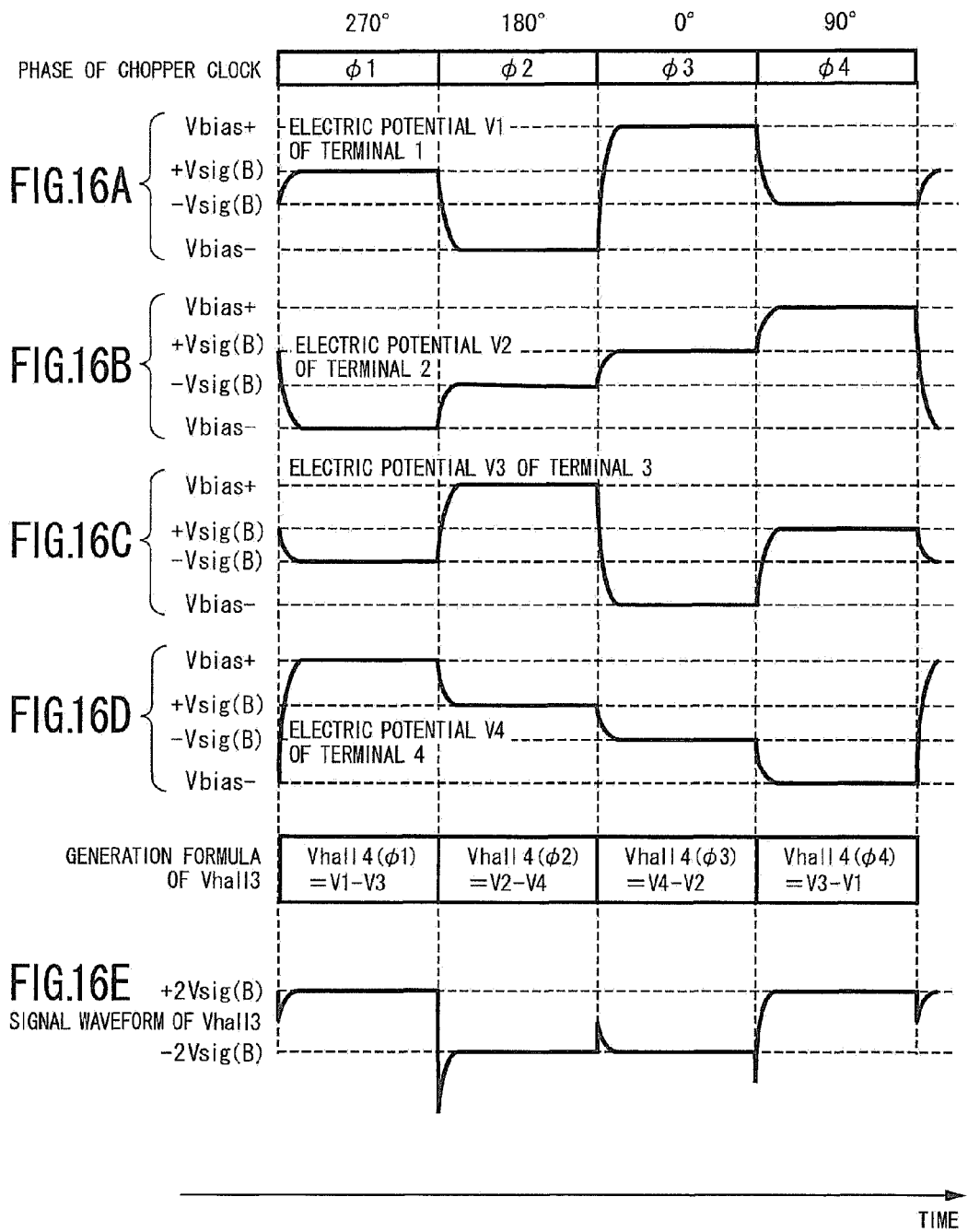

| PHASE OF CHOPPER CLOCK | φ1 | φ2 | φ3 | φ4 |

FIG. 17A
DEMODULATION
CHOPPER CLOCK    High
                 Low

FIG. 17B
SIGNAL WAVEFORM
OF Vhall3 AFTER
DEMODULATION
+2Vsig(B)
0
−2Vsig(B)

FIG. 17C
SIGNAL WAVEFORM
OF Vhall4 AFTER
DEMODULATION
+2Vsig(B)
0
−2Vsig(B)

FIG. 17D
SIGNAL WAVEFORM
OF OUTPUT SIGNAL
Vhall_sum34

SIGNAL WAVEFORM OF Vhall3 AFTER DEMODULATION
+ Vhall4 AFTER DEMODULATION

+4Vsig(B)
+2Vsig(B)
0      SPIKE-LIKE ERROR SIGNAL IS ELIMINATED
−2Vsig(B)
−4Vsig(B)

TIME

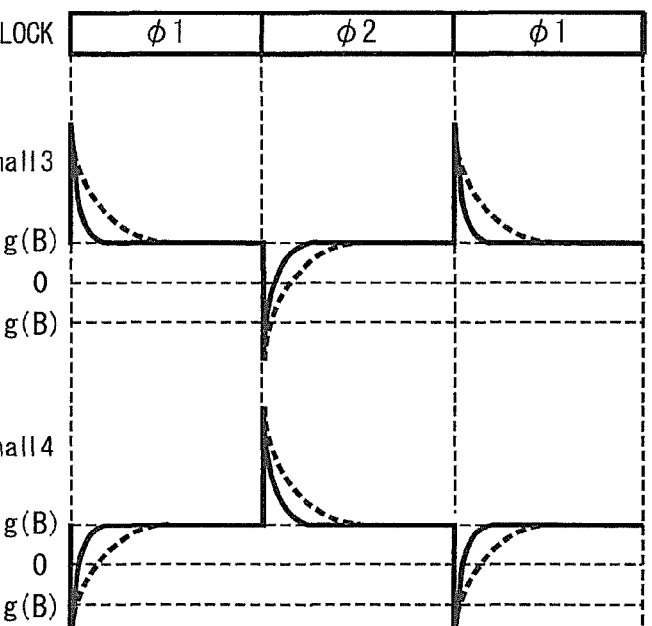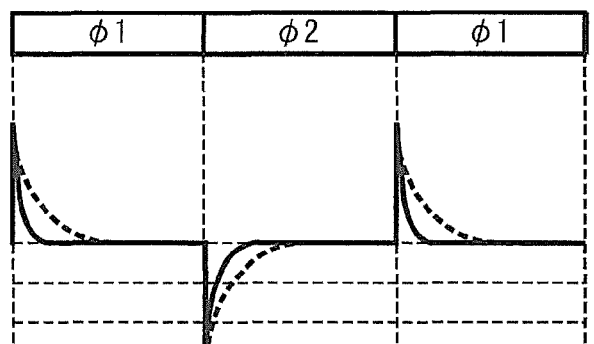
FIG. 21A
SIGNAL WAVEFORM OF Vhall3
AFTER DEMODULATION
FIG. 21B
SIGNAL WAVEFORM OF Vhall4
AFTER DEMODULATION

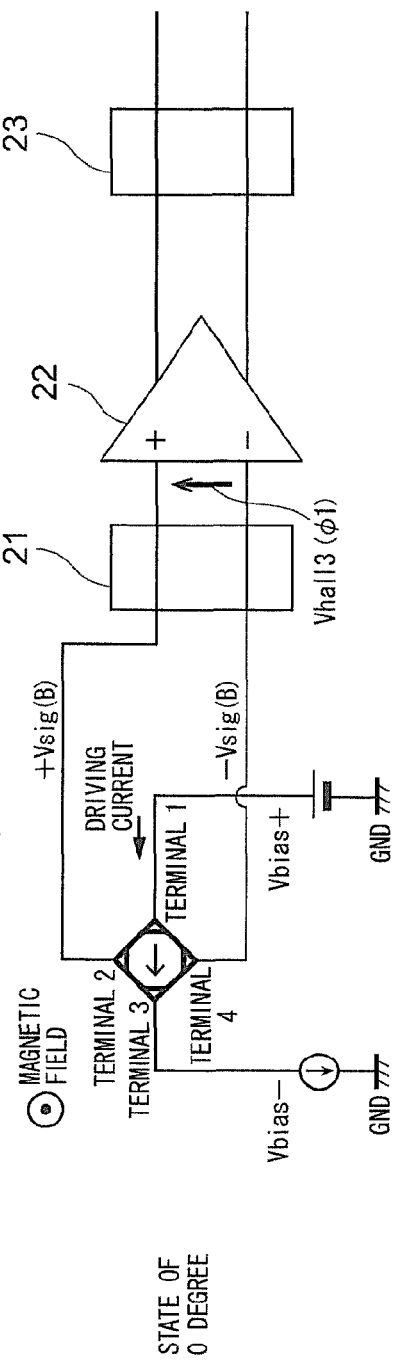
FIG. 23Aa  STATE OF 0 DEGREE
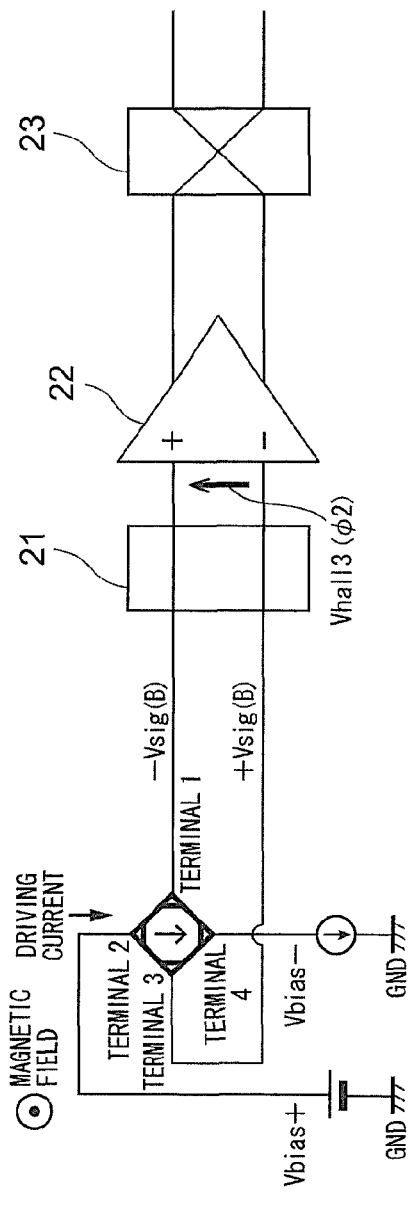
FIG. 23Ab  STATE OF 90 DEGREES

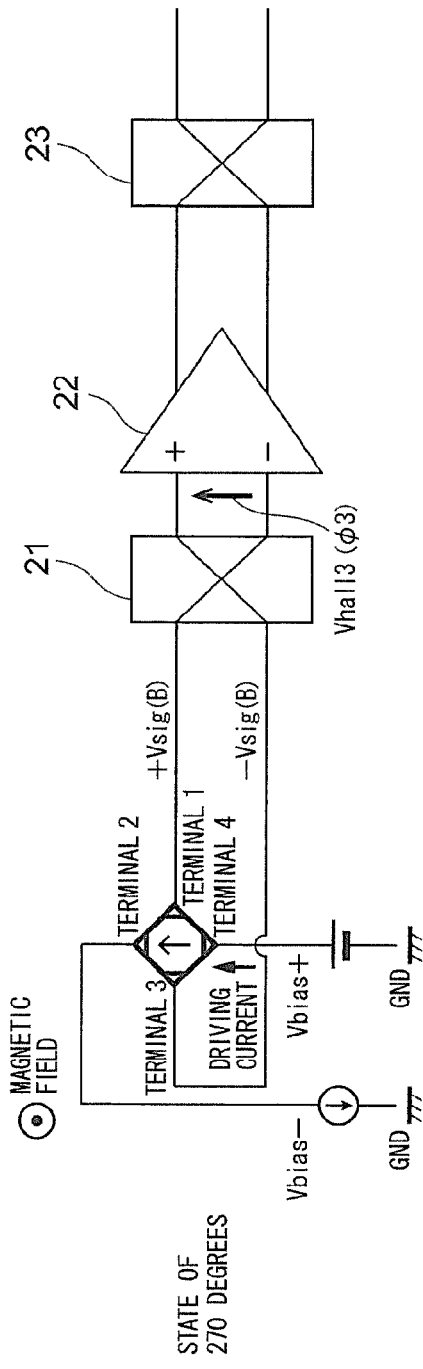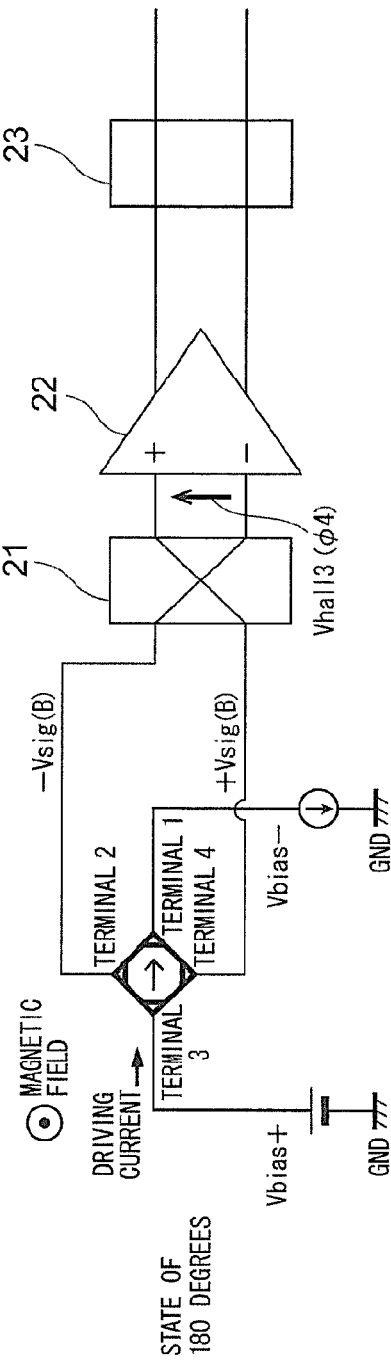

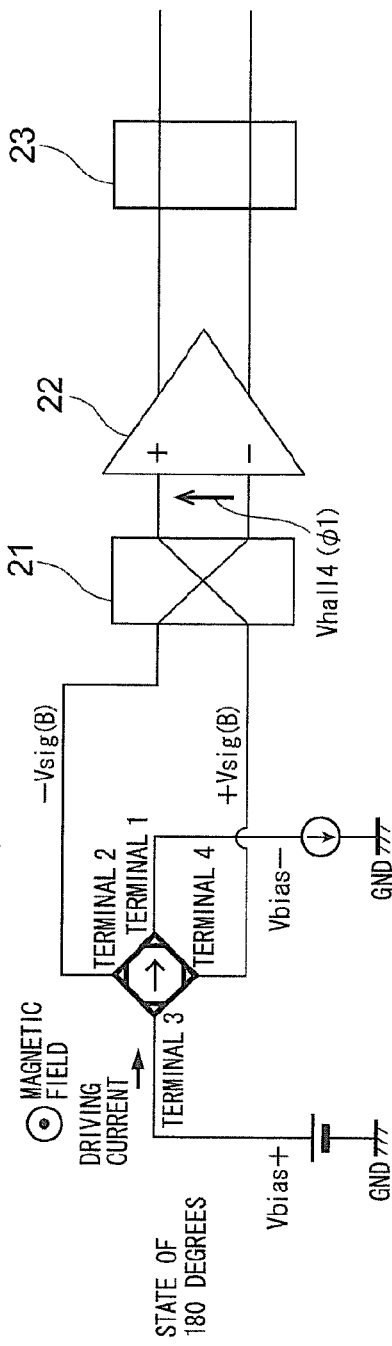
F I G. 24Aa
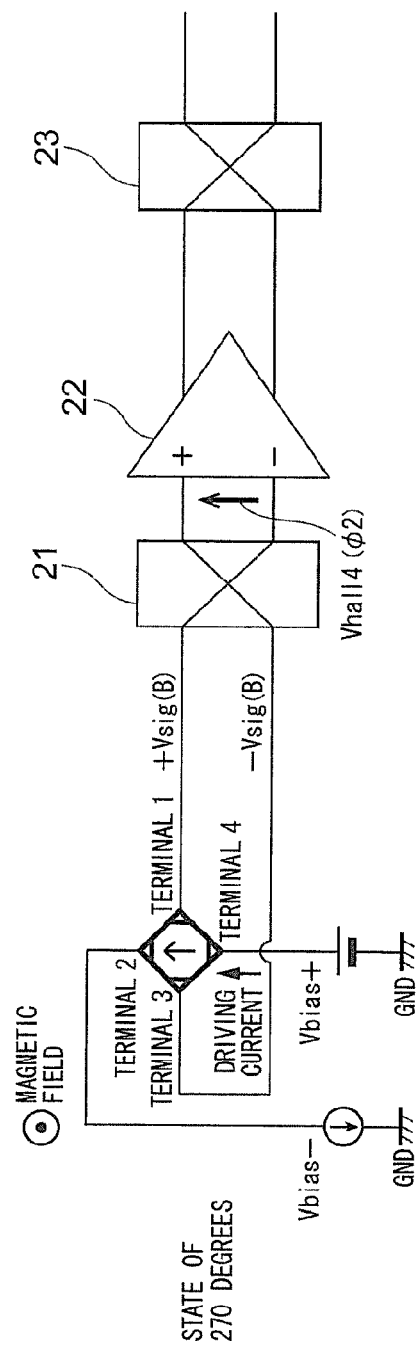
F I G. 24Ab

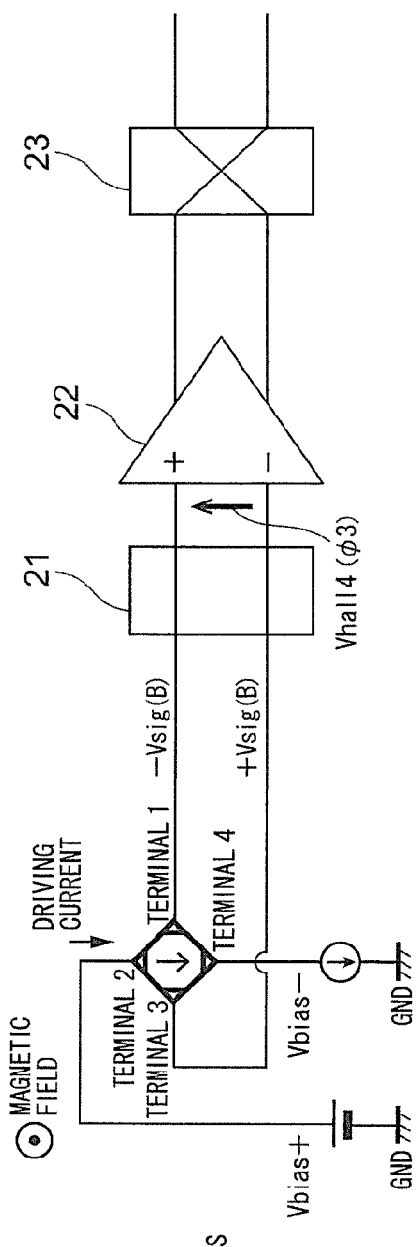
F I G. 24Bc
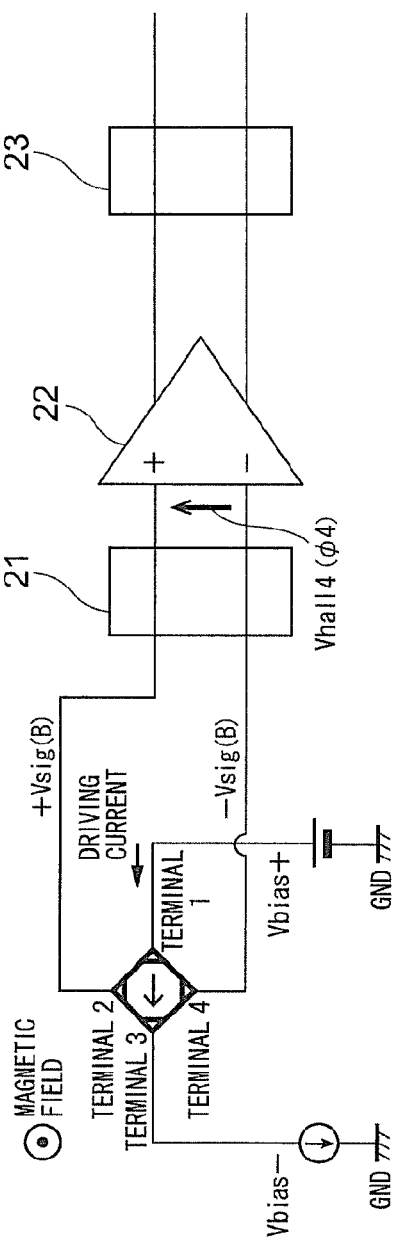
F I G. 24Bd

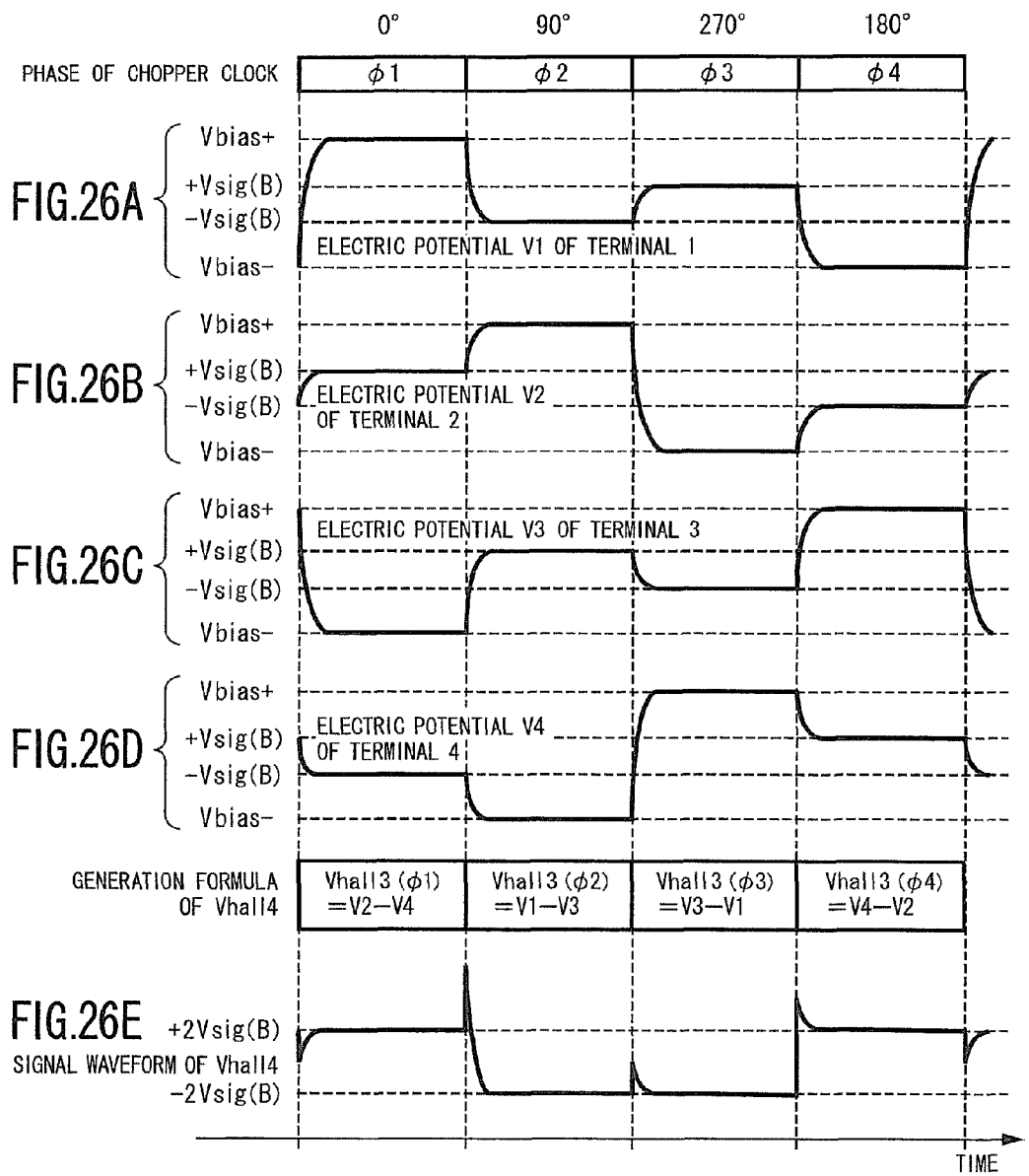

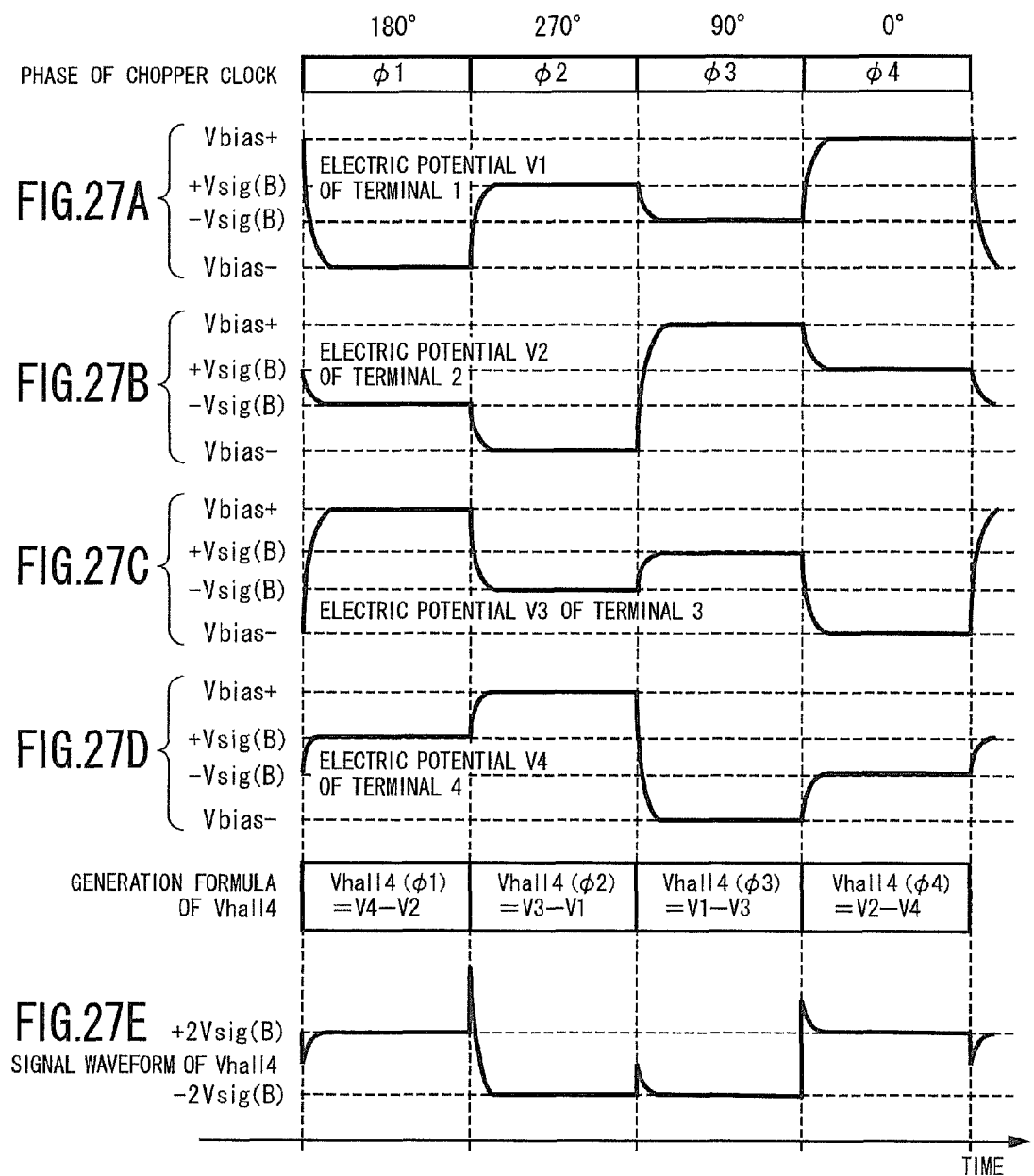

| PHASE OF CHOPPER CLOCK | φ1 | φ2 | φ3 | φ4 |

FIG. 28A
DEMODULATION CHOPPER CLOCK

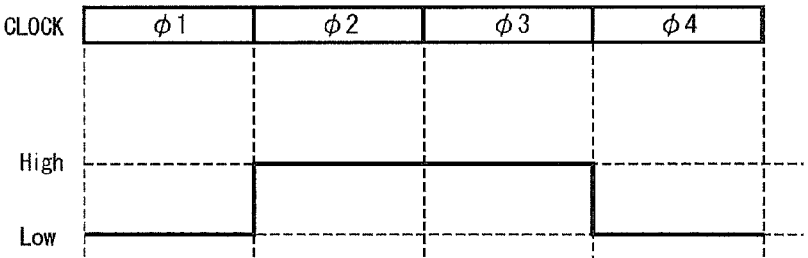

FIG. 28B
SIGNAL WAVEFORM OF Vhall3 AFTER DEMODULATION

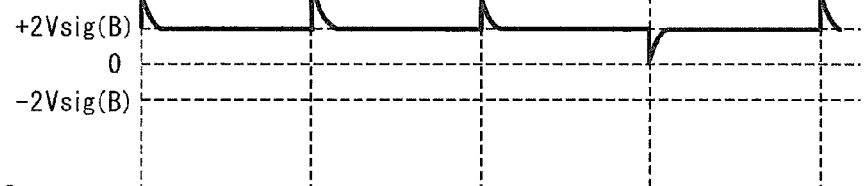

FIG. 28C
SIGNAL WAVEFORM OF Vhall4 AFTER DEMODULATION

FIG. 28D
SIGNAL WAVEFORM OF OUTPUT SIGNAL Vhall_sum34

SIGNAL WAVEFORM OF Vhall3 AFTER DEMODULATION + Vhall4 AFTER DEMODULATION

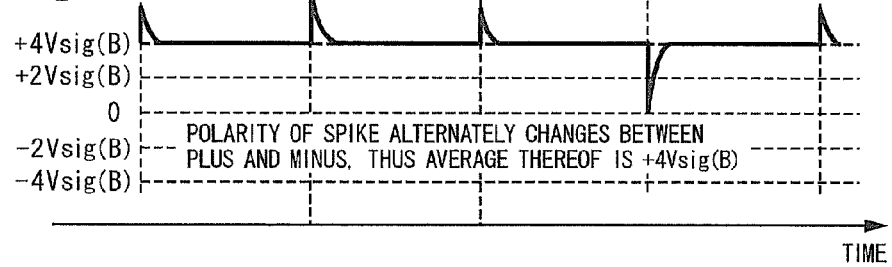

POLARITY OF SPIKE ALTERNATELY CHANGES BETWEEN PLUS AND MINUS, THUS AVERAGE THEREOF IS +4Vsig(B)

TIME

HALL ELECTROMOTIVE FORCE SIGNAL DETECTION CIRCUIT, CURRENT SENSOR THEREOF, AND HALL ELEMENT DRIVING METHOD

TECHNICAL FIELD

This disclosure relates to a Hall electromotive force signal detection circuit, a current sensor thereof, and a Hall element driving method, more specifically, to a Hall electromotive force signal detection circuit, a current sensor thereof, and a Hall element driving method suitable for a continuous-time signal processing circuit.

BACKGROUND ART

A magnetic sensor using a Hall element is widely used not only as a proximity sensor, a linear position sensor, a rotation angle sensor, or the like, each of which is a sensor for detecting positional information of a magnet, but also as a current sensor for measuring, in a non-contact manner, the amount of current flowing in a current conductor by detecting a magnetic field induced by the current flowing in the current conductor.

Particularly, it is required for the current sensor used to detect an inverter current of a motor, to highly precisely detect the inverter current that is switched at a high-speed frequency, for the purpose of improving the efficiency of motor control.

Since these types of Hall elements have a magnetoelectric conversion function to generate a Hall electromotive force signal depending on an intensity of an input magnetic field, the Hall element is widely used as a magnetic sensor. However, an offset voltage (unbalanced voltage) exists in the Hall element. The offset voltage is a non-zero finite voltage which is output even in a state where the magnetic field is zero, i.e., in a state of no magnetic field.

Therefore, in regard to the magnetic sensor using a Hall element, in order to cancel the offset voltage of the Hall element, there is a driving method for the Hall element, which is generally known as the Spinningcurrent method or the Connection commutation method. This method includes periodically switching between the positions of a terminal pair for flowing a driving current to the Hall element and the positions of a terminal pair for detecting a Hall electromotive force signal according to a clock called as a chopper clock (see NPL1 and PTL2, for example).

The Spinningcurrent method for the purpose of cancelling the offset voltage is configurable by use of a switch circuit in a CMOS semiconductor circuit, and therefore, a Hall electromotive force detecting circuit to obtain a highly-accurate magnetic sensor generally includes the switch circuit to implement the Spinningcurrent method.

Furthermore, in a case where the magnetic sensor utilizing the Hall element for measuring the current of the inverter is used, a wide-band property regarding a signal band, a high-speed response property regarding a signal processing delay time, a low-noise property regarding a signal quality, and the like are required for the magnetic sensor. Therefore, as a circuit system for processing the Hall electromotive force signal generated in the Hall element in these cases, a continuous-time signal processing circuit which processes signal in the continuous time is more advantageous than a discrete-time signal processing circuit which time-discretizes (sampling). In the continuous-time signal processing circuit, an aliasing phenomenon of the noise due to the time-discretization (sampling) is caused. Thus, the continuous-time signal processing circuit is especially suitable for use in an environment with much high frequency noise due to switching of the inverter.

The Spinningcurrent method of the Hall element will be described below with reference to FIGS. 1A and 1B.

FIGS. 1A and 1B are views illustrating the Hall electromotive force detection when the direction of the driving current biasing the Hall element is switched between 0 degree and 90 degrees every time the phase of the chopper clock is switched between two values, i.e., $\varphi 1$ and $\varphi 2$. The Hall element in the drawings is modeled as a four-terminal element including four resistors (R1, R2, R3, R4), and is driven by a constant current. Out of the four terminals, the terminal 1 and the terminal 3 in a pair face each other, and the terminal 2 and the terminal 4 in a pair face each other.

It is to be noted that the resistances of the four resistors (R1, R2, R3, R4) are not fixed values in the model of the Hall element illustrated in FIGS. 1A and 1B. In the case where the Hall elements are formed as an N-well in a semiconductor substrate, there is generally a density distribution of an impurity concentration within the respective Hall elements, due to a process gradient in manufacturing semiconductors. Therefore, the voltage distribution within the Hall element (N-well) varies depending on the terminal from which the driving current is injected, out of the four terminals (terminal 1, terminal 2, terminal 3, terminal 4), and thus, the occurrence state of the depletion layer within the Hall element (N-well) varies. Therefore, each of the resistances of the four resistors R1, R2, R3, R4 in the model of the Hall element varies depending on the terminal from which the driving current is injected, out of the four terminals (terminal 1, terminal 2, terminal 3, terminal 4).

In FIGS. 1A and 1B, voltage signals Vhall ($\varphi 1$) and Vhall ($\varphi 2$) measured when the phase of the chopper clock is $\varphi 1$ (the driving direction of the Hall element is 0 degree) and the phase of the chopper clock is $\varphi 2$ (the driving direction of the Hall element is 90 degrees), respectively, are represented as the sum of the Hall electromotive force signal Vsig(B) corresponding to the target magnetic field B to be detected by the magnetic sensor using the Hall element and the offset voltage Vos(Hall) of the Hall element, as represented by Expression 1.

In this situation, by periodically switching the direction of a bias current of the Hall element between 0 degree and 90 degrees according to the phase of the chopper clock, it is possible to invert the polarity of the Hall electromotive force signal Vsig (B) corresponding to the target magnetic field to be detected, thereby it is possible to perform frequency modulation of the signal Vsig (B) at the frequency f_chop of the chopper clock. On the other hand, as for the DC offset voltage Vos(Hall) of the Hall element, even if the driving direction of the Hall element is switched between 0 degree and 90 degrees, the DC offset Vos(Hall) retains its polarity. Therefore, Vos(Hall) is not frequency-modulated by the chopper clock.

EXPRESSION 1:

SIGNAL GENERATED IN HALL ELEMENT

[Math. 1]

$$\begin{cases} Vhall(\phi 1) = +Vsig(B) + Vos(\text{Hall}) \text{ (WHEN CHOPPER CLOCK} = \phi 1) \\ Vhall(\phi 2) = -Vsig(B) + Vos(\text{Hall}) \text{ (WHEN CHOPPER CLOCK} = \phi 2) \end{cases}$$

FIGS. 2A to 2D are views illustrating a signal waveform generated in the Hall element illustrated in FIGS. 1A and 1B mentioned above.

Based on the foregoing, in a case where the driving current of the Hall element is switched between 0 degree and 90 degrees according to the phase of the chopper clock, the signal Vhall generated in the Hall element exhibits a waveform as illustrated in FIGS. 2A to 2D.

Furthermore, FIG. 3 is a view illustrating a signal spectrum of the signal Vhall generated in the Hall element. Since the spectrum of the signal generated in the Hall element exhibits the spectrum as illustrated in FIG. 3, it is understood that the Hall electromotive force signal Vsig (B) corresponding to the target magnetic field to be detected and the offset voltage Vos(Hall) of the Hall element are separated in the frequency domain. This is the principle of the offset cancellation of the Hall element based on the Spinningcurrent method.

Furthermore, PTL1 for example, describes an order sequence in Spinningcurrent method, in which the direction of the driving current is switched in the clockwise direction in one Hall element out of two Hall elements and the driving current is switched in the counterclockwise direction in the other Hall element.

Furthermore, PTL3 relates to a chop Hall sensor configured to alternately switch a Hall element excitation current from a flow in one direction to a flow in another direction, and especially describes a Hall sensor in which a chopped sample-and-hold Hall-voltage circuit is clocked synchronously with the switched Hall element.

Furthermore, NPL2 describes a circuit system which time-discretizes (sampling) such as sample-and-hold, as a circuit configuration implementing the Spinningcurrent method of the Hall element.

CITATION LIST

Patent Literature

PTL1: U.S. Pat. No. 6,927,572 B2
PTL2: JP 2008-309626 A
PTL3: JP 09-196699 A

Non Patent Literature

NPL1: Written by R S Popovic, Hall Effect Devices (ISBN-10:0750300965) Inst of Physics Pub Inc (1991/05)
NPL2: IEEE Journal of Solid-State Circuits, Vol. 32, No. 6, 1997, Pages 829 to 836, Written by Bilotti et al., "Monolithic Magnetic Hall Sensor Using Dynamic Quadrature Offset Cancellation"

SUMMARY OF THE INVENTION

According to one aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal adder circuit configured to simultaneously add the first Hall electromotive force signal voltage and the second Hall electromotive force signal voltage, wherein the first switching circuit is configured to perform switching to shift the terminal position for injecting the driving current, at least: (1) from any terminal position to a terminal located in a counterclockwise direction; or (2) from any terminal position to a terminal located in a clockwise direction, and the second switching circuit is configured to perform switching to shift the terminal position for injecting the driving current, at least: (1) from any terminal position to a terminal located in the clockwise direction, when switching to shift the terminal position for injecting the driving current in the first Hall element to the terminal located in the counterclockwise direction; or (2) from any terminal position to a terminal located in the counterclockwise direction, when switching to shift the terminal position for injecting the driving current in the first Hall element to the terminal located in the clockwise direction.

According to another aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal processing circuit configured to simultaneously process the first Hall electromotive force signal voltage and the second Hall electromotive force signal voltage, wherein an output of the first switching circuit and an output of the second switching circuit are shorted, the first switching circuit is configured to perform switching to shift the terminal position for injecting the driving current, at least: (1) from any terminal position to a terminal located in a counterclockwise direction; or (2) from any terminal position to a terminal located in a clockwise direction, and the second switching circuit is configured to perform switching to shift the terminal position for injecting the driving current: (1) from any terminal position to a terminal located in the clockwise direction, when switching to shift the terminal position for injecting the driving current in the first Hall element to the terminal located in the counterclockwise direction; or (2) from any terminal position to a terminal located in the counterclockwise direction, when switching to shift the terminal position for injecting the driving current in the first Hall element to the terminal located in the clockwise direction.

According to another aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal adder circuit configured to simultaneously add the first Hall electromotive force signal voltage and the second Hall electromotive force signal voltage, wherein the first switching circuit is configured to switch the terminal position for injecting the driving current in the first Hall element to the first terminal, the second terminal, the fourth terminal, and the third terminal, of the first Hall element in this order, and the second switching circuit is configured to switch the terminal for injecting the driving current in the second Hall element in turn, to each terminal of the second Hall element, which faces the terminal position for injecting the driving current in the first Hall element.

According to another aspect of the present disclosure, there is provided a Hall element driving method including: shifting a terminal position for injecting a driving current into a first Hall element which generates a first Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least, (1) from any terminal position to a terminal located in a counterclockwise direction, (2) from any terminal position to a terminal located in a clockwise direction, or (3) from any terminal position to a terminal at a facing position; and shifting a terminal position for injecting the driving current into a second Hall element which generates a second Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least, (1) from any terminal position to a terminal located in the clockwise direction, when shifting the terminal position for injecting the driving current in the first Hall element to the terminal located in the counterclockwise direction, (2) from any terminal position to a terminal located in the counterclockwise direction, when shifting the terminal position for injecting the driving current in the first Hall element to the terminal located in the clockwise direction, or (3) from any terminal position to a terminal opposite to the any terminal position, when shifting the terminal position for injecting the driving current in the first Hall element to the facing position.

BRIEF DESCRIPTION OF DRAWINGS

FIGS. 2A to 2D are views illustrating a signal waveform generated in a Hall element illustrated in FIGS. 1A and 1B;

FIGS. 5A and 5B are views illustrating two terminals for applying a driving current of a Hall element and two terminals at which a Hall electromotive force signal is detected in the first Hall element and the second Hall element mentioned above when a phase $\varphi$ of a chopper clock is switched between $\varphi 1$ and $\varphi 2$;

FIGS. 8A to 8F are views illustrating changes in voltages at four terminals of the first Hall element and the second Hall element, and signal waveforms of the Hall electromotive force signals Vhall1 and Vhall2 detected at the first Hall element and the second Hall element, respectively, in the Hall electromotive force signal detection circuit illustrated in FIG. 6;

FIGS. 9A to 9C are views illustrating an output signal waveform obtained by simultaneously adding signal waveforms of Hall electromotive force signals Vhall1 and Vhall2;

FIGS. 11Aa and 11Ab are views (part 1) illustrating positions of a terminal pair determining a direction of applying a driving current of the third Hall element in the circuit configuration diagram illustrated in FIG. 10, positions of a terminal pair at which a Hall electromotive force signal is detected, and switching of a chopper modulation switch and a chopper demodulation switch;

FIGS. 11Bc and 11Bd are views (part 2) illustrating positions of a terminal pair determining a direction of applying a driving current of the third Hall element in the circuit configuration diagram illustrated in FIG. 10, positions of a terminal pair at which a Hall electromotive force signal is detected, and switching of a chopper modulation switch and a chopper demodulation switch;

FIGS. 12Aa and 12Ab are views (part 1) illustrating positions of a terminal pair determining a direction of applying a driving current of the forth Hall element in the circuit configuration diagram illustrated in FIG. 10, positions of a terminal pair at which a Hall electromotive force signal is detected, and switching of a chopper modulation switch and a chopper demodulation switch;

FIGS. 12Bc and 12Bd are views (part 2) illustrating positions of a terminal pair determining a direction of applying a driving current of the forth Hall element in the circuit configuration diagram illustrated in FIG. 10, positions of a terminal pair at which a Hall electromotive force signal is detected, and switching of a chopper modulation switch and a chopper demodulation switch;

FIG. 14 is a view conceptually illustrating an operation of the circuit illustrated in FIG. 13;

FIGS. 15A to 15E are views illustrating electric potentials at respective terminals of the third Hall element, and a signal waveform of the Hall electromotive force signal Vhall3 detected at the third Hall element in the Hall electromotive force signal detection circuit illustrated in FIG. 13;

FIGS. 16A to 16E are views illustrating electric potentials at respective terminals of the fourth Hall element, and a signal waveform of the Hall electromotive force signal Vhall4 detected at the fourth Hall element in the Hall electromotive force signal detection circuit illustrated in FIG. 13;

FIGS. 17A to 17D are views illustrating an output signal waveform obtained by simultaneously adding signal waveforms of Hall electromotive force signals Vhall3 and Vhall4;

FIGS. 21A and 21B are views illustrating a spike-like error signal (solid line) in the Hall electromotive force signal detection circuit illustrated in FIG. 20 and the spike-like error signal (dotted line) in the Hall electromotive force signal detection circuit illustrated in FIG. 13;

FIGS. 23Aa and 23Ab are views (part 1) illustrating positions of a terminal pair determining a direction of applying a driving current of the third Hall element in the circuit configuration diagram illustrated in FIG. 22, positions of a terminal pair at which a Hall electromotive force signal is detected, and switching of a chopper modulation switch and a chopper demodulation switch;

FIGS. 23Bc and 23Bd are views (part 2) illustrating positions of a terminal pair determining a direction of applying a driving current of the third Hall element in the circuit configuration diagram illustrated in FIG. 22, positions of a terminal pair at which a Hall electromotive force signal is detected, and switching of a chopper modulation switch and a chopper demodulation switch;

FIGS. 24Aa and 24Ab are views (part 1) illustrating positions of a terminal pair determining a direction of applying a driving current of the forth Hall element in the circuit configuration diagram illustrated in FIG. 22, positions of a terminal pair at which a Hall electromotive force signal is detected, and switching of a chopper modulation switch and a chopper demodulation switch;

FIGS. 24Bc and 24Bd are views (part 2) illustrating positions of a terminal pair determining a direction of applying a driving current of the forth Hall element in the circuit configuration diagram illustrated in FIG. 22, positions of a terminal pair at which a Hall electromotive force signal is detected, and switching of a chopper modulation switch and a chopper demodulation switch;

FIGS. 26A to 26E are views illustrating electric potentials at respective terminals of the third Hall element, and a signal waveform of the Hall electromotive force signal Vhall3 detected at the third Hall element in the Hall electromotive force signal detection circuit illustrated in FIG. 25;

FIGS. 27A to 27E are views illustrating electric potentials at respective terminals of the fourth Hall element 15, and a signal waveform of the Hall electromotive force signal Vhall4 detected at the fourth Hall element 15;

FIGS. 28A to 28D are views illustrating a chopper demodulation signal, and an output signal waveform obtained by simultaneously adding signal waveforms of Hall electromotive force signals Vhall3 and Vhall4;

DESCRIPTION OF EMBODIMENTS

Figures 1A, 1B:
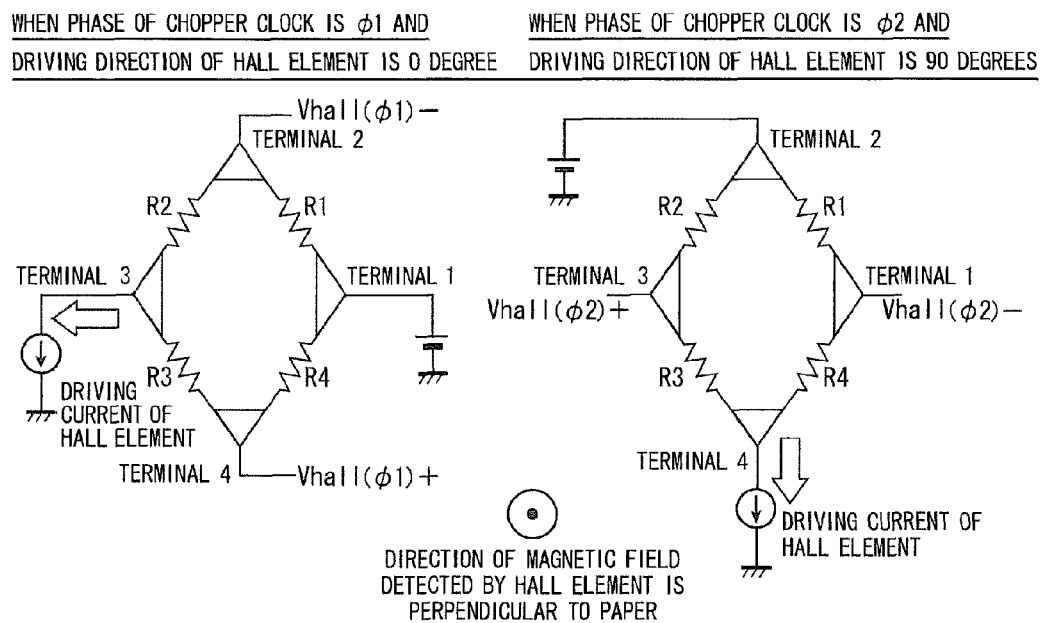
FIGS. 1A and 1B are views illustrating Hall electromotive force detection when a direction of a driving current biasing a Hall element is switched between 0 degree and 90 degrees every time a phase of a chopper clock is switched between two values, i.e., $\varphi 1$ and $\varphi 2$.
Figure 3:
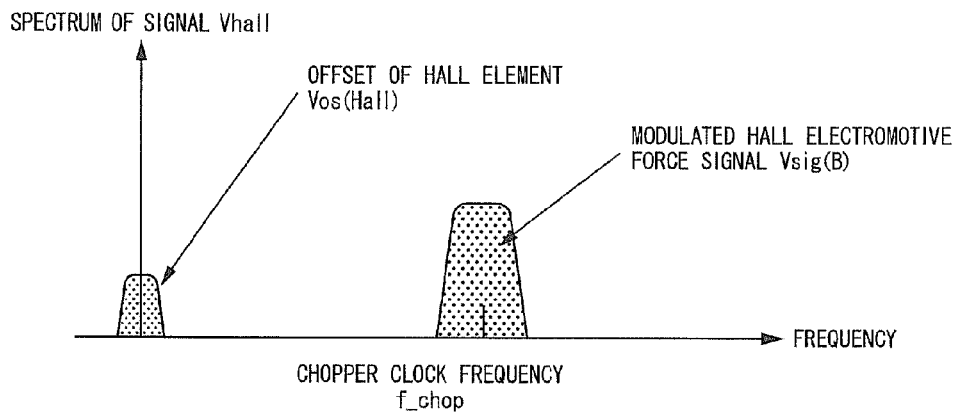
FIG. 3 is a view illustrating a signal spectrum of a signal Vhall generated in a Hall element.

However, although the circuit system which time-discretizes (sampling) such as sample-and-hold is known as the circuit configuration implementing the Spinningcurrent method of the Hall element, there is desired a circuit configuration processing the continuous-time signal, for use as a current sensor detecting the current of the inverter as mentioned above.

In this continuous-time signal processing system, an occurrence degree of a spike-like error signal generated in switching varies depending on the order or the sequence of selection and switching of the terminal for applying the driving current of the Hall element in the Spinningcurrent method.

In the above-mentioned method described in PTL1, as to the operation of selecting the positions of the terminal pair for applying the driving current of the Hall element and the positions of the terminal pair for detecting a Hall electromotive force signal, these terminal pairs are sequentially selected in the clockwise direction in one Hall element (Hall element 1) and these terminal pairs are sequentially selected in the counterclockwise direction in the other Hall element (Hall element 2).

The embodiments in the present disclosure has been made in view of such a situation, and has an object to provide a Hall electromotive force signal detection circuit, a current sensor thereof, and a Hall element driving method suitable for a continuous-time signal processing circuit.

The embodiments in the present disclosure have been made to achieve the above object. According to one aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal adder circuit configured to simultaneously add the first Hall electromotive force signal voltage and the second Hall electromotive force signal voltage, wherein the first switching circuit is configured to perform switching to shift the terminal position for injecting the driving current, at least: (1) from any terminal position to a terminal located in a counterclockwise direction; or (2) from any terminal position to a terminal located in a clockwise direction, and the second switching circuit is configured to perform switching to shift the terminal position for injecting the driving current, at least: (1) from any terminal position to a terminal located in the clockwise direction, when switching to shift the terminal position for injecting the driving current in the first Hall element to the terminal located in the counterclockwise direction; or (2) from any terminal position to a terminal located in the counterclockwise direction, when switching to shift the terminal position for injecting the driving current in the first Hall element to the terminal located in the clockwise direction.

Furthermore, according to another aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal processing circuit configured to simultaneously process the first Hall electromotive force signal voltage and the second Hall electromotive force signal voltage, wherein an output of the first switching circuit and an output of the second switching circuit are shorted, the first switching circuit is configured to perform switching to shift the terminal position for injecting the driving current, at least: (1) from any terminal position to a terminal located in a counterclockwise direction; or (2) from any terminal position to a terminal located in a clockwise direction, and the second switching circuit is configured to perform switching to shift the terminal position for injecting the driving current: (1) from any terminal position to a terminal located in the clockwise direction, when switching to shift the terminal position for injecting the driving current in the first Hall element to the terminal located in the counterclockwise direction; or (2) from any terminal position to a terminal located in the counterclockwise direction, when switching to shift the terminal position for injecting the driving current in the first Hall element to the terminal located in the clockwise direction.

Furthermore, the first switching circuit may be configured to perform switching to shift the terminal position for injecting the driving current, at least: (1) from any terminal position to a terminal located in a direction rotating by +90 degrees and in the counterclockwise direction; (2) from any terminal position to a terminal located in a direction rotating by −90 degrees and in the clockwise direction; or (3) from any terminal position to a terminal located in a direction reversed by ±180 degrees. The second switching circuit may be configured to perform switching to shift the terminal position for injecting the driving current: (1) from any terminal position to a terminal located in a direction rotating by −90 degrees and in the clockwise direction, when switching to shift the terminal position for injecting the driving current in the first Hall element by +90 degrees and in the counterclockwise direction; (2) from any terminal position to a terminal located in a direction rotating by +90 degrees and in the counterclockwise direction, when switching to shift the terminal position for injecting the driving current in the first Hall element to shift by −90 degrees and in the clockwise direction; or (3) from any terminal position to a terminal located in a direction reversed by ±180 degrees, when switching to shift the terminal position for injecting the driving current in the first Hall element by ±180 degrees.

Furthermore, the first switching circuit may be configured to switch the terminal position for injecting the driving current in the first Hall element to the first terminal, the second terminal, the fourth terminal, and the third terminal, of the first Hall element, in this order.

Furthermore, the second switching circuit may be configured to switch the terminal position for injecting the driving current in the second Hall element: (1) to the fourth terminal, the third terminal, the first terminal, and the second terminal, of the second Hall element in this order; (2) to the first terminal, the fourth terminal, the second terminal, and the third terminal, of the second Hall element in this order; (3) to the second terminal, the first terminal, the third terminal, and the fourth terminal, of the second Hall element in this order, or (4) to the third terminal, the second terminal, the fourth terminal, and the first terminal, of the second Hall element in this order.

Furthermore, according to another aspect of the present disclosure, there is provided a Hall electromotive force signal detection circuit including: a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction; a first switching circuit configured to select a terminal position for injecting a driving current and terminal positions for outputting the first Hall electromotive force signal voltage, out of the plurality of terminals of the first Hall elements; a second switching circuit configured to select a terminal position for injecting a driving current and terminal positions for outputting the second Hall electromotive force signal voltage, out of the plurality of terminals of the second Hall elements; and a Hall electromotive force signal adder circuit configured to simultaneously add the first Hall electromotive force signal voltage and the second Hall electromotive force signal voltage, wherein the first switching circuit is configured to switch the terminal position for injecting the driving current in the first Hall element to the first terminal, the second terminal, the fourth terminal, and the third terminal, of the first Hall element in this order, and the second switching circuit is configured to switch the terminal for injecting the driving current in the second Hall element in turn, to each terminal of the second Hall element, which faces the terminal position for injecting the driving current in the first Hall element.

Furthermore, the Hall electromotive force signal detection circuit may include a chopper clock generation circuit configured to supply a chopper clock signal to the first switching circuit and the second switching circuit, wherein the first switching circuit and the second switching circuit are configured to switch based on the chopper clock signal.

Furthermore, the chopper clock generation circuit may be configured to supply the chopper clock signal with four different phases to the first switching circuit and the second switching circuit.

Furthermore, the first switching circuit may be configured to inject the driving current from the first terminal when the chopper clock signal is in a first phase, to inject the driving current from the second terminal when the chopper clock signal is in a second phase, to inject the driving current from the fourth terminal when the chopper clock signal is in a third phase, and to inject the driving current from the third terminal when the chopper clock signal is in a fourth phase.

Furthermore, the second switching circuit may be configured to inject the driving current from the fourth terminal when the chopper clock signal is in the first phase, to inject the driving current from the third terminal when the chopper clock signal is in the second phase, to inject the driving current from the first terminal when the chopper clock signal is in the third phase, and to inject the driving current from the second terminal when the chopper clock signal is in the fourth phase.

Furthermore, the Hall electromotive force signal detection circuit may include a layout arrangement in which the first Hall element and the second Hall element are adjacent and parallel to each other.

Furthermore, the first Hall element and the second Hall element respectively may include a plurality of Hall elements connected in parallel.

Furthermore, the Hall electromotive force signal detection circuit may include a layout arrangement in which four Hall elements are adjacent and parallel to each other, and the directions of driving currents of the four Hall elements are different from each other.

Furthermore, the first switching circuit and the second switching circuit are switch circuits, respectively.

Furthermore, a current sensor may use the Hall electromotive force signal detection circuit according to any one of claims 1 to 14.

Furthermore, according to another aspect of the present disclosure, there is provided a Hall element driving method including: shifting a terminal position for injecting a driving current into a first Hall element which generates a first Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least, (1) from any terminal position to a terminal located in a counterclockwise direction, (2) from any terminal position to a terminal located in a clockwise direction, or (3) from any terminal position to a terminal at a facing position; and shifting a terminal position for injecting the driving current into a second Hall element which generates a second Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least, (1) from any terminal position to a terminal located in the clockwise direction, when shifting the terminal position for injecting the driving current in the first Hall element to the terminal located in the counterclockwise direction, (2) from any terminal position to a terminal located in the counterclockwise direction, when shifting the terminal position for injecting the driving current in the first Hall element to the terminal located in the clockwise direction, or (3) from any terminal position to a terminal opposite to the any terminal position, when shifting the terminal position for injecting the driving current in the first Hall element to the facing position.

Furthermore, the method may include: shifting the terminal position for injecting the driving current into the first Hall element, at least, (1) from any terminal position to a terminal located in a direction rotating by +90 degrees and in the counterclockwise direction, (2) from any terminal position to a terminal located in a direction rotating by −90 degrees and in the clockwise direction, or (3) from any terminal position to a terminal located in a direction reversed by ±180 degrees; and shifting the terminal position for injecting the driving current into the second Hall element, at least, (1) from any terminal position to a terminal located in a direction rotating by −90 degrees and in the clockwise direction, when shifting the terminal position for injecting the driving current in the first Hall element to the terminal located in the direction rotating by +90 degrees and in the counterclockwise direction; (2) from any terminal position to a terminal located in a direction rotating by +90 degrees and in the counterclockwise direction, when shifting the terminal position for injecting the driving current in the first Hall element to the terminal located in the direction rotating by −90 degrees and in the clockwise direction; or (3) from any terminal position to a terminal located in a direction reversed by ±180 degrees, when shifting the terminal position for injecting the driving current in the first Hall element to the terminal located in the direction reversed by ±180 degrees.

Furthermore, the method may include simultaneously adding or averaging the first Hall electromotive force signal voltage and the second Hall electromotive force signal voltage.

Furthermore, the method may include switching a polarity of the added or averaged signal when the terminal position for injecting the driving current into the first Hall element is shifted in the counterclockwise direction or the clockwise direction.

Furthermore, the terminal position for injecting the driving current into the first Hall element is shifted to the first terminal, the second terminal, the fourth terminal, and the third terminal, of the first Hall element in this order.

Furthermore, the terminal position for injecting the driving current into the second Hall element is shifted: (1) to the fourth terminal, the third terminal, the first terminal, and the second terminal, of the second Hall element in this order; (2) to the first terminal, the fourth terminal, the second terminal, and the third terminal, of the second Hall element in this order; (3) to the second terminal, the first terminal, the third terminal, and the fourth terminal, of the second Hall element in this order, or (4) to the third terminal, the second terminal, the fourth terminal, and the first terminal, of the second Hall element in this order.

Hereinafter, embodiments of the present disclosure will now be described with reference to the drawings.

Firstly, a configuration of a Hall electromotive force signal detection circuit, which is a basis of the embodiment of the present disclosure, will be described bellow.

Figure 4:
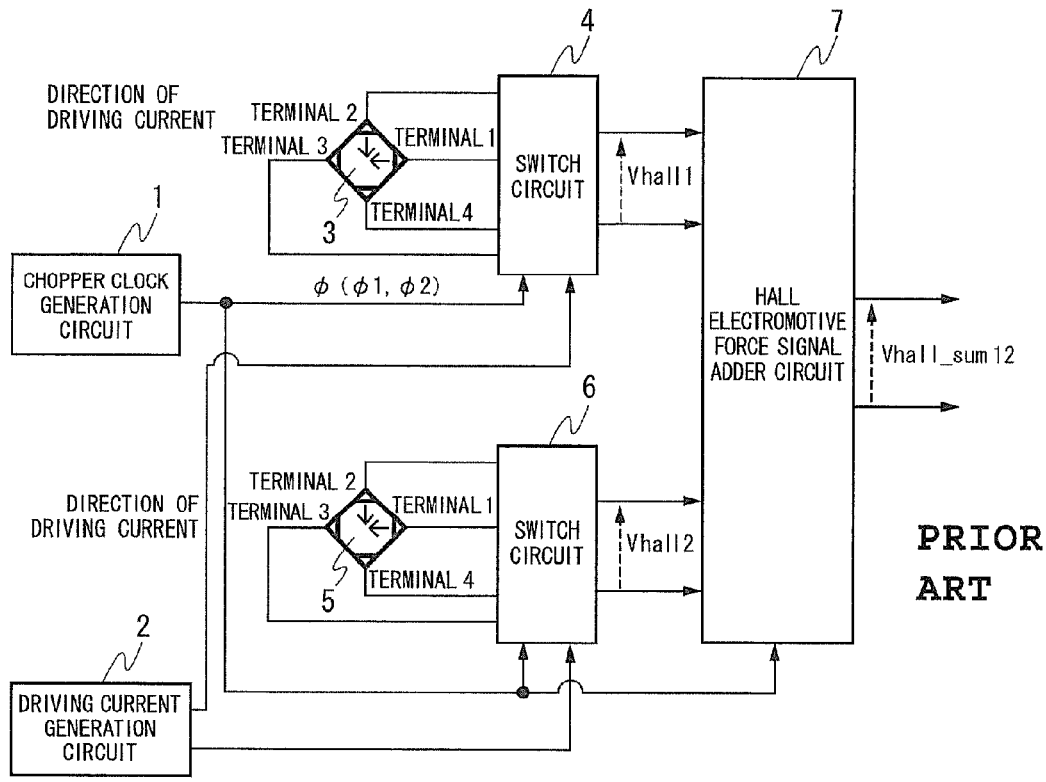
FIG. 4 is a circuit configuration diagram illustrating a Hall electromotive force signal detection circuit as a basis of the embodiment of the present disclosure.

FIG. 4 is a circuit configuration diagram illustrating the Hall electromotive force signal detection circuit as the basis of the embodiment of the present disclosure, and illustrates an example of a continuous-time signal processing circuit. In the drawing, a reference sign 1 denotes a chopper clock generation circuit, a reference sign 2 denotes a driving current generation circuit, a reference sign 3 denotes the first Hall element, a reference sign 4 denotes the first switch circuit, a reference sign 5 denotes the second Hall element, a reference sign 6 denotes the second switch circuit, and a reference sign 7 denotes a Hall electromotive force signal adder circuit.

In the Hall electromotive force signal detection circuit illustrated in FIG. 4, Hall electromotive force signals Vhall1 and Vhall2 generated in two Hall elements including the first Hall element 3 and the second Hall element 5 are simultaneously added by the Hall electromotive force signal adder circuit 7 in the continuous time to generate an output signal Vhall_sum12.

Each of the first Hall element 3 and the second Hall element 5 includes four terminals (terminal 1, terminal 2, terminal 3, terminal 4). In each of the first switch circuit 4 and the second switch circuit 6 which are connected to the first Hall element 3 and the second Hall element 5, respectively, a terminal pair for injecting a driving current for driving the Hall element and a terminal pair at which the Hall electromotive force signal is detected are switched according to a phase φ (φ1, φ2) of a two-phase chopper clock signal generated in the chopper clock generation circuit 1, and the Hall electromotive force signals Vhall1 and Vhall2 generated in the first Hall element 3 and the second Hall element 5, respectively, are detected. That is, an offset cancellation based on the Spinningcurrent method is performed for each of the first Hall element 3 and the second Hall element 5. Out of the four terminals, the terminal 1 and the terminal 3 in a pair face each other, and the terminal 2 and the terminal 4 in a pair face each other.

The above-mentioned Hall electromotive force signals Vhall1 and Vhall2 are simultaneously added by the Hall electromotive force signal adder circuit 7 to obtain the output signal Vhall_sum12.

FIGS. 5A and 5B are views illustrating the two terminals for applying the driving current of the Hall element and the two terminals at which the Hall electromotive force signal is detected in the first Hall element and the second Hall element mentioned above when the phase φ of the chopper clock is switched between φ1 and φ2.

In the FIGS. 5A and 5B, when the phase of the chopper clock is φ1, the driving currents of the first Hall element 3 and the second Hall element 5 are injected from the terminal 1 to terminal 3, which face each other, the Hall electromotive force signals are detected as voltage signals between the terminal 2 and terminal 4 which are face each other.

Therefore, it turns out that the electric potential of the terminal 1 is a higher bias voltage Vbias+ and the electric potential of the terminal 3 is a lower bias voltage Vbias− in the first Hall element 3 and the second Hall element 5, when the phase of the chopper clock is φ1. Considering similarly, it turns out that the electric potential of the terminal 2 is the higher bias voltage Vbias+ and the electric potential of the terminal 4 is the lower bias voltage Vbias−, when the phase of the chopper clock is φ2.

In a case where the Hall element is actually formed in an IC circuit as a silicon monolithic Hall element, Vbias+ is set to the voltage such as 3V. Furthermore, in a case where the resistance of the silicon monolithic Hall element is 2 kΩ and the driving current is 0.5 mA, the bias voltage Vbias− is smaller than Vbias+ by 1V, and thus Vbias− is set to 2V.

In this configuration, in a case the Hall element is formed as an N-type semiconductor and the direction of a magnetic field B applied to the first Hall element 3 and the second Hall element 5 is directed out of the paper, the Hall electromotive force signal generated between the terminal 2 and the terminal 4 is generated as the voltage signal having the electric potential +Vsig(B) on the positive side at the terminal 2, and the electric potential −Vsig(B) on the negative side at the terminal 4. Then, since the Hall electromotive force signals Vhall1 and Vhall2 are defined as the electric potential of the terminal 2 measured by using the terminal 4 as a reference, the Hall electromotive force signals Vhall1 and Vhall2 generated in the Hall element 1 and the Hall element 2 when the chopper clock signal is φ1 are detected as +2 Vsig(B).

Considering similarly, the Hall electromotive force signals Vhall1 and Vhall2 generated in the first Hall element 3 and the second Hall element 5 when the chopper clock signal is φ2 are detected as −2 Vsig(B).

Table 1 lists the terminal pair for applying the driving current in the first Hall element and the second Hall element. Furthermore, Table 2 lists the terminal pair at which the Hall electromotive force signal is detected in the first Hall element and the second Hall element.

When applying the driving current of the first Hall element and the second Hall element on the basis of Table 1, and detecting the Hall electromotive force signal on the basis of Table 2, the Hall electromotive force signals Vhall1 and Vhall2 in the first Hall element and the second Hall element are detected as listed in Table 3.

TABLE 1

TERMINAL PAIR FOR APPLYING DRIVING CURRENT
IN FIRST HALL ELEMENT AND SECOND HALL ELEMENT

| APPLYING DRIVING CURRENT | PHASE OF CHOPPER CLOCK | |
|---|---|---|
| | IN CASE OF φ1 | IN CASE OF φ2 |
| Vhall1 | APPLYING FROM TERMINAL 1 TO TERMINAL 3 (0-DEGREE DIRECTION) | APPLYING FROM TERMINAL 2 TO TERMINAL 4 (90-DEGREE DIRECTION) |
| Vhall2 | APPLYING FROM TERMINAL 1 TO TERMINAL 3 (0-DEGREE DIRECTION) | APPLYING FROM TERMINAL 2 TO TERMINAL 4 (90-DEGREE DIRECTION) |

TABLE 2

TERMINAL PAIR AT WHICH HALL ELECTROMOTIVE FORCE SIGNAL IS
DETECTED IN FIRST HALL ELEMENT AND SECOND HALL ELEMENT

| TERMINAL PAIR AT WHICH HALL ELECTROMOTIVE FORCE SIGNAL IS DETECTED | PHASE OF CHOPPER CLOCK | |
|---|---|---|
| | IN CASE OF φ1 | IN CASE OF φ2 |
| Vhall1 | ELECTRIC POTENTIAL OF TERMINAL 2 IS MEASURED BY USING TERMINAL 4 AS REFERENCE | ELECTRIC POTENTIAL OF TERMINAL 1 IS MEASURED BY USING TERMINAL 3 AS REFERENCE |
| Vhall2 | ELECTRIC POTENTIAL OF TERMINAL 2 IS MEASURED BY USING TERMINAL 4 AS REFERENCE | ELECTRIC POTENTIAL OF TERMINAL 1 IS MEASURED BY USING TERMINAL 3 AS REFERENCE |

TABLE 3

DETECTION OF HALL ELECTROMOTIVE FORCE SIGNALS
Vhall1, Vhall2

| HALL ELECTROMOTIVE FORCE SIGNAL | PHASE OF CHOPPER CLOCK | |
|---|---|---|
| | IN CASE OF φ1 | IN CASE OF φ2 |
| Vhall1 | +2Vsig(B)+Vos(Hall, 0°) | −2Vsig(B)+Vos(Hall, 90°) |
| Vhall2 | +2Vsig(B)+Vos(Hall, 0°) | −2Vsig(B)+Vos(Hall, 90°) |

In this situation, a common value Vsig(B) between the first Hall element and the second Hall element is used on the assumption that the first Hall element and the second Hall element are different two Hall elements and have the same magnetic sensitivity. As to this assumption, when the first Hall element and the second Hall element is formed by a semiconductor IC process and are arranged in proximity to each other in the IC, a process gradient in manufacturing the semiconductor uniformly affects the Hall element and the second Hall element. Therefore, such an assumption is reasonable.

On the other hand, as to the offset, there is the density distribution of the impurity concentration within the respective Hall elements, due to the process gradient in manufacturing the semiconductor, as mentioned above. Thus, the offset voltage when the driving current is applied from the terminal 1 to the terminal 3 (applied in a direction of 0 degree) is Vos(Hall, 0°) and the offset voltage when the driving current is applied from the terminal 2 to the terminal 4 (applied in a direction of 90 degrees) is Vos(Hall, 90°). In this way, the offset voltage varies slightly depending on the direction of applying the driving current. Generally, the difference between Vos(Hall, 0°) and Vos(Hall, 90°) is about 10 μV in the Hall element manufactured by using a CMOS semiconductor process.

Thus, since there is a difference of about 10 μV between Vos(Hall, 0°) and Vos(Hall, 90°), the offset of about 10 μV still remains in the Hall electromotive force signal detection circuit illustrated in FIG. 4, and FIGS. 5A and 5B after an offset cancellation. That is, there is not only a problem of the spike-like error signal, but also a problem regarding the accuracy of the offset cancellation in FIG. 4, and FIGS. 5A and 5B.

Figure 6:
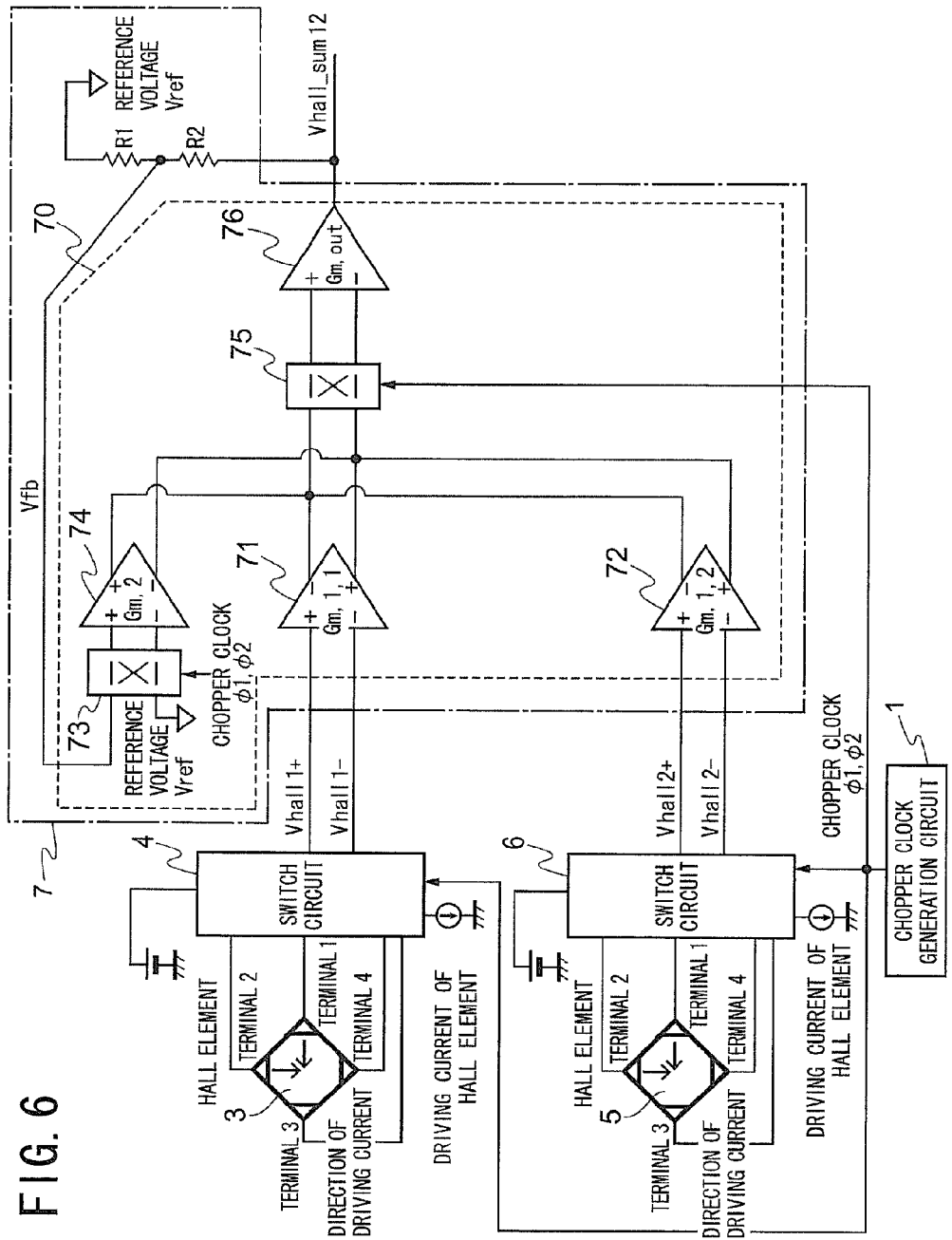
FIG. 6 is a circuit configuration diagram illustrating a specific example of the Hall electromotive force signal detection circuit illustrated in FIG. 4.

FIG. 6 is a circuit configuration diagram illustrating a specific example of the Hall electromotive force signal detection circuit illustrated in FIG. 4, which is obtained by combining a chopper amplifier, a current feedback amplifier, and the Spinningcurrent method of the Hall element. The circuit configuration illustrated in FIG. 6 does not time-discretize (sampling), and thus, is an example of a Hall electromotive force signal processing circuit based on a continuous-time signal processing method.

In the drawing, a reference sign 70 denotes a signal amplifier circuit configured to simultaneously add and amplify the Hall electromotive force signal Vhall1 generated in the first Hall element and the Hall electromotive force signal Vall2 generated in the second Hall element, a reference sign 71 denotes the first transistor differential pair (Gm, 1, 1), a reference sign 72 denotes the second transistor differential pair (Gm, 1, 2), a reference sign 73 denotes the seventh switch circuit, a reference sign 74 denotes the fourth transistor differential pair (Gm, 2), a reference sign 75 denotes the eighth switch circuit, and a reference sign 76 is an output stage of the Hall electromotive force signal adder circuit. It is to be noted that the same signs are assigned to the components having the same functions as those in FIG. 4.

In FIG. 6, the Hall electromotive force signals Vhall1 and Vhall2 generated in the first Hall element 3 and the second Hall element 5 are converted by the first transistor differential pair 71 and the second transistor differential pair 72 which convert a voltage signal into a current signal, respectively, into output currents I1_1 and I1_2 of the first and the second transistor differential pairs 71 and 72, respectively. These currents I1_1 and I1_2 are simultaneously added as current signals. The circuit functions such that the sum of the output current signal of the fourth transistor differential pair 74 driven the feedback voltage Vfb represented by Expression 2 and the current signal obtained by being simultaneously added and is equal to zero. Therefore, as represented by Expression 3, an amplified signal Vhall_sum12 is obtained as the output signal of the circuit illustrated in FIG. 6, by simultaneously adding the Hall electromotive force signals Vhall1 and Vhall2 generated in the first Hall element 3 and the second Hall element 5.

EXPRESSION 2:

FEEDBACK FROM OUTPUT VOLTAGE Vout OF SIGNAL AMPLIFIER CIRCUIT $$Vfb = \frac{R1}{R1 + R2} Vout \quad \text{[Math. 2]}$$

EXPRESSION 3:

(PRIOR ART) FORMULA OF SIGNAL AMPLIFICATION OF HALL ELECTROMOTIVE FORCE SIGNAL $$Vhall\_sum12 = \left(1 + \frac{R2}{R1}\right)\left\{\left(\frac{Gm, 1, 1}{Gm, 2}\right)Vhall1 + \left(\frac{Gm, 1, 2}{Gm, 2}\right)Vhall2\right\} \quad \text{[Math. 3]}$$

Figure 7:
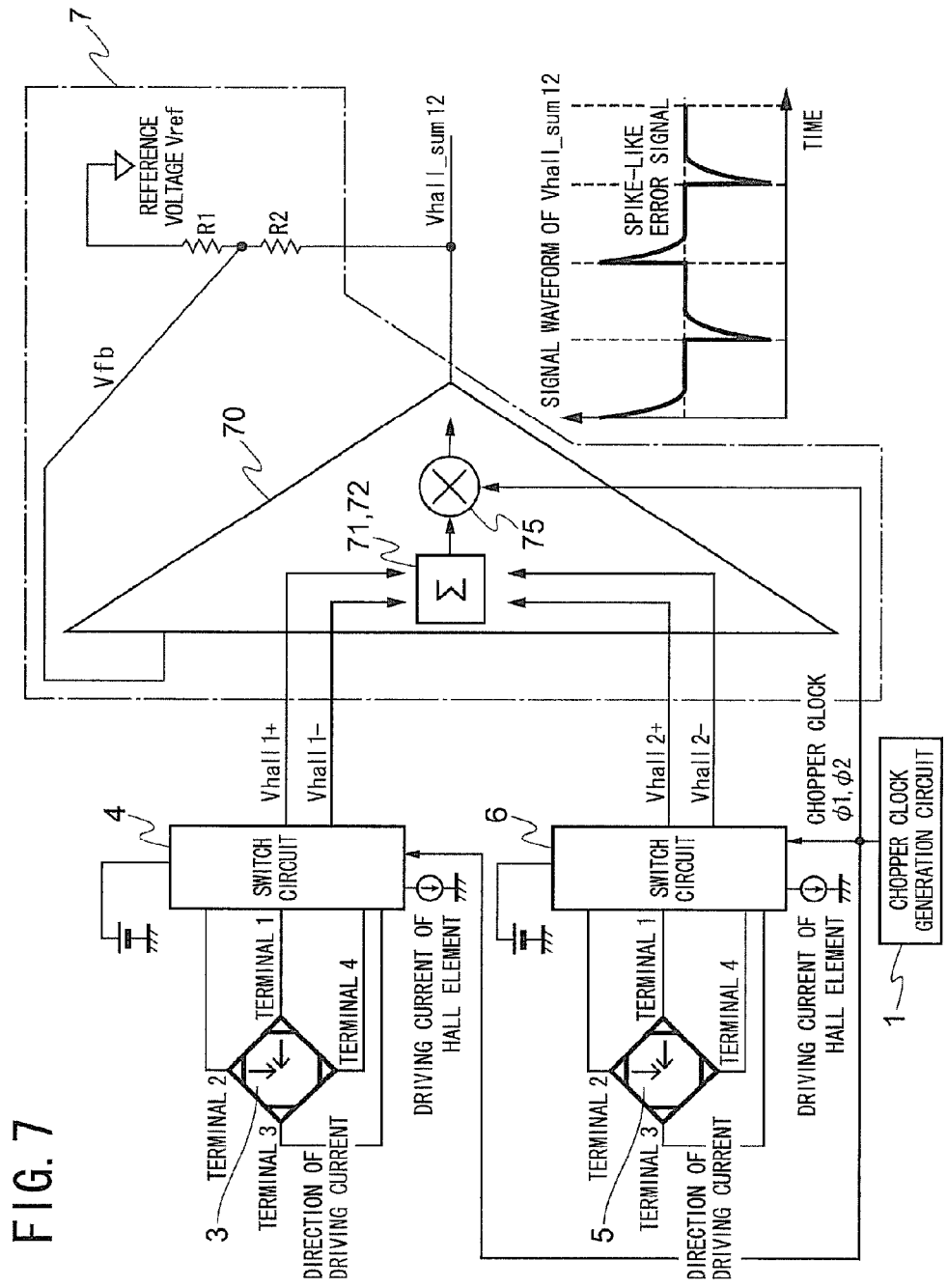
FIG. 7 is a view conceptually illustrating an operation of the circuit illustrated in FIG. 6.

FIG. 7 is a view conceptually illustrating the operation of the circuit illustrated in FIG. 6. The Hall electromotive force signals Vhall1 and Vhall2 generated in the first Hall element 3 and the second Hall element 5 are detected at the first switch circuit 4 and the second switch circuit 6 in a form in which the signal component Vsig (B) corresponding the magnetic field B is modulated by the chopper clock. Vhall1 and Vhall2 are demodulated by the chopper clock after being simultaneously added.

FIGS. 8A to 8F are views illustrating changes in voltages at the four terminals of the first Hall element and the second Hall element, and signal waveforms of the Hall electromotive force signals Vhall1 and Vhall2 detected at the first Hall element and the second Hall element, respectively, in the Hall electromotive force signal detection circuit illustrated in FIG. 6. It is to be noted that FIGS. 8A to 8F and drawings illustrating the signal waveforms of the Hall electromotive force signal detection similarly to the FIG. 6 intend to describe the temporal changes in the signal waveforms changing depending on the chopper clock, and thus, are drawn on the assumption that the offset of the Hall element is zero.

As illustrated in FIGS. 8A to 8F, the Hall electromotive force signals Vhall1 and Vhall2 are detected in the form modulated by the chopper clock. After conversion from the voltage signal into the current signal, the Hall electromotive force signals Vhall1 and Vhall2 are demodulated by the eighth switch circuit 75 in the Hall electromotive force signal detection circuit illustrated in FIG. 6. Thus, the waveform of the output signal Vhall_sum12 of the Hall electromotive force signal detection circuit illustrated in FIG. 6 has a signal waveform illustrated in FIG. 9C.

FIGS. 9A to 9C are views illustrating the output signal waveform obtained by simultaneously adding the signal waveforms of the Hall electromotive force signals Vhall1 and Vhall2. As is known from the signal waveforms illustrated in FIGS. 9A to 9C, in the Hall electromotive force signal detection circuit illustrated in FIG. 6, a switching operation to switch terminals between the two terminals for applying the driving current and the two terminals for detecting the Hall electromotive force signal in the Hall element (the first Hall element 3 and the second Hall element 5) when the chopper clock is switched. Therefore, in the output signal Vhall_sum12, a time transition when shifting to the voltage of the Hall electromotive force signal from the bias signal Vbias+ or Vbias− determined by applying the driving signal appears as the spike-like error signal.

As mentioned above, the Hall electromotive force signal detection circuit illustrated in FIG. 6 is the continuous-time signal processing system without time-discretizing (sampling). Therefore, the spike-like error signal is output as-is, as the output signal. As a result, the accuracy of the Hall electromotive force signal detection circuit degrades.

As mentioned above, in a case where the offset cancellation based on the Spinningcurrent method is performed in the Hall element, the occurrence of the spike-like error signal at the timing when changing the chopper clock signal is an obstacle to the improvement of the accuracy of the Hall electromotive force signal detection. This obstacle is especially serious in the continuous-time signal processing system without time-discretizing (sampling).

Hereinafter, the respective embodiments of the present disclosure will be described with reference to the drawings.

First Embodiment

Figure 10:
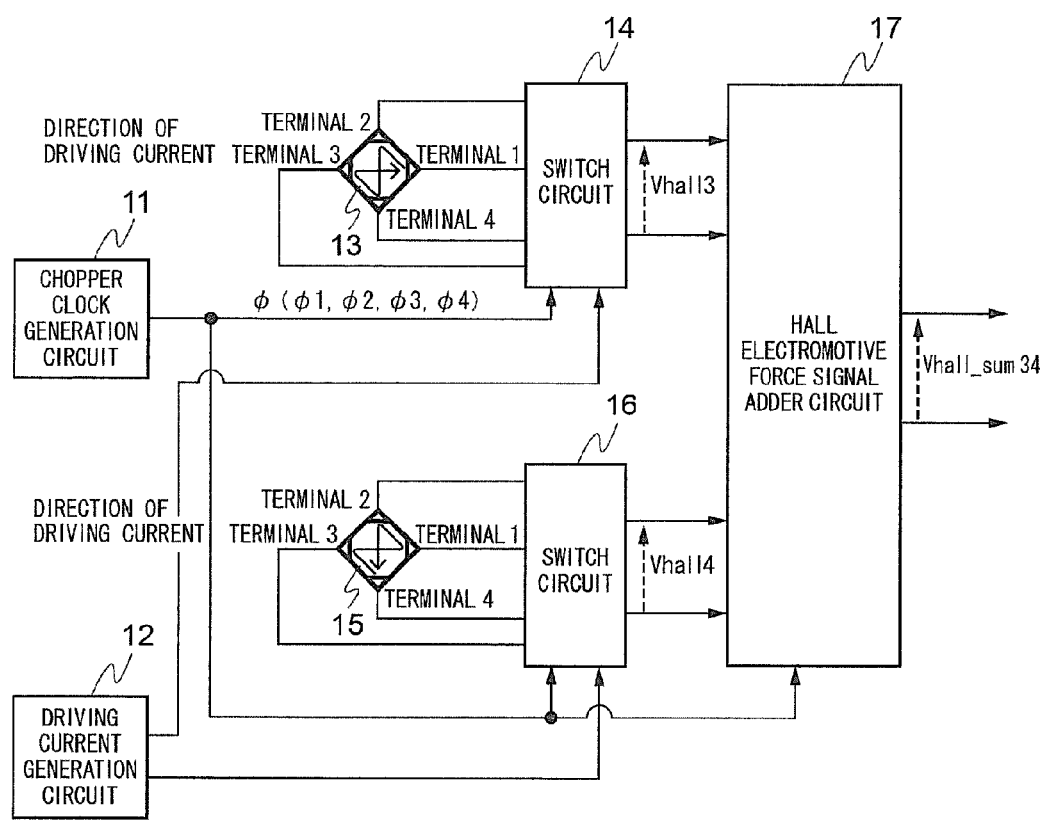
FIG. 10 is a circuit configuration diagram illustrating a Hall electromotive force signal detection circuit according to the first embodiment of the present disclosure.

FIG. 10 is a circuit configuration diagram illustrating the Hall electromotive force signal detection circuit according to the first embodiment of the present disclosure. In the drawing, a reference sign 11 denotes a chopper clock generation circuit, a reference sign 12 denotes a driving current generation circuit, a reference sign 13 denotes the third Hall element (the one Hall element), a reference sign 14 denotes the third switch circuit (the one switch circuit), a reference sign 15 denotes the fourth Hall element (the other Hall element), a reference sign 16 denotes the fourth switch circuit (the other switch circuit), and a reference sign 17 denotes a Hall electromotive force signal adder circuit.

The Hall electromotive force signal detection circuit is configured to select the terminal positions for applying the driving currents to the Hall elements 13 and 15, each of which includes plural terminals (the terminal 1 to the terminal 4) and to detect the Hall electromotive force signal voltage.

The one Hall element 13 includes the first to the fourth terminals and is configured to generate a one Hall electromotive force signal voltage. Furthermore, the other Hall element 15 includes the first to the fourth terminals and is configured to generate the other Hall electromotive force signal voltage.

Furthermore, the one switch circuit 14 is configured to select the terminal positions for applying the driving current, from the four terminals of the one Hall elements 13. Furthermore, the other switch circuit 16 is configured to select the terminal positions for applying the driving current, from the four terminals of the one Hall elements 15, such that the terminal positions selected by the switch circuit 16 are different from those selected by the one switch circuit 14.

Furthermore, the chopper clock generation circuit 11 is configured to supply the chopper clock signal to the one switch circuit 14 and the other switch circuit 16. Furthermore, the Hall electromotive force signal adder circuit 17 is configured to simultaneously add the one Hall electromotive force signal voltage and the other Hall electromotive force signal voltage.

The one switch circuit 14 is configured to switch the terminal position for injecting the driving current in the one Hall element 13 among the first to fourth terminals of the one Hall element 13, on the basis of the chopper clock signal generated by the chopper clock generation circuit 11. The other switch circuit 16 is configured to switch the terminal position for injecting the driving current in the other Hall element 15 among the first to fourth terminals of the other Hall element 15, on the basis of the chopper clock signal generated by the chopper clock generation circuit 11.

That is, the Hall electromotive force signal detection circuit according to the first embodiment is configured to select the terminal positions for applying the driving current among four terminals (the terminal 1 to the terminal 4) of each of the third and the fourth Hall elements 13 and 15, and to detect the Hall electromotive force signal voltages.

The third Hall element (the one Hall element) 13 includes the first to the fourth terminals to generate the one Hall electromotive force signal voltage Vhall3. Furthermore, the fourth Hall element (the other Hall element) 15 includes the first to the fourth terminals to generate the one Hall electromotive force signal voltage Vhall4. Out of the four terminals of each of the Hall elements, the terminal 1 and the terminal 3 in a pair face each other, and the terminal 2 and the terminal 4 in a pair face each other.

The third switch circuit (the one switch circuit) 14 is configured to select the terminal positions for applying the driving current among the four terminals of the third Hall element 13. The fourth switch circuit (the other switch circuit) 16 is configured to select the terminal positions different from those selected by the third switch circuit 14, among the four terminals of the fourth Hall element 15, as terminal positions for applying the driving current.

The chopper clock generation circuit 11 is configured to supply the chopper clock signal with four different phases φ1, φ2, φ3, φ4 to the third switch circuit 14, as well as to supply the chopper clock signal with the four different phases φ1, φ2, φ3, φ4 to the third switch circuit 16. The Hall electromotive force signal adder circuit 17 is configured to simultaneously add the one Hall electromotive force signal voltage Vhall3 and the other Hall electromotive force signal voltage Vhall4.

Furthermore, the third switch circuit 14 is configured to switch the terminal position for injecting the driving current in the third Hall element 13 among the first to the fourth terminals of the third Hall element 13, to the first terminal, the second terminal, the fourth terminal, and the third terminal in this order, on the basis of the chopper clock signal with the four different phases φ1, φ2, φ3, φ4 generated by the chopper clock generation circuit 11. The fourth switch circuit 16 is configured to switch the terminal position for injecting the driving current in the fourth Hall element 15 among the first to the fourth terminals of the fourth Hall element 15, to the fourth terminal, the third terminal, the first terminal, and the second terminal in this order, on the basis of the chopper clock signal with the four different phases φ1, φ2, φ3, φ4 generated by the chopper clock generation circuit 11.

Furthermore, the third switch circuit 14 is configured to inject the driving current from the terminal 1 when the chopper clock signal is in phase φ1, to inject the driving current from the terminal 2 when the chopper clock signal is in phase φ2, to inject the driving current from the terminal 4 when the chopper clock signal is in phase φ3, and to inject the driving current from the terminal 3 when the chopper clock signal is in phase φ4. The fourth switch circuit 16 is configured to inject the driving current from the terminal 4 when the chopper clock signal is in phase φ1, to inject the driving current from the terminal 3 when the chopper clock signal is in phase φ2, to inject the driving current from the terminal 1 when the chopper clock signal is in phase φ3, and to inject the driving current from the terminal 2 when the chopper clock signal is in phase φ4.

The circuit configuration diagram illustrated in FIG. 10 is similar to the circuit configuration diagram illustrated in FIG. 4, as the basis of the embodiments of the present disclosure, and is common to the circuit configuration diagram illustrated in FIG. 4 in that it is a Hall electromotive force detection circuit configured to detect a signal in the continuous time by simultaneously adding the Hall electromotive force signals Vhall3 and Vhall4 generated in the two Hall element which are the third Hall element 13 and the fourth Hall element 15, and in that it includes the two switch circuits (the third switch circuit 14 and the fourth switch circuit 16), the chopper clock generation circuit 11, the driving current generation circuit 12, and the Hall electromotive force signal adder circuit 17, as a circuit configuration.

The circuit configuration diagram illustrated in FIG. 10 according to the first embodiment of the present disclosure is different from the circuit configuration diagram illustrated in FIG. 4, as to the two Hall element, in that the positions of the terminal pair for applying the driving current of the Hall element and the positions of the terminal pair at which the Hall electromotive force signal is detected differ between the third Hall element 13 and the fourth Hall element 15, in the circuit configuration diagram illustrated in FIG. 10.

FIGS. 11Aa, 11Ab, 11Bc, and 11Bd are views illustrating the positions of the terminal pair determining the direction of applying the driving current of the third Hall element in the circuit configuration diagram illustrated in FIG. 10, the positions of the terminal pair at which the Hall electromotive force signal is detected, and switching of a chopper modulation switch and a chopper demodulation switch. In the drawings, a reference sign 21 denotes the chopper modulation switch, a reference sign 22 denotes a Hall electromotive force signal adder, and a reference sign 23 denotes the chopper demodulation switch.

It is to be noted that Table 4 indicates the positions of the terminal pair determining the direction of applying the driving current of the third Hall element 13, and Table 5 indicates the positions of the terminal pair at which the Hall electromotive force signal of the third Hall element 13 is detected. Out of the four terminals of the Hall element, the terminal 1 and the terminal 3 in a pair face each other, and the terminal 2 and the terminal 4 in a pair face each other.

Furthermore, in the first embodiment, the terminals are arranged in the order of the terminal 1, the terminal 2, the terminal 3, and the terminal 4 in the counterclockwise direction. The counterclockwise direction is a direction rotating by +90 degrees (that is, a direction from the terminal 1 to the terminal 2), and the clockwise direction is a direction rotating by −90 degrees (that is, a direction from the terminal 2 to the terminal 1).

It is to be noted that the first embodiment includes the terminals 1 to 4, but it may include other terminals.

When the Hall electromotive force signal is detected at the third Hall element 13 in this way, the Hall electromotive force signal Vhall3 (before demodulation) detected at the third Hall element 13 and the signal after demodulation are listed in Table 6 and Table 7, respectively. Herein, the chopper clock signal for demodulation changes its polarity in shifting from φ1 to φ2 and shifting from φ3 to φ4.

In the first embodiment, the chopper clock signal for demodulation changes its polarity in shifting by +90 degrees and in the counterclockwise direction, and shifting by −90 degrees and in clockwise direction.

TABLE 4

TERMINAL PAIR FOR APPLYING DRIVING CURRENT IN THIRD HALL ELEMENT

| APPLYING DRIVING CURRENT | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | APPLYING FROM TERMINAL 1 TO TERMINAL 3 (0-DEGREE DIRECTION) | APPLYING FROM TERMINAL 2 TO TERMINAL 4 (90-DEGREE DIRECTION) | APPLYING FROM TERMINAL 4 TO TERMINAL 2 (270-DEGREE DIRECTION) | APPLYING FROM TERMINAL 3 TO TERMINAL 1 (180-DEGREE DIRECTION) |

TABLE 5

TERMINAL PAIR AT WHICH HALL ELECTROMOTIVE FORCE SIGNAL IS DETECTED IN THIRD HALL ELEMENT

| TERMINAL PAIR AT WHICH HALL ELECTROMOTIVE FORCE SIGNAL IS DETECTED | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | ELECTRIC POTENTIAL OF TERMINAL 2 IS MEASURED BY USING TERMINAL 4 AS REFERENCE | ELECTRIC POTENTIAL OF TERMINAL 1 IS MEASURED BY USING TERMINAL 3 AS REFERENCE | ELECTRIC POTENTIAL OF TERMINAL 3 IS MEASURED BY USING TERMINAL 1 AS REFERENCE | ELECTRIC POTENTIAL OF TERMINAL 4 IS MEASURED BY USING TERMINAL 2 AS REFERENCE |

TABLE 6

DETECTION OF HALL ELECTROMOTIVE FORCE SIGNAL Vhall3 (BEFORE DEMODULATION)

| HALL ELECTROMOTIVE FORCE SIGNAL | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | +2Vsig(B) +Vos(Hall, 0°) +Vos(Add) | −2Vsig(B) +Vos(Hall, 90°) +Vos(Add) | −2Vsig(B) +Vos(Hall, 270°) +Vos(Add) | +2Vsig(B) +Vos(Hall, 180°) +Vos(Add) |

TABLE 7

DETECTION OF HALL ELECTROMOTIVE FORCE SIGNAL Vhall3 (AFTER DEMODULATION)

| HALL ELECTROMOTIVE FORCE SIGNAL | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | +2Vsig(B) +Vos(Hall, 0°) +Vos(Add) | +2Vsig(B) −Vos(Hall, 90°) −Vos(Add) | +2Vsig(B) −Vos(Hall, 270°) −Vos(Add) | +2Vsig(B) +Vos(Hall, 180°) +Vos(Add) |

Herein, Vsig(B) is used as the signal component corresponding to the magnetic field B of the third Hall element 13.

On the other hand, the offset components of the third Hall element are assumed to be Vos(Hall, 0°), Vos(Hall, 90°), Vos(Hall, 270°), and Vos(Hall, 180°). This is because there is the density distribution of the impurity concentration within the respective Hall elements due to the process gradient in manufacturing semiconductors as described above, and thus the occurrence state of the depletion layer within the Hall element varies depending on the terminal from which the driving current is injected, out of the four terminals of the Hall element (terminal 1, terminal 2, terminal 3, terminal 4). Furthermore, the input offset of the Hall electromotive force adder circuit is assumed to be Vos(Add).

FIGS. 12Aa, 12Ab, 12Bc, and 12Bd are views illustrating the positions of the terminal pair determining the direction of applying the driving current of the fourth Hall element in the circuit configuration diagram illustrated in FIG. 10, the positions of the terminal pair at which the Hall electromotive force signal is detected, and switching of the chopper modulation switch and the chopper demodulation switch.

It is to be noted that Table 8 indicates the positions of the terminal pair determining the direction of applying the driving current of the fourth Hall element 15, and Table 9 indicates the positions of the terminal pair at which the Hall electromotive force signal of the fourth Hall element 15 is detected. Out of the four terminals of the Hall element, the terminal 1 and the terminal 3 in a pair face each other, and the terminal 2 and the terminal 4 in a pair face each other.

When the Hall electromotive force signal is detected at the fourth Hall element 15 in this way, the Hall electromotive force signal Vhall4 (before demodulation) detected at the fourth Hall element 15 and the signal after demodulation are listed in Table 10 and Table 11, respectively. Herein, the chopper clock signal for demodulation changes its polarity in the shifting from $\varphi 1$ to $\varphi 2$ and the shifting from $\varphi 3$ to $\varphi 4$.

TABLE 8

TERMINAL PAIR FOR APPLYING DRIVING CURRENT IN FOURTH HALL ELEMENT

| APPLYING DRIVING | PHASE OF CHOPPER CLOCK | | | |
|---|---|---|---|---|
| CURRENT | IN CASE OF $\varphi 1$ | IN CASE OF $\varphi 2$ | IN CASE OF $\varphi 3$ | IN CASE OF $\varphi 4$ |
| Vhall4 | APPLYING FROM TERMINAL 4 TO TERMINAL 2 (270-DEGREE DIRECTION) | APPLYING FROM TERMINAL 3 TO TERMINAL 1 (180-DEGREE DIRECTION) | APPLYING FROM TERMINAL 1 TO TERMINAL 3 (0-DEGREE DIRECTION) | APPLYING FROM TERMINAL 2 TO TERMINAL 4 (90-DEGREE DIRECTION) |

TABLE 9

TERMINAL PAIR AT WHICH HALL ELECTROMOTIVE FORCE SIGNAL IS DETECTED IN FOURTH HALL ELEMENT

| TERMINAL PAIR AT WHICH HALL ELECTROMOTIVE FORCE SIGNAL IS DETECTED | PHASE OF CHOPPER CLOCK | | | |
|---|---|---|---|---|
| | IN CASE OF $\varphi 1$ | IN CASE OF $\varphi 2$ | IN CASE OF $\varphi 3$ | IN CASE OF $\varphi 4$ |
| Vhall4 | ELECTRIC POTENTIAL OF TERMINAL 1 IS MEASURED BY USING TERMINAL 3 AS REFERENCE | ELECTRIC POTENTIAL OF TERMINAL 2 IS MEASURED BY USING TERMINAL 4 AS REFERENCE | ELECTRIC POTENTIAL OF TERMINAL 4 IS MEASURED BY USING TERMINAL 2 AS REFERENCE | ELECTRIC POTENTIAL OF TERMINAL 3 IS MEASURED BY USING TERMINAL 1 AS REFERENCE |

TABLE 10

DETECTION OF HALL ELECTROMOTIVE FORCE SIGNAL Vhall4 (BEFORE DEMODULATION)

| HALL ELECTROMOTIVE FORCE SIGNAL | PHASE OF CHOPPER CLOCK | | | |
|---|---|---|---|---|
| | IN CASE OF $\varphi 1$ | IN CASE OF $\varphi 2$ | IN CASE OF $\varphi 3$ | IN CASE OF $\varphi 4$ |
| Vhall4 | +2Vsig(B) −Vos(Hall, 270°) +Vos(Add) | −2Vsig(B) −Vos(Hall, 180°) +Vos(Add) | −2Vsig(B) −Vos(Hall, 0°) +Vos(Add) | +2Vsig(B) −Vos(Hall, 90°) +Vos(Add) |

TABLE 11

DETECTION OF HALL ELECTROMOTIVE FORCE
SIGNAL Vhall4 (AFTER DEMODULATION)

| HALL ELECTROMOTIVE | PHASE OF CHOPPER CLOCK | | | |
|---|---|---|---|---|
| FORCE SIGNAL | IN CASE OF φ1 | IN CASE OF φ2 | IN CASE OF φ3 | IN CASE OF φ4 |
| Vhall4 | +2Vsig(B)<br>−Vos(Hall, 270°)<br>+Vos(Add) | +2Vsig(B)<br>+Vos(Hall, 180°)<br>−Vos(Add) | +2Vsig(B)<br>+Vos(Hall, 0°)<br>−Vos(Add) | +2Vsig(B)<br>−Vos(Hall, 90°)<br>+Vos(Add) |

In this situation, a common value Vsig(B) between the third Hall element 13 and the fourth Hall element 15 is used as the signal component corresponding to the magnetic field B, on the assumption that the fourth Hall element 15 and the third Hall element 13 have the same magnetic sensitivity.

On the other hand, the offset components of the fourth Hall element are assumed to be similar values to Vos(Hall, 0°), Vos(Hall, 90°), Vos(Hall, 270°), and Vos(Hall, 180°) for the third Hall element. Furthermore, the input offset of the Hall electromotive force adder circuit is assumed to be Vos(Add).

Figure 13:
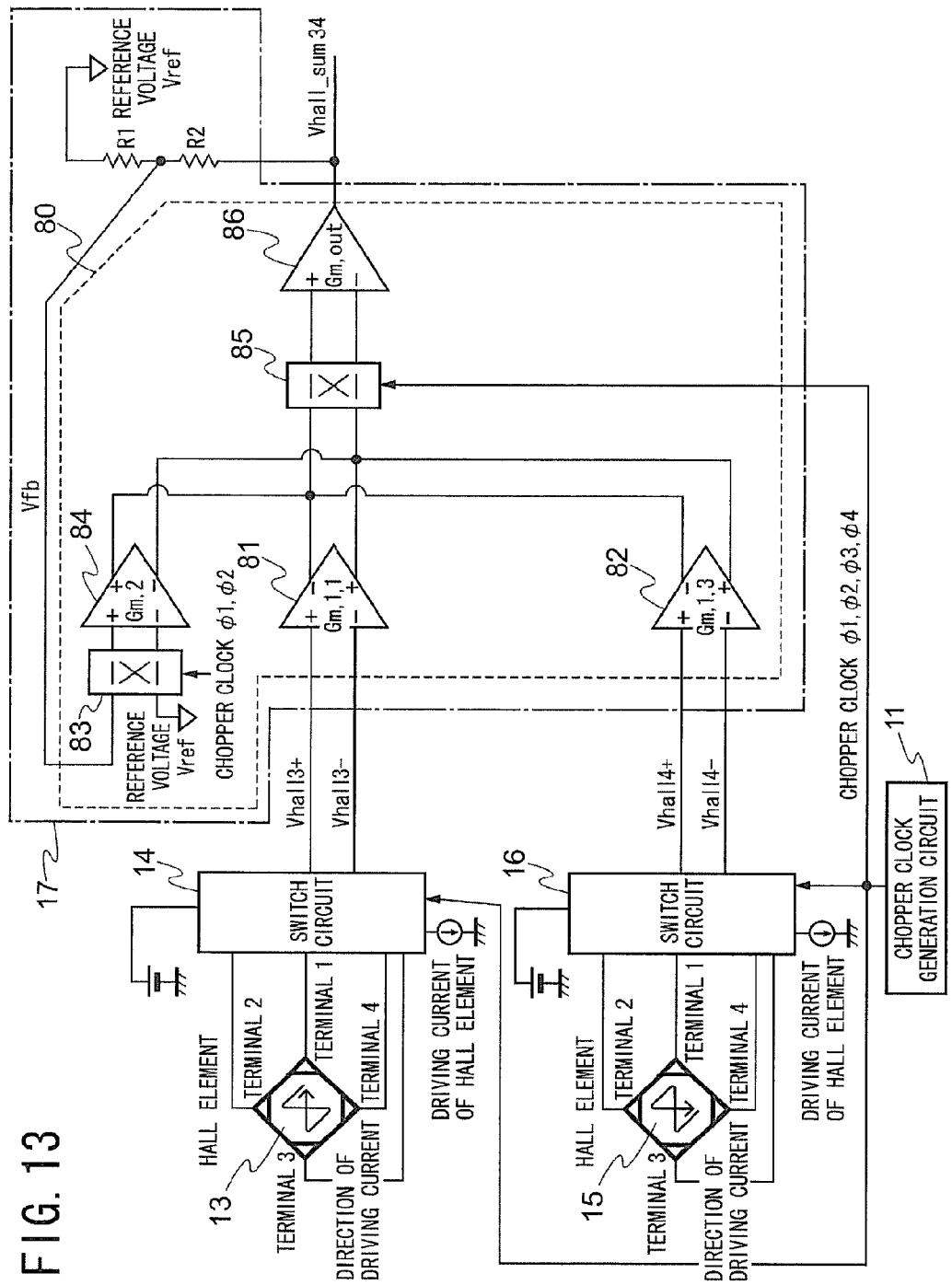
FIG. 13 is a circuit configuration diagram illustrating a specific example of the Hall electromotive force signal detection circuit illustrated in FIG. 10.

FIG. 13 is a circuit configuration diagram illustrating a specific example of the Hall electromotive force signal detection circuit illustrated in FIG. 10, which is obtained by combining the chopper amplifier, the current feedback amplifier, and the Spinningcurrent method of the Hall element. The circuit configuration illustrated in FIG. 13 does not time-discretize (sampling), and thus, is an example of a Hall electromotive force signal processing circuit based on a continuous-time signal processing method.

In the drawing, a reference sign 80 denotes a signal amplifier circuit configured to simultaneously add and amplify the Hall electromotive force signal Vhall3 generated in the third Hall element and the Hall electromotive force signal Vall4 generated in the fourth Hall element, a reference sign 81 denotes the first transistor differential pair (Gm, 1, 1), a reference sign 82 denotes the third transistor differential pair (Gm, 1, 3), a reference sign 83 denotes the seventh switch circuit, a reference sign 84 denotes the fourth transistor differential pair (Gm, 2), a reference sign 85 denotes the eighth switch circuit, and a reference sign 86 is an output stage of the Hall electromotive force signal adder circuit. It is to be noted that the same signs are assigned to the components having the same functions as those in FIG. 10.

In FIG. 13, the Hall electromotive force signal Vhall3 generated in the third Hall element 13 and the Hall electromotive force signal Vhall4 generated in the fourth Hall element 15 are simultaneously added in the continuous time to obtain the output voltage signal Vhall_sum34 in accordance with Expression 4.

EXPRESSION 4:

FORMULA OF SIGNAL AMPLIFICATION OF HALL ELECTROMOTIVE FORCE SIGNAL

[Math. 4]

$$Vhall\_sum34 = \left(1 + \frac{R2}{R1}\right)\left\{\left(\frac{Gm, 1, 1}{Gm, 2}\right)Vhall3 + \left(\frac{Gm, 1, 3}{Gm, 2}\right)Vhall4\right\}$$

As to the two Hall element (the third Hall element and the fourth Hall element) in FIG. 13, it is to be noted that the switching operations of the two switch circuits (the first switch circuit and the third switch circuit), which select and switch the positions of the terminal pair for applying the driving current of the Hall element and the terminal pair for extracting the Hall electromotive force signal according to the phase of the chopper clock signal, are different from each other.

FIG. 14 is a view conceptually illustrating the operation of the circuit illustrated in FIG. 13. The Hall electromotive force signals Vhall3 and Vhall4 generated in the third Hall element 13 and the fourth Hall element 15 are detected at the first switch circuit 14 and the third switch circuit 16 in a form in which the signal component Vsig(B) corresponding the magnetic field B is modulated by the chopper clock. Vhall3 and Vhall4 are demodulated by the chopper clock after being simultaneously added.

FIGS. 15A to 15E are views illustrating electric potentials at the respective terminals of the third Hall element, and a signal waveform of the Hall electromotive force signal Vhall3 detected at the third Hall element in the Hall electromotive force signal detection circuit illustrated in FIG. 13.

FIGS. 16A to 16E are views illustrating electric potentials at respective terminals of the fourth Hall element 15, and a signal waveform of the Hall electromotive force signal Vhall4 detected at the fourth Hall element 15.

In the Hall electromotive force signal detection circuit according to the embodiment of the present disclosure, the Hall electromotive force signal Vhall3 generated in the third Hall element 13 and the Hall electromotive force signal Vhall4 generated in the fourth Hall element 15 are simultaneously added in the continuous time.

FIGS. 17A to 17D are views illustrating a chopper demodulation signal, and the output signal waveform obtained by simultaneously adding the signal waveforms of the Hall electromotive force signals Vhall3 and Vhall4. As is known from FIGS. 17B to 17D, in the Hall electromotive force signal detection circuit according to the embodiment of the present disclosure, it is possible to significantly reduce the occurrence of the spike-like error signal which is generated in switching the chopper clock signal, by simultaneously adding the two Hall electromotive force signals. Therefore, the Hall electromotive force signal detection circuit according to the embodiment of the present disclosure is quite effective in achieving a highly-accurate Hall electromotive force signal detection by a circuit configuration based on the continuous-time signal processing method.

In the Hall electromotive force signal detection circuit according to the embodiment of the present disclosure, the direction of applying the driving current of the third Hall element 13 is switched so as to rotate by 90 degrees in the counterclockwise direction, to reverse by 180 degrees, and to rotate by 90 degrees in the clockwise direction in this order, and the direction of applying the driving current of the fourth Hall element 15 is switched so as to rotate by 90 degrees in the clockwise direction, to reverse by 180 degrees, and to rotate by 90 degrees in the counterclockwise direction in this order, as listed in Table 12. That is, in the Hall electromotive force signal detection circuit according to the embodiment of the present disclosure, when it is assumed that the angle of the terminal 1 is 0 degree, the driving current of the third Hall element 13 is applied in the direction of 0 degree, 90 degrees, 270 degrees, and 180 degrees in this order, and the driving current of the fourth Hall element 15 is applied in the direction of 270 degrees, 180 degrees, 0 degree, and 90 degrees in this order.

direction, or (3) switching to shift from any terminal position to a terminal located in a direction reversed by ±180 degrees, when switching to shift the terminal position for injecting the driving current in the one Hall element 13 by ±180 degrees.

In this way, by switching the direction of applying the driving current of the third Hall element 13 so as to rotate by 90 degrees in the counterclockwise direction, to reverse by 180 degrees, and to rotate by 90 degrees in the clockwise

TABLE 12

TERMINAL PAIR FOR APPLYING DRIVING CURRENT
IN THIRD HALL ELEMENT AND FOURTH HALL ELEMENT

| APPLYING DRIVING CURRENT | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | APPLYING FROM TERMINAL 1 TO TERMINAL 3 (0-DEGREE DIRECTION) | APPLYING FROM TERMINAL 2 TO TERMINAL 4 (90-DEGREE DIRECTION) | APPLYING FROM TERMINAL 4 TO TERMINAL 2 (270-DEGREE DIRECTION) | APPLYING FROM TERMINAL 3 TO TERMINAL 1 (180-DEGREE DIRECTION) |
| Vhall4 | APPLYING FROM TERMINAL 4 TO TERMINAL 2 (270-DEGREE DIRECTION) | APPLYING FROM TERMINAL 3 TO TERMINAL 1 (180-DEGREE DIRECTION) | APPLYING FROM TERMINAL 1 TO TERMINAL 3 (0-DEGREE DIRECTION) | APPLYING FROM TERMINAL 2 TO TERMINAL 4 (90-DEGREE DIRECTION) |

That is, the one switch circuit 14 is configured to perform, at least any one of, (1) switching to shift from any terminal position to a terminal located in a direction rotating by +90 degrees and in the counterclockwise direction, (2) switching to shift from any terminal position to a terminal located in a direction rotating by −90 degrees and in the clockwise direction, or (3) switching to shift from any terminal position to a terminal located in a direction reversed by ±180 degrees.

The other switch circuit 16 is configured to perform (1) switching to shift from any terminal position to a terminal located in a direction rotating by −90 degrees and in the clockwise direction, when switching to shift the terminal position for injecting the driving current in the one Hall element 13 by +90 degrees and in the counterclockwise direction, (2) switching to shift from any terminal position to a terminal located in a direction rotating by +90 degrees and in the counterclockwise direction, when switching to shift the terminal position for injecting the driving current in the one Hall element 13 by −90 degrees and in the clockwise direction in this order, and by switching the direction of applying the driving current of the fourth Hall element 15 so as to rotate by 90 degrees in the clockwise direction, to reverse by 180 degrees, and to rotate by 90 degrees in the counterclockwise direction in this order, the offset component included in the output signal Vhall_sum34 after signal demodulation by the chopper clock is obtained as listed in Table 13.

TABLE 13

OFFSETS OF THIRD HALL ELEMENT AND FOURTH
HALL ELEMENT INCLUDED IN Vhall_sum34

| OFFSETS AFTER CHOPPER DEMODULATION | PHASE OF CHOPPER CLOCK | | | |
|---|---|---|---|---|
| | IN CASE OF φ1 | IN CASE OF φ2 | IN CASE OF φ3 | IN CASE OF φ4 |
| THIRD HALL ELEMENT | +Vos(Hall, 0°) | −Vos(Hall, 90°) | −Vos(Hall, 270°) | +Vos(Hall, 180°) |
| FOURTH HALL ELEMENT | −Vos(Hall, 270°) | +Vos(Hall, 180°) | +Vos(Hall, 0°) | −Vos(Hall, 90°) |

As is known from Table 13, in the Hall electromotive force signal detection circuit according to the embodiment of the present disclosure, it is possible to cancel the four offset voltages Vos(Hall, 0°), Vos(Hall, 90°), Vos(Hall, 270°), and Vos(Hall, 180°), which may exist in the Hall element, by adding and subtracting them, while the chopper clock signal is switched among the four phases φ1, φ2, φ3, and φ4.

That is, the influence due to the density distribution of the impurity concentration within the respective Hall elements is averaged in a period from the phase φ1 to φ4, and thus it is possible to achieve the highly-accurate offset cancelling.

Furthermore, in FIGS. 17A to 17D, the large spike-like error signals occur only in shifting by 90 degrees in the chopper operation, that is, when the phase shifts from φ1 to φ2, and from φ3 to φ4, and their polarities are reverse to each other.

Therefore, even if the spike-like error signal can not be completely canceled due to the production variation in the semiconductor manufacturing process, the offset as the average is quite small, since the occurrence frequency is low and their polarities are reverse to each other. Additionally, the spike-like error signal is generated depending on the input magnetic signal when the phase shifts from φ2 to φ3, and from φ4 to φ1. However, the magnitude thereof is small and the error signal is not generated when the magnetic signal is not input. Therefore, the error signal does not contribute to the offset.

The first embodiment includes both of the rotation by +90 degrees (counterclockwise rotation) and the rotation by −90 degrees (clockwise rotation) in one cycle of driving the Hall element, as mentioned above. Thus, the polarities of the spike-like error signals occurring in shifting are reverse to each other within one cycle of driving the Hall element. Therefore, the offset as the average is quite small. Then, by driving at least the two Hall element such that the polarities of the spike-like error signals are reverse to each other (that is, such that the shift in the one Hall element is in the clockwise direction when the shift in the other Hall element is in the counterclockwise direction, or such that the shift in the one Hall element is in the counterclockwise direction when the shift in the other Hall element is in the clockwise direction), it is possible to significantly reduce the occurrence of the spike-like error signal in shifting. By combing the driving the Hall element in a figure-eight direction and the driving in an inverted figure-eight direction in this way, it is possible to significantly reduce the occurrence of the spike-like error signal in shifting.

Furthermore, the rotation by ±180 degrees is included in one cycle of driving the Hall element, it is possible to perform the chopper driving in 360 degrees to reduce the remaining offset. Furthermore, the occurrence frequency of the spike-like error signal is reduced, since the spike-like error signal in this shift is quite small when no magnetic field is input.

In the first embodiment, the one switch circuit 14 may switch the terminal position for injecting the driving current in the one Hall element 13 among the first terminal, the second terminal, the four terminal, and the third terminal, of the one Hall element 13, in this order, on the basis of the chopper signal generated by the chopper clock generation circuit 11. In this situation, the terminal is switched so as to rotate by 90 degrees and in the counterclockwise direction, to reverse by ±180 degrees, and to rotate by −90 degrees and in the clockwise direction in this order.

On the other hand, the other switch circuit 16 may perform any one of the following switching (1) to (4) of the terminal position for injecting the driving current in the other Hall element 15, on the basis of the chopper signal generated by the chopper clock generation circuit 11.

(1) Switching the terminal position for injecting the driving current to the fourth terminal, the third terminal, the first terminal, and the second terminal, of the other Hall element 15 in this order, (2) switching the terminal position for injecting the driving current to the first terminal, the fourth terminal, the second terminal, and the third terminal, of the other Hall element 15 in this order, (3) switching the terminal position for injecting the driving current to the second terminal, the first terminal, the third terminal, and the fourth terminal, of the other Hall element 15 in this order, or (4) switching the terminal position for injecting the driving current to the third terminal, the second terminal, the fourth terminal, and the first terminal in this order, of the other Hall element 15.

In this situation, the terminal is switched so as to rotate by −90 degrees and in the clockwise direction, to reverse by ±180 degrees, and to rotate by +90 degrees and in the counterclockwise direction in this order. That is, the correspondence relationship with the driving direction of the one Hall element is important in switching the terminal of the other Hall element. That means the injection can be start at any terminal.

In the method of the above-mentioned PTL1, the rotation direction of the driving is fixed. Thus, the large spike-like error signals usually occur in shifting and are the same in polarity. Therefore, the spike-like error signals with the same polarity occur due to the variation in the semiconductor manufacturing process, and the average thereof becomes the offset. Therefore, the embodiment of the present disclosure achieves a more highly-accurate offset cancellation.

Figure 18:
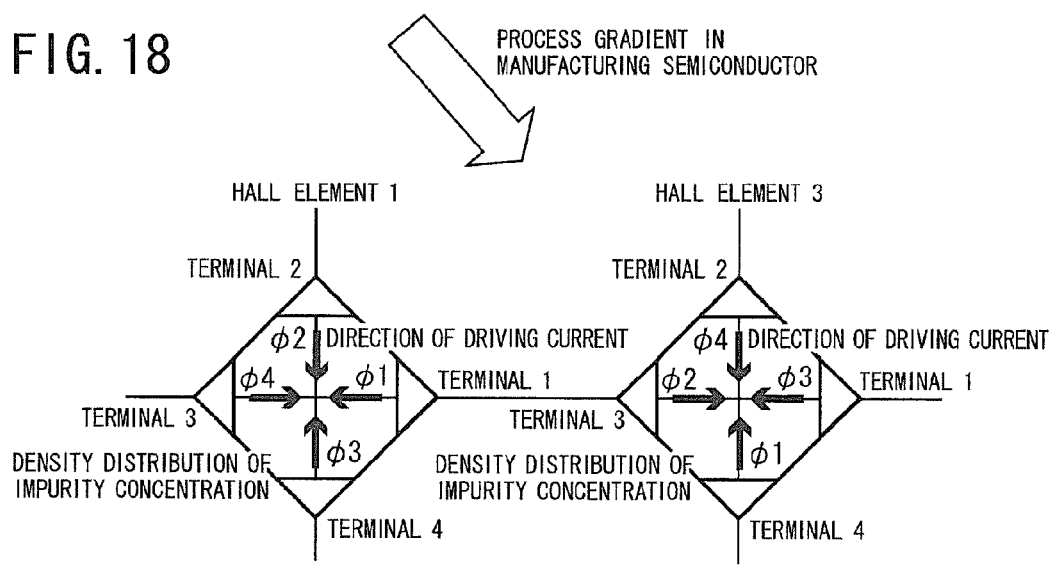
FIG. 18 is a view illustrating an IC layout including two Hall elements in a Hall electromotive force signal detection circuit according to the embodiment of the present disclosure and the Spinningcurrent method in these two Hall elements, when there is a density distribution of an impurity concentration within the Hall elements, due to a process gradient in manufacturing a semiconductor when making an IC circuit.

FIG. 18 is a view illustrating an IC layout including two Hall elements in the Hall electromotive force signal detection circuit according to the embodiment of the present disclosure, and the Spinningcurrent method in these two Hall elements, when there is the density distribution of the impurity concentration within the Hall elements, due to the process gradient in manufacturing the semiconductor when making the IC circuit.

Furthermore, the arrangement of the Hall elements is a layout arrangement in which the two Hall elements are adjacent and parallel to each other.

By such a configuration, the Hall electromotive force signal detection circuit according to the embodiment of the present disclosure can effectively cancel the influence on the offset, resulting from the density distribution of the impurity concentration within the Hall elements, due to the process gradient in manufacturing the semiconductor when making the IC circuit, too.

The above-mentioned Hall electromotive force signal detection circuit according to the embodiment of the present disclosure has been described by the example in which the number of the Hall elements is two. However, as is known from the above description, the number of the Hall elements in the present disclosure is not limited to two, and may be any even number. Generally, an increase in the number of the Hall elements is an effective means to improve the magnetic sensitivity to obtain a magnetic sensor with high sensitivity in detection of the Hall electromotive force signal.

Furthermore, the case in which there are four phases (φ1 to φ4) has been described. However, as is known from the above description, the driving of the Hall element in the embodiment only have to include the both of shifting by +90 degrees and shifting by −90 degrees and to cancel the spike-like error signals in shifting between at least two Hall elements, and thus, may include twice or more times of shifting by 180 degrees.

Figure 19:
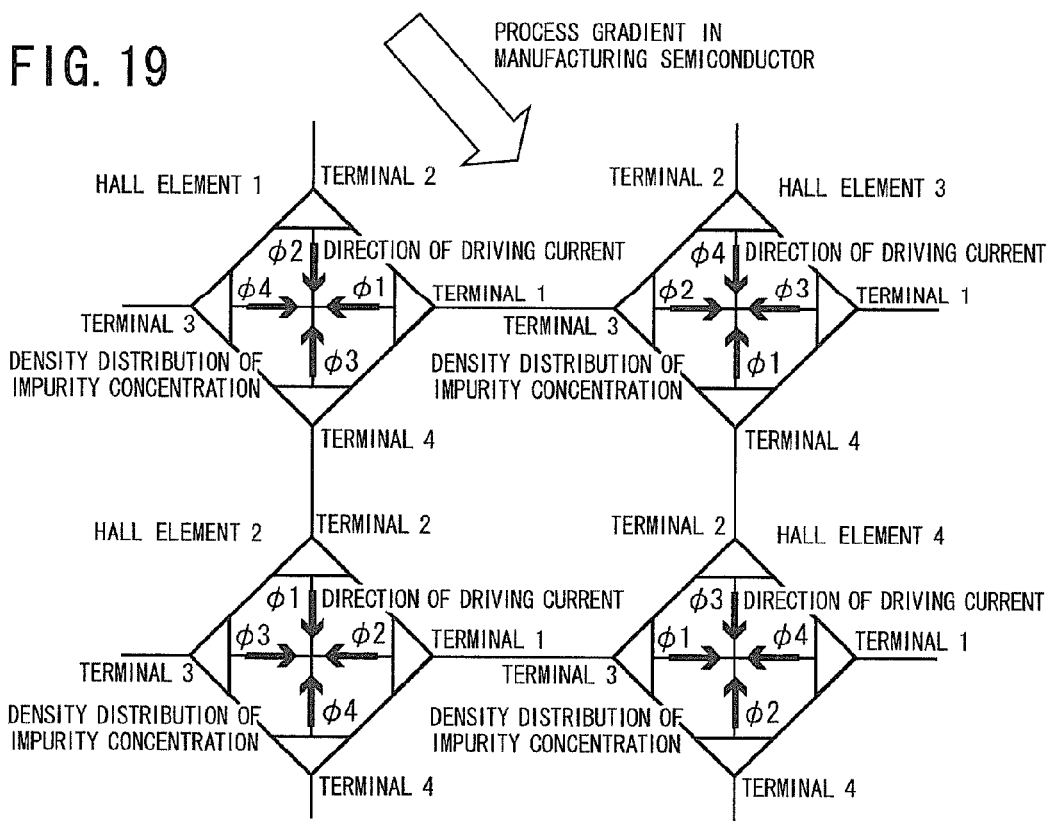
FIG. 19 is a view illustrating of an example of an IC layout in a case where four Hall elements are used in a Hall electromotive force signal detection circuit according to the embodiment of the present disclosure.

FIG. 19 is a view illustrating of an example of the IC layout in a case where four Hall elements are used in the Hall electromotive force signal detection circuit according to the embodiment of the present disclosure. Furthermore, the arrangement of the Hall elements may be a layout arrangement in which the four Hall elements are adjacent and parallel to one another. It turns out that, when using these four Hall elements, by arranging the four Hall elements at vertices of a square, respectively, the effect of cancelling the influence due to the process gradient in manufacturing the semiconductor is also improved in comparison with the case using two Hall elements.

Figure 20:
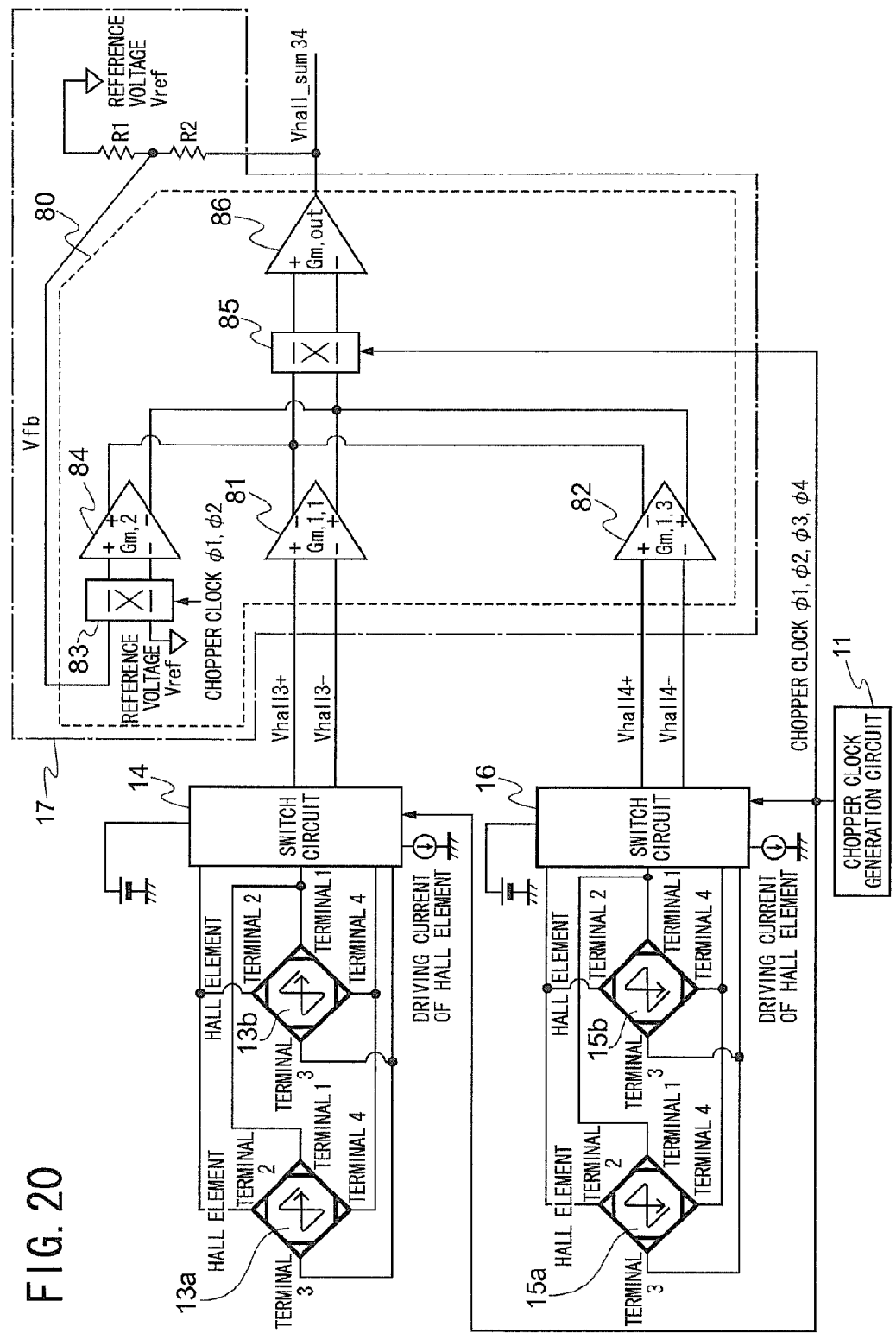
FIG. 20 is a circuit configuration diagram illustrating another specific example of the Hall electromotive force signal detection circuit illustrated in FIG. 10.

FIG. 20 is a circuit configuration diagram illustrating another specific example of the Hall electromotive force signal detection circuit illustrated in FIG. 10. In the drawing, reference signs 13a and 13b demote the first Hall elements, and reference signs 15a and 15b demote the third Hall elements. It is to be noted that the same signs are assigned to the components having the same functions as those in FIG. 13.

In the Hall electromotive force detection circuit illustrating in FIG. 20, the number of the Hall elements connected to the first switch circuit 14 and the number of the Hall elements connected to the third switch circuit 16 are increased from one to two, respectively, in comparison with FIG. 13.

That is, the one Hall element and the other Hall element are Hall elements respectively including plural Hall elements connected in parallel, and the number of the plural Hall elements connected in parallel is two.

The Hall electromotive force signal detection circuit according to the embodiment of the present disclosure is configured to select the terminal position for applying the driving current to the Hall element including the plural terminals to detect the Hall electromotive force signal voltage.

One Hall element group 13a and 13b includes the plural Hall elements connected in parallel, and the plural Hall elements respectively include the first to the fourth terminals to generate the one Hall electromotive force signal voltage. The other element group 15a and 15b includes the plural Hall elements connected in parallel, and the plural Hall elements respectively include the first to the fourth terminals to generate the other Hall electromotive force signal voltage.

Furthermore, the one switch circuit 14 is configured to select the terminal position for applying the driving current among the four terminals of the one Hall element group 13a and 13b. Furthermore, the other switch circuit 16 is configured to select the terminal positions different from those selected by the one switch circuit 14, among the four terminals of the other Hall element group 15a and 15b, as terminal positions for applying the driving current.

Furthermore, the chopper clock generation circuit 11 is configured to supply the chopper clock signal with the four different phases $\varphi1$, $\varphi2$, $\varphi3$, $\varphi4$ to the one switch circuit 14, as well as to supply the chopper clock signal with the four different phases $\varphi1$, $\varphi2$, $\varphi3$, $\varphi4$ to the other switch circuit 16. Furthermore, the Hall electromotive force signal adder circuit is configured to simultaneously add the one Hall electromotive force signal voltage and the other Hall electromotive force signal voltage.

It is noted that the case where the number of the Hall elements connected in parallel is two has been described in FIG. 20. However, the number of the Hall elements is not limited to two, and may be four or more. Any desired number of Hall elements may be provided as needed.

In this configuration, the two Hall elements 13a and 13b connected to the one switch circuit 14 are connected in parallel and the two Hall elements 15a and 15b connected to the one switch circuit 16 are connected in parallel. Thus the output impedance of these two Hall elements when viewed from the transistor differential pair (Gm, 1, 1), the transistor differential pair (Gm, 1, 3) is reduced to about half the output impedance of the Hall element in FIG. 13.

Immediately after switching the chopper clock, the two terminals have been used for applying the driving current to the Hall element until then are switched to be used for extracting the Hall electromotive force signal. The discharging phenomenon while the electric potentials of these two terminals shift from the bias voltages Vbias+ and Vbias− to the electric potentials of the Hall electromotive force signal is the cause for the spike-like error signal. The time constant $\tau$ of the discharging phenomenon is represented as the product of the output impedance R of these two Hall elements when viewed from the transistor differential pair (Gm, 1, 1) and the transistor differential pair (Gm, 1, 3), and the floating capacitance C at this signal node, that is, $\tau=RC$. Then, by connecting the Hall element in parallel to reduce the output impedance R of the Hall element, it is possible to reduce the time constant $\tau$ of the discharging phenomenon, and it is possible to eliminate the spike-like error signal caused in switching the chopper clock signal in a short period.

For the above reasons, the Hall electromotive force detection circuit illustrated in FIG. 20 can eliminate the spike-like error signal caused in switching the chopper clock signal in a short period, in comparison with the case of the Hall electromotive force signal detection circuit illustrated in FIG. 13.

FIGS. 21A and 21B are views illustrating the spike-like error signal (solid line) in the Hall electromotive force signal detection circuit illustrated in FIG. 20 and the spike-like error signal (dotted line) in the Hall electromotive force signal detection circuit illustrated in FIG. 13.

As is known from FIGS. 21A and 21B, in the Hall electromotive force signal detection circuit illustrated in FIG. 20, the spike-like error signal caused in switching the chopper clock is eliminated in a short period. Therefore, it is possible to effectively reduce the influence of the spike-like error signal by providing a low-pass filter at the subsequent stage of the Hall electromotive force signal detection circuit illustrated in FIG. 20. In FIG. 20, the number of the Hall elements connected to each other in parallel is two. By increasing the number of the Hall elements connected in parallel, it is possible to reduce the output impedance of the Hall elements connected in parallel so as to reduce the influence of the spike-like error signal. Therefore, this feature of the Hall electromotive force signal detection circuit exemplified in FIG. 20 is suitable for a current sensor for inverter current detection, which requires the wide-band property and the high-speed responsivity.

Second Embodiment

Figure 22:
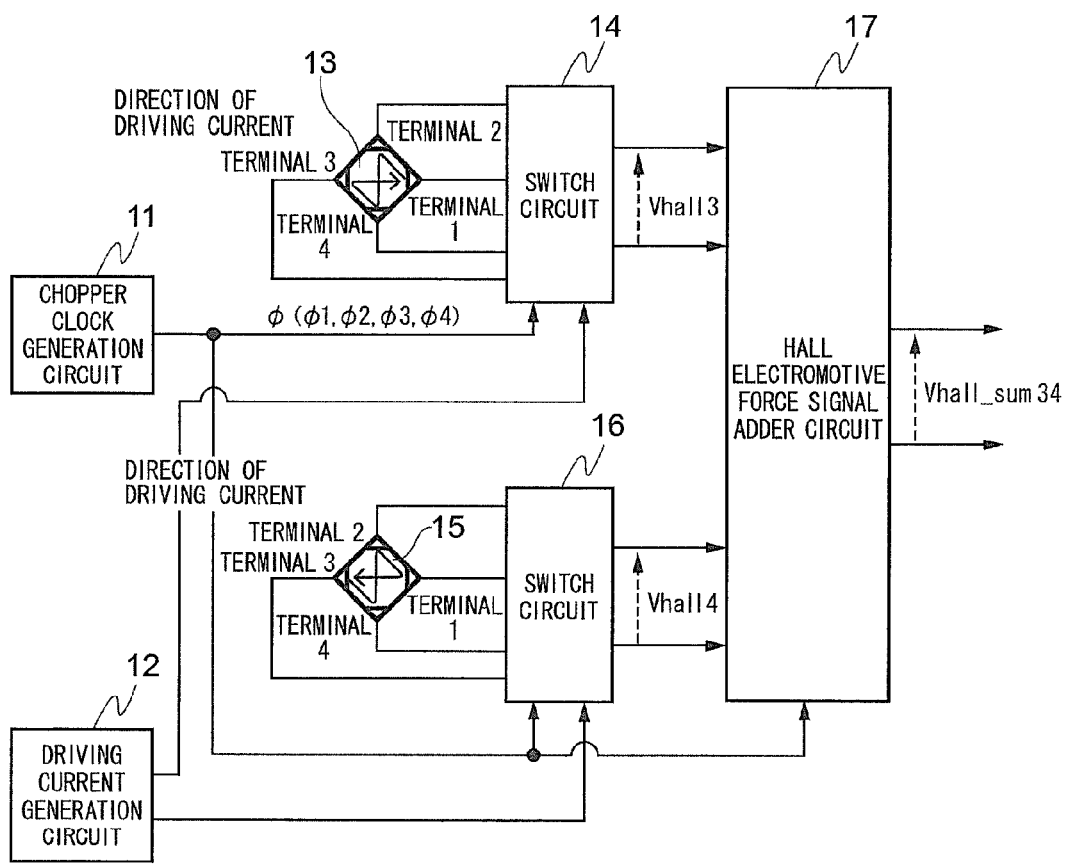
FIG. 22 is a circuit configuration diagram illustrating a Hall electromotive force signal detection circuit according to the second embodiment of the present disclosure.

FIG. 22 is a circuit configuration diagram illustrating the Hall electromotive force signal detection circuit according to the second embodiment of the present disclosure. It is to be noted that the same signs are assigned to the components having the same functions as those in FIG. 10. The Hall electromotive force signal detection circuit according to the second embodiment illustrated in FIG. 22 and the Hall electromotive force signal detection circuit according to the first embodiment illustrated in FIG. 10 have the same configuration, but is different from each other in the operation of the respective switch circuits. The difference of the operation will be described hereinafter.

The other switch circuit 16 is configured to switch the terminal position for injecting the driving current in the other Hall element 15 in turn, to the terminal of the other Hall element 15 facing the terminal position for injecting the driving current in the one Hall element 13, on the basis of the chopper signal generated by the chopper clock generation circuit 11.

That is, The first switch circuit 14 is configured to switch the terminal position for injecting the driving current in the third Hall element 13 among the first to the fourth terminals to the first terminal, the second terminal, the fourth terminal, and the third terminal in this order, on the basis of the chopper clock signal with the four different phases φ1, φ2, φ3, φ4 generated by the chopper clock generation circuit 11. The fourth switch circuit 16 is configured to switch the terminal position for injecting the driving current in the fourth Hall element 15 in turn, to the terminal out of the first to the fourth terminal of the fourth Hall element 15, which faces the terminal position for injecting the driving current in the third Hall element 13, on the basis of the chopper clock signal with the four different phases φ1, φ2, φ3, φ4 generated by the chopper clock generation circuit 11.

Furthermore, the third switch signal 14 is configured to inject the driving current from the terminal 1 when the chopper clock signal is in phase φ1, to inject the driving current from the terminal 2 when the chopper clock signal is in phase φ2, to inject the driving current from the terminal 4 when the chopper clock signal is in phase φ3, and to inject the driving current from the terminal 3 when the chopper clock signal is in phase φ4. The fourth switch circuit 16 is configured to inject the driving current from the terminal 3 when the chopper clock signal is in phase φ1, to inject the driving current from the terminal 4 when the chopper clock signal is in phase φ2, to inject the driving current from the terminal 2 when the chopper clock signal is in phase φ3, and to inject the driving current from the terminal 1 when the chopper clock signal is in phase φ4.

That is, the circuit configuration diagram illustrated in FIG. 22 according to the second embodiment of the present disclosure is different from the circuit configuration diagram illustrated in FIG. 10 according to the first embodiment, as to the two Hall element, in that the positions of the terminal pair for applying the driving current of the Hall element and the positions of the terminal pair at which the Hall electromotive force signal is detected differ between the third Hall element 13 and the fourth Hall element 15 in the circuit configuration diagram illustrated in FIG. 22.

FIGS. 23Aa, 23Ab, 23Bc, and 23Bd are views illustrating the positions of the terminal pair determining the direction of applying the driving current of the third Hall element in the circuit configuration diagram illustrated in FIG. 22, the positions of the terminal pair at which the Hall electromotive force signal is detected, and switching of the chopper modulation switch and the chopper demodulation switch.

It is to be noted that Table 14 indicates the positions of the terminal pair determining the direction of applying the driving current of the third Hall element 13, and Table 15 indicates the positions of the terminal pair at which the Hall electromotive force signal of the third Hall element 13 is detected. Out of the four terminals of the Hall element, the terminal 1 and the terminal 3 in a pair face each other, and the terminal 2 and the terminal 4 in a pair face each other.

When the Hall electromotive force signal is detected at the third Hall element 13 in this way, the Hall electromotive force signal Vhall3 (before demodulation) detected at the third Hall element 13 and the signal after demodulation are listed in Table 16 and Table 17, respectively. Herein, the chopper clock signal for demodulation changes its polarity in shifting from φ1 to φ2 and shifting from φ3 to φ4.

TABLE 14

TERMINAL PAIR FOR APPLYING DRIVING CURRENT IN THIRD HALL ELEMENT

| APPLYING DRIVING CURRENT | PHASE OF CHOPPER CLOCK | | | |
| --- | --- | --- | --- | --- |
| | IN CASE OF φ1 | IN CASE OF φ2 | IN CASE OF φ3 | IN CASE OF φ4 |
| Vhall3 | APPLYING FROM TERMINAL 1 TO TERMINAL 3 (0-DEGREE DIRECTION) | APPLYING FROM TERMINAL 2 TO TERMINAL 4 (90-DEGREE DIRECTION) | APPLYING FROM TERMINAL 4 TO TERMINAL 2 (270-DEGREE DIRECTION) | APPLYING FROM TERMINAL 3 TO TERMINAL 1 (180-DEGREE DIRECTION) |

TABLE 15

TERMINAL PAIR AT WHICH HALL ELECTROMOTIVE FORCE SIGNAL IS DETECTED IN THIRD HALL ELEMENT

| TERMINAL PAIR AT WHICH HALL ELECTROMOTIVE FORCE SIGNAL IS DETECTED | PHASE OF CHOPPER CLOCK | | | |
| --- | --- | --- | --- | --- |
| | IN CASE OF φ1 | IN CASE OF φ2 | IN CASE OF φ3 | IN CASE OF φ4 |
| Vhall3 | ELECTRIC POTENTIAL OF TERMINAL 2 IS MEASURED BY USING TERMINAL 4 AS REFERENCE | ELECTRIC POTENTIAL OF TERMINAL 1 IS MEASURED BY USING TERMINAL 3 AS REFERENCE | ELECTRIC POTENTIAL OF TERMINAL 3 IS MEASURED BY USING TERMINAL 1 AS REFERENCE | ELECTRIC POTENTIAL OF TERMINAL 4 IS MEASURED BY USING TERMINAL 2 AS REFERENCE |

TABLE 16

DETECTION OF HALL ELECTROMOTIVE FORCE
SIGNAL Vhall3 (BEFORE DEMODULATION)

| HALL ELECTROMOTIVE FORCE SIGNAL | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall3 | +2Vsig(B) +Vos(Hall, 0°) +Vos(Add) | −2Vsig(B) +Vos(Hall, 90°) +Vos(Add) | −2Vsig(B) +Vos(Hall, 270°) +Vos(Add) | +2Vsig(B) +Vos(Hall, 180°) +Vos(Add) |

TABLE 17

DETECTION OF HALL ELECTROMOTIVE FORCE
SIGNAL Vhall3 (AFTER (DEMODULATION)

| HALL ELECTROMOTIVE FORCE SIGNAL | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall3 | +2Vsig(B) +Vos(Hall, 0°) +Vos(Add) | +2Vsig(B) −Vos(Hall, 90°) −Vos(Add) | +2Vsig(B) −Vos(Hall, 270°) −Vos(Add) | +2Vsig(B) +Vos(Hall, 180°) +Vos(Add) |

Herein, Vsig(B) is used as the signal component corresponding to the magnetic field B of the third Hall element 13.

On the other hand, the offset components of the third Hall element are assumed to be Vos(Hall, 0°), Vos(Hall, 90°), Vos(Hall, 270°), and Vos(Hall, 180°). This is because there is the density distribution of the impurity concentration within the respective Hall elements due to the process gradient in manufacturing semiconductors as described above, and thus the occurrence state of the depletion layer within the Hall element varies depending on the terminal from which the driving current is injected, out of the four terminals of the Hall element (terminal 1, terminal 2, terminal 3, terminal 4). Furthermore, the input offset of the Hall electromotive force adder circuit is assumed to be Vos(Add).

FIGS. 24Aa, 24Ab, 24Bc, and 24Bd are views illustrating the positions of the terminal pair determining the direction of applying the driving current of the fourth Hall element in the circuit configuration diagram illustrated in FIG. 22, the positions of the terminal pair at which the Hall electromotive force signal is detected, and switching of the chopper modulation switch and the chopper demodulation switch.

It is to be noted that Table 18 indicates the positions of the terminal pair determining the direction of applying the driving current of the fourth Hall element 15, and Table 19 indicates the positions of the terminal pair at which the Hall electromotive force signal of the fourth Hall element 15 is detected. Out of the four terminals of the Hall element, the terminal 1 and the terminal 3 in a pair face each other, and the terminal 2 and the terminal 4 in a pair face each other.

When the Hall electromotive force signal is detected at the fourth Hall element 15 in this way, the Hall electromotive force signal Vhall4 (before demodulation) detected at the fourth Hall element 15 and the signal after demodulation are listed in Table 20 and Table 11, respectively. Herein, the chopper clock signal for demodulation changes its polarity in shifting from $\varphi1$ to $\varphi2$ and shifting from $\varphi3$ to $\varphi4$.

TABLE 18

TERMINAL PAIR FOR APPLYING DRIVING CURRENT IN FOURTH HALL ELEMENT

| APPLYING DRIVING CURRENT | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall4 | APPLYING FROM TERMINAL 3 TO TERMINAL 1 (180-DEGREE DIRECTION) | APPLYING FROM TERMINAL 4 TO TERMINAL 2 (270-DEGREE DIRECTION) | APPLYING FROM TERMINAL 2 TO TERMINAL 4 (90-DEGREE DIRECTION) | APPLYING FROM TERMINAL 1 TO TERMINAL 3 (0-DEGREE DIRECTION) |

TABLE 19

TERMINAL PAIR AT WHICH HALL ELECTROMOTIVE FORCE
SIGNAL IS DETECTED IN FOURTH HALL ELEMENT

| TERMINAL PAIR AT WHICH HALL ELECTROMOTIVE FORCE SIGNAL IS DETECTED | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall4 | ELECTRIC POTENTIAL OF TERMINAL 4 IS MEASURED BY USING TERMINAL 2 AS REFERENCE | ELECTRIC POTENTIAL OF TERMINAL 3 IS MEASURED BY USING TERMINAL 1 AS REFERENCE | ELECTRIC POTENTIAL OF TERMINAL 1 IS MEASURED BY USING TERMINAL 3 AS REFERENCE | ELECTRIC POTENTIAL OF TERMINAL 2 IS MEASURED BY USING TERMINAL 4 AS REFERENCE |

TABLE 20

DETECTION OF HALL ELECTROMOTIVE FORCE SIGNAL
Vhall4 (BEFORE DEMODULATION)

| HALL ELECTROMOTIVE FORCE SIGNAL | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall4 | +2Vsig(B) +Vos(Hall, 180°) +Vos(Add) | −2Vsig(B) +Vos(Hall, 270°) +Vos(Add) | −2Vsig(B) +Vos(Hall, 90°) +Vos(Add) | +2Vsig(B) +Vos(Hall, 0°) +Vos(Add) |

TABLE 21

DETECTION OF HALL ELECTROMOTIVE FORCE
SIGNAL Vhall4 (AFTER DEMODULATION)

| HALL ELECTROMOTIVE FORCE SIGNAL | PHASE OF CHOPPER CLOCK | | | |
|---|---|---|---|---|
| | IN CASE OF $\varphi1$ | IN CASE OF $\varphi2$ | IN CASE OF $\varphi3$ | IN CASE OF $\varphi4$ |
| Vhall4 | +2Vsig(B) +Vos(Hall, 180°) +Vos(Add) | +2Vsig(B) −Vos(Hall, 270°) −Vos(Add) | +2Vsig(B) −Vos(Hall, 90°) −Vos(Add) | +2Vsig(B) +Vos(Hall, 0°) +Vos(Add) |

In this situation, a common value Vsig(B) between the third Hall element 13 and the fourth Hall element 15 is used as the signal component corresponding to the magnetic field B, on the assumption that the fourth Hall element 15 and the third Hall element 13 have the same magnetic sensitivity.

On the other hand, the offset components of the fourth Hall element are assumed to be similar values to Vos(Hall, 180°), Vos(Hall, 270°), Vos(Hall, 90°), and Vos(Hall, 0°) for the third Hall element. Furthermore, the input offset of the Hall electromotive force adder circuit is assumed to be Vos(Add).

Figure 25:
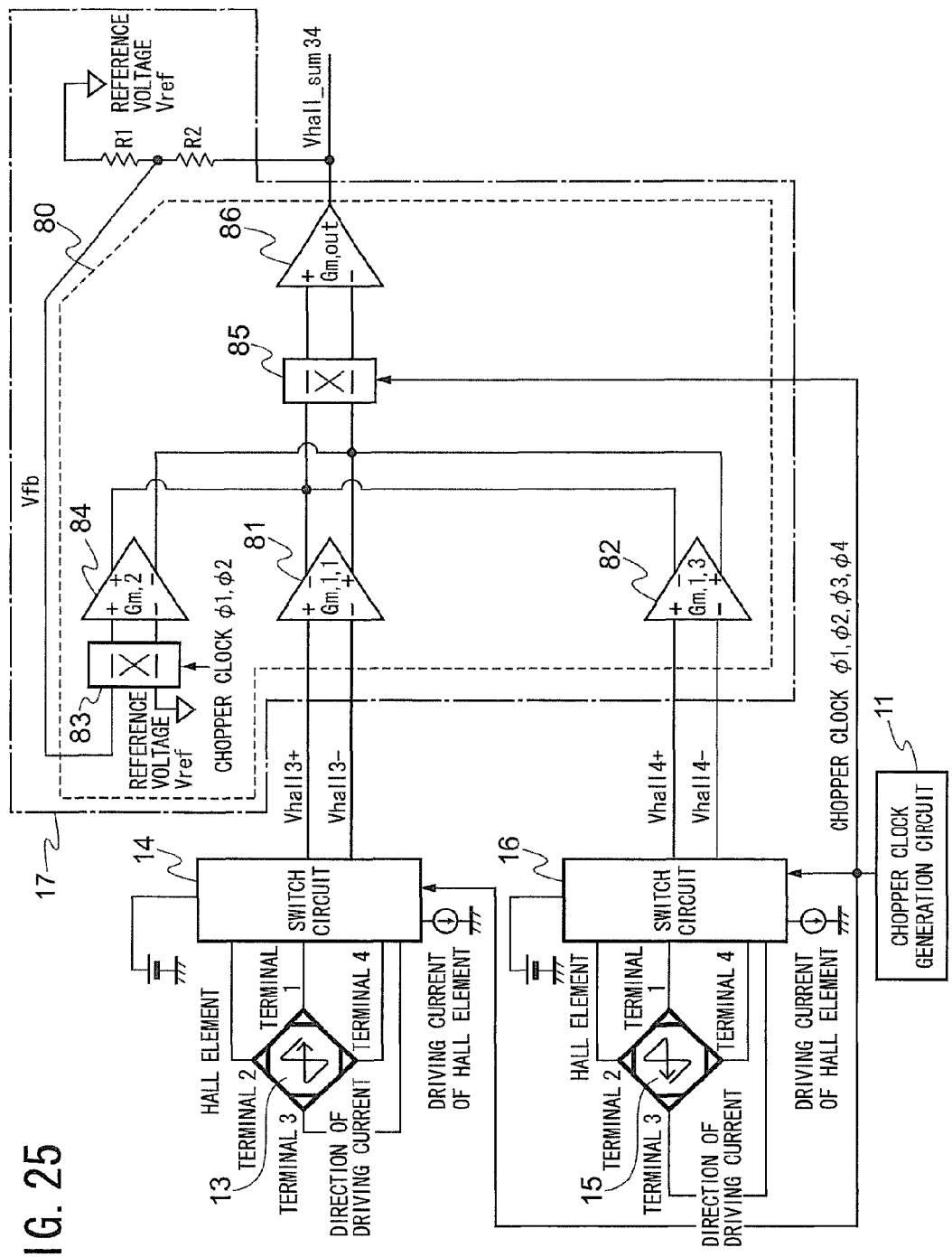
FIG. 25 is a circuit configuration diagram illustrating a specific example of the Hall electromotive force signal detection circuit illustrated in FIG. 22.

FIG. 25 is a circuit configuration diagram illustrating a specific example of the Hall electromotive force signal detection circuit illustrated in FIG. 22, which is obtained by combining the chopper amplifier, the current feedback amplifier, and the Spinningcurrent method of the Hall element. The circuit configuration illustrated in FIG. 25 is an example of a Hall electromotive force signal processing circuit based on a continuous-time signal processing method similarly to FIG. 13, but is different therefrom in the operation of the switch circuit. Therefore, only the difference will be described below.

FIGS. 26A to 26E are views illustrating the electric potentials at the respective terminals of the third Hall element 13, and the signal waveform of the Hall electromotive force signal Vhall3 detected at the third Hall element 13 in the Hall electromotive force signal detection circuit illustrated in FIG. 25.

FIGS. 27A to 27E are views illustrating the electric potentials at respective terminals of the fourth Hall element 15, and the signal waveform of the Hall electromotive force signal Vhall4 detected at the fourth Hall element 15.

In the Hall electromotive force signal detection circuit according to the embodiment of the present disclosure, the Hall electromotive force signal Vhall3 generated in the third Hall element 13 and the Hall electromotive force signal Vhall4 generated in the fourth Hall element 15 are simultaneously added in the continuous time.

FIGS. 28A to 28D are views illustrating the chopper demodulation signal, and the output signal waveform obtained by simultaneously adding the signal waveforms of the Hall electromotive force signals Vhall3 and Vhall4. As is known from the FIGS. 28B to 28D, in the Hall electromotive force signal detection circuit according to the embodiment of the present disclosure, the Hall elements are driven such that the directions of the driving currents include not only one direction but also the reverse direction when the chopper clock shifts to φ1, φ2, φ3, φ4 in order. Therefore, the spike-like error signals occur in switching the chopper clock signal, but have output polarities reverse to each other because of the directions of shifting. Thus, the average of the error signals does not contribute to the offset.

Therefore, the Hall electromotive force signal detection circuit according to the embodiment of the present disclosure is quite effective in achieving a highly-accurate Hall electromotive force signal detection by a circuit configuration based on the continuous-time signal processing method.

The Hall electromotive force signal detection circuit according to the embodiment of the present disclosure has a feature in which the directions of applying the driving currents of the third Hall element 13 and the fourth Hall element 15 are different from each other by 180 degrees, as listed in Table 22. That is, in the Hall electromotive force signal detection circuit according to the embodiment of the present disclosure, the driving current of the third Hall element 13 is applied in the direction of 0 degree, 90 degrees, 270 degrees, and 180 degrees in this order, and the driving current of the fourth Hall element 15 is applied in the direction of 180 degrees, 270 degrees, 90 degrees, and 0 degree in this order.

In this way, by setting the directions of applying the driving currents of the third Hall element 13 and the fourth Hall element 15 such that these directions are different from each other by 180 degrees, the offset component included in the output signal Vhall_sum34 after signal demodulation by the chopper clock is obtained as listed in Table 22.

As is known from Table 23, in the Hall electromotive force signal detection circuit according to the embodiment of the present disclosure, it is possible to cancel the four offset voltages Vos(Hall, 0°), Vos(Hall, 90°), Vos(Hall, 180°), and Vos(Hall, 270°), which may exist in the Hall element, by adding and subtracting them, while the chopper clock signal is switched among the four phases φ1, φ2, φ3, and φ4.

That is, the influence due to the density distribution of the impurity concentration within the respective Hall elements is averaged in the period from the phase φ1 to φ4, and thus it is possible to achieve the highly-accurate offset cancelling.

Furthermore, in FIGS. 28A to 28D, the large spike-like error signals occur only in shifting by 90 degrees in the chopper operation, that is, when the phase shifts from φ1 to φ2, and from φ3 to φ4, and their polarities are reverse to each other. Therefore, even if the spike-like error signal occurs, the offset as the average is quite small, since the occurrence frequency is low and their polarities are reverse to each other. Additionally, the spike-like error signal is generated depending on the input magnetic signal when the phase shifts from φ2 to φ3, and from φ4 to φ1. However, the magnitude thereof is small and the error signal is not generated when the magnetic signal is not input. Therefore, the error signal does not contribute to the offset.

Furthermore, when the direction of the driving current changes by 180 degrees, the magnitude of offset of the Hall element is almost unchanged and the polarity thereof is inverted. That is, a relationship Vos(Hall, 0°)≈−Vos(Hall, 180°) is satisfied. The similar relationship is satisfied among different Hall elements, and for the offset due to the density distribution of the impurity concentration.

TABLE 22

TERMINAL PAIR FOR APPLYING DRIVING CURRENT
IN THIRD HALL ELEMENT AND FOURTH HALL ELEMENT

| APPLYING DRIVING CURRENT | PHASE OF CHOPPER CLOCK | | | |
|---|---|---|---|---|
| | IN CASE OF φ1 | IN CASE OF φ2 | IN CASE OF φ3 | IN CASE OF φ4 |
| Vhall3 | APPLYING FROM TERMINAL 1 TO TERMINAL 3 (0-DEGREE DIRECTION) | APPLYING FROM TERMINAL 2 TO TERMINAL 4 (90-DEGREE DIRECTION) | APPLYING FROM TERMINAL 4 TO TERMINAL 2 (270-DEGREE DIRECTION) | APPLYING FROM TERMINAL 3 TO TERMINAL 1 (180-DEGREE DIRECTION) |
| Vhall4 | APPLYING FROM TERMINAL 3 TO TERMINAL 1 (180-DEGREE DIRECTION) | APPLYING FROM TERMINAL 4 TO TERMINAL 2 (270-DEGREE DIRECTION) | APPLYING FROM TERMINAL 2 TO TERMINAL 4 (90-DEGREE DIRECTION) | APPLYING FROM TERMINAL 1 TO TERMINAL 3 (0-DEGREE DIRECTION) |

TABLE 23

OFFSETS OF THIRD HALL ELEMENT AND FOURTH HALL
ELEMENT INCLUDED IN Vhall_sum34

| OFFSETS AFTER CHOPPER DEMODULATION | PHASE OF CHOPPER CLOCK | | | |
|---|---|---|---|---|
| | IN CASE OF φ1 | IN CASE OF φ2 | IN CASE OF φ3 | IN CASE OF φ4 |
| THIRD HALL ELEMENT | +Vos(Hall, 0°) | −Vos(Hall, 90°) | −Vos(Hall, 270°) | +Vos(Hall, 180°) |
| FOURTH HALL ELEMENT | +Vos(Hall, 180°) | −Vos(Hall, 270°) | −Vos(Hall, 90°) | +Vos(Hall, 0°) |

That is, when driving the third Hall element and the fourth Hall element such that the direction of the driving currents thereof are different from each other by 180 degrees, as listed in Table 22, the offset due to the density distribution of the impurity concentration of the third Hall element and the fourth Hall element are canceled in the period from the phase φ1 to φ4. Thus, it is possible to achieve a more highly-accurate offset cancelling.

In the method of the above-mentioned PTL1, the rotation direction of the driving is fixed. Thus, the large spike-like error signals usually occur in shifting and are the same in polarity. Therefore, the spike-like error signals with the same polarity occur due to the variation in the semiconductor manufacturing process, and the average thereof becomes the offset. Therefore, the embodiment of the present disclosure achieves a more highly-accurate offset cancellation.

Figure 29:
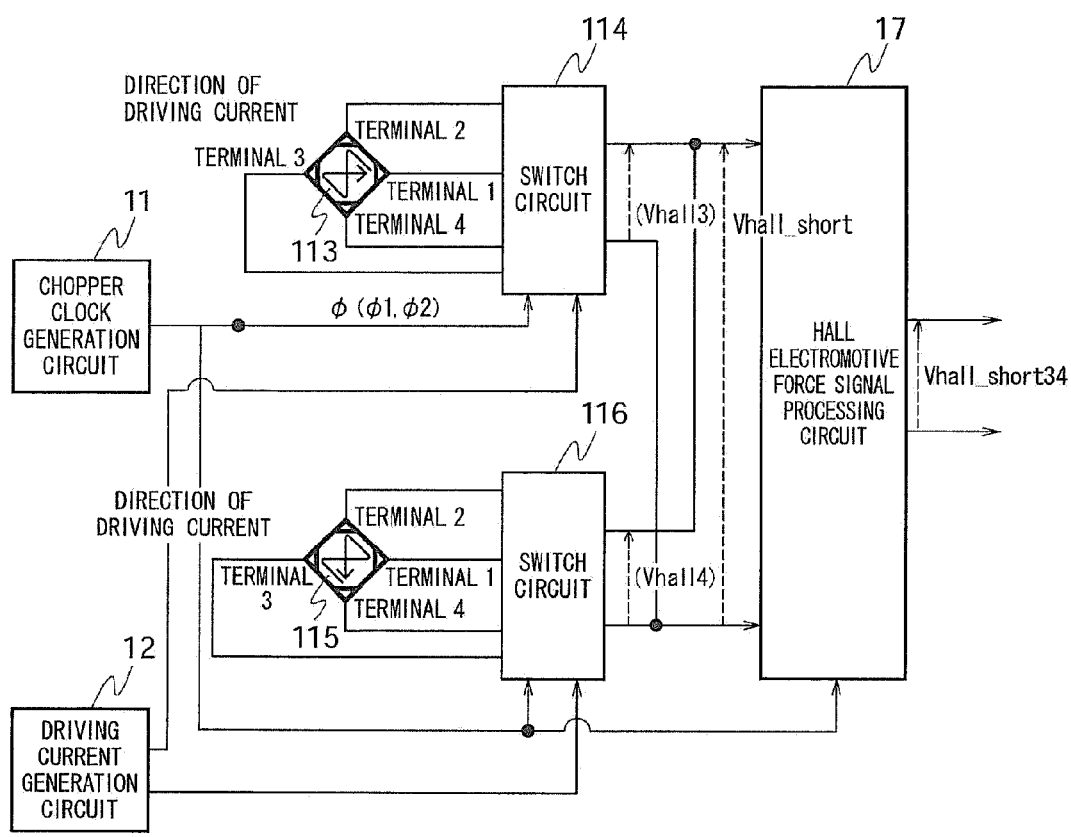
FIG. 29 is a circuit configuration diagram illustrating another specific example of the Hall electromotive force signal detection circuit illustrated in FIG. 10.

FIG. 29 is a circuit configuration diagram illustrating another specific example of the Hall electromotive force signal detection circuit illustrated in FIG. 10. In the drawing, a reference sign 113 denotes a third Hall element, a reference sign 115 denotes a fourth Hall element, a reference sign 114 denotes a third switch circuit, and a reference sign 116 denotes a fourth switch circuit. It is to be noted that the same signs are assigned to the components having the same functions as those in FIG. 10. Furthermore, in the description bellow, only differences from the above-described Hall electromotive force signal detection circuit will be described in detail.

The Hall electromotive force signal processing circuit 17 illustrated in FIG. 29 is configured to process a signal obtained by shorting the one Hall electromotive force signal voltage Vhall3 and the other Hall electromotive force signal voltage Vhall4. In addition, the switching of the terminal for injecting the driving current is the same to that in FIG. 10.

Furthermore, the Hall electromotive force signal processing circuit 17 is configured to simultaneously process the one Hall electromotive force signal voltage and the other Hall electromotive force signal voltage. The output of the one switch circuit 14 and the output of the other switch circuit 16 are shorted, and the one switch circuit 14 and the other switch circuit 16 switch the terminal positions for injecting the driving current in the one Hall element 113 and the other Hall element 115 among the respective terminals, on the basis of the chopper clock signal generated by the chopper clock generation circuit 11, as mentioned above.

Figure 30:
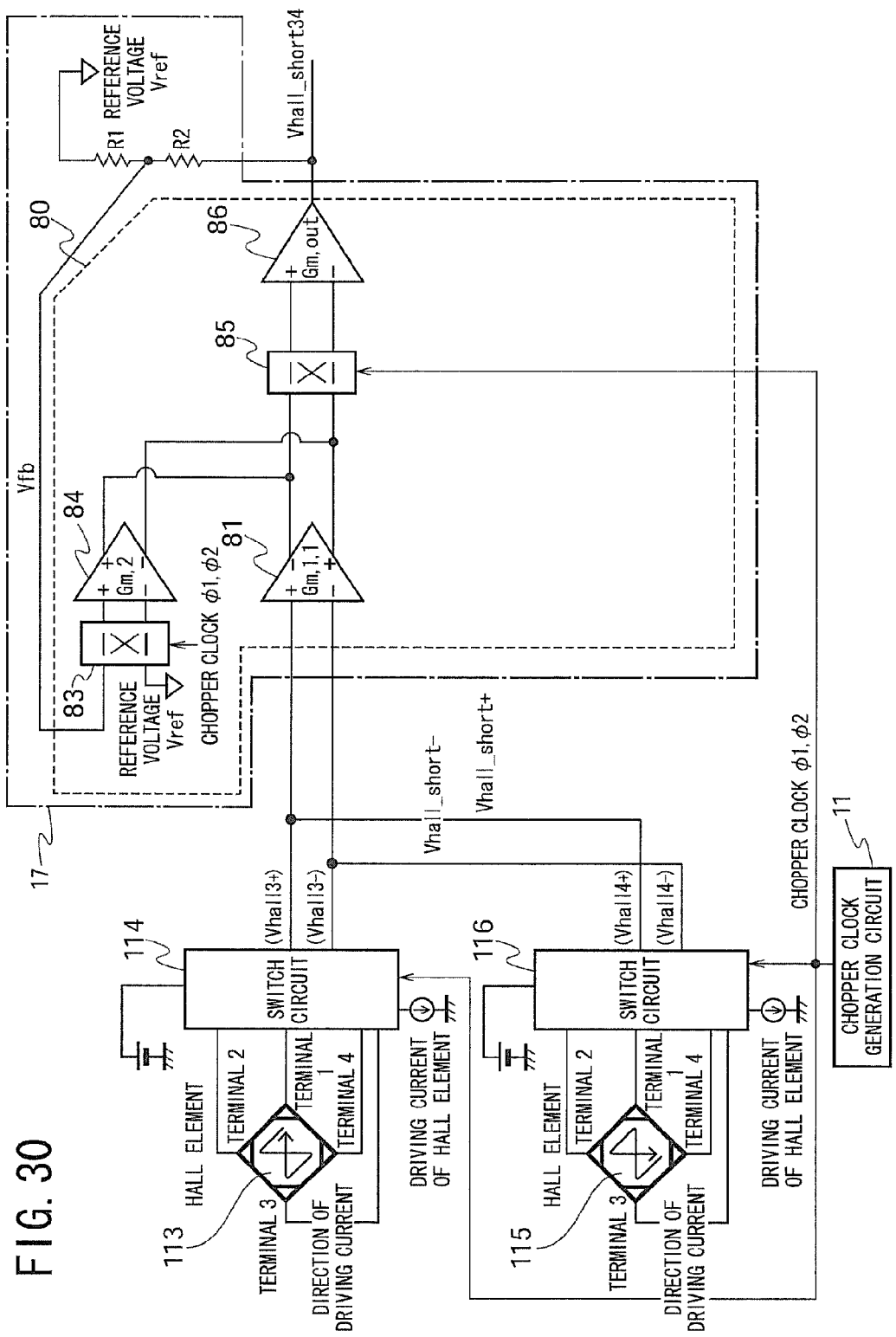
FIG. 30 is a circuit configuration diagram illustrating a specific example of the Hall electromotive force signal detection circuit illustrated in FIG. 29.

FIG. 30 is a circuit configuration diagram illustrating a specific example of the Hall electromotive force signal detection circuit illustrated in FIG. 29, which is obtained by combining the chopper amplifier, the current feedback amplifier, and the Spinningcurrent method of the Hall element. The circuit configuration illustrated in FIG. 30 does not time-discretize (sampling), and thus, is an example of a Hall electromotive force signal processing circuit based on a continuous-time signal processing method.

In the drawing, a reference sign 80 denotes a signal amplifier circuit configured to simultaneously add and amplify the Hall electromotive force signal Vhall3 generated in the third Hall element 113 and the Hall electromotive force signal Vall4 generated in the fourth Hall element 115, a reference sign 81 denotes the first transistor differential pair (Gm, 1, 1), a reference sign 83 denotes the seventh switch circuit, a reference sign 84 denotes the fourth transistor differential pair (Gm, 2), a reference sign 85 denotes the eighth switch circuit, and a reference sign 86 is an output stage of the Hall electromotive force signal adder circuit. It is to be noted that the same signs are assigned to the components having the same functions as those in FIG. 29.

That is, in FIG. 30, the Hall electromotive force signal Vhall3 generated in the third Hall element 113 and the Hall electromotive force signal Vall4 generated in the fourth Hall element 115 are simultaneously shorted in the continuous time to obtain the output voltage signal Vhall_short 34.

Figure 31:
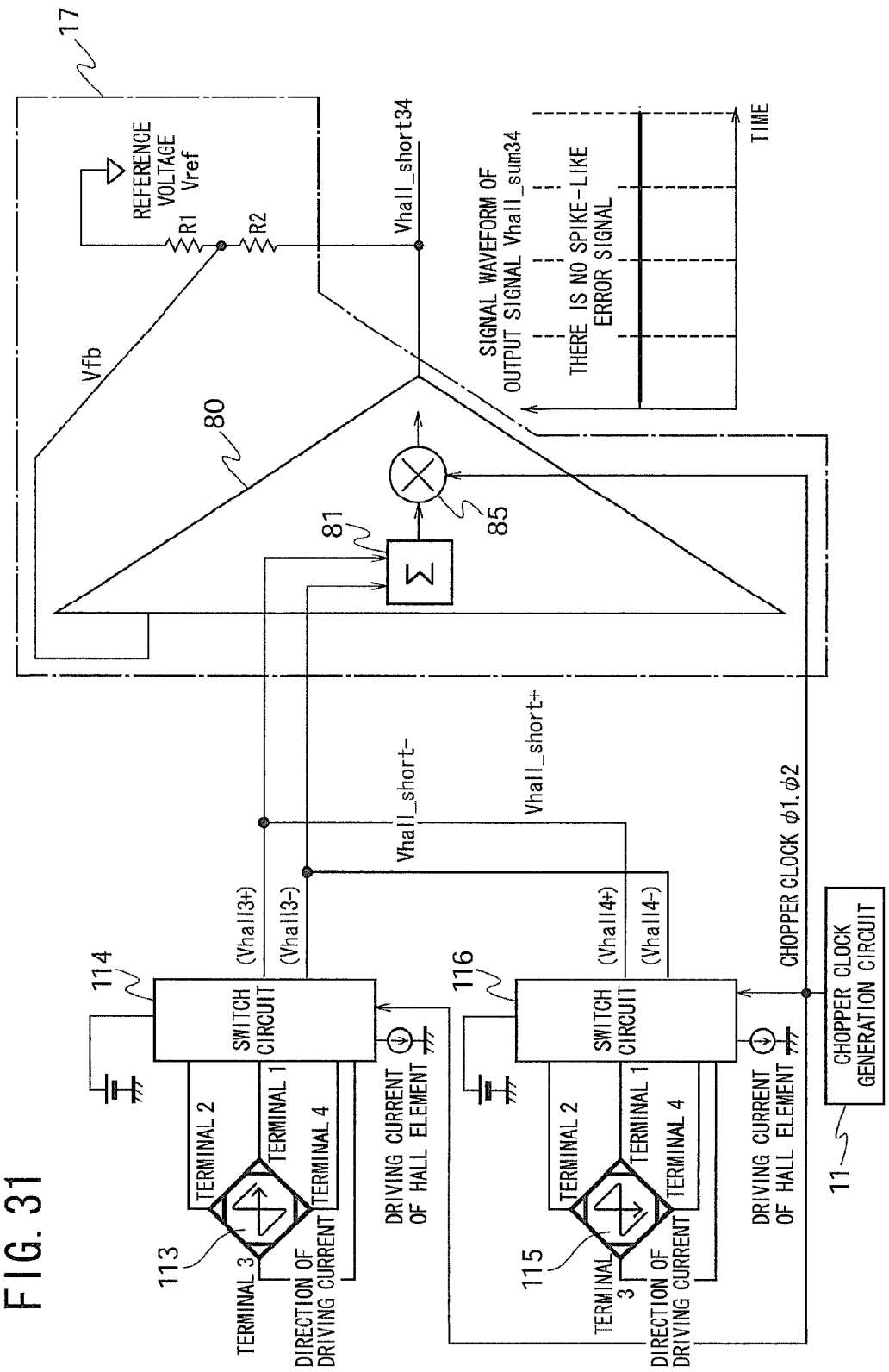
FIG. 31 is a view conceptually illustrating an operation of the circuit illustrated in FIG. 30.

FIG. 31 is a view conceptually illustrating the operation of the circuit illustrated in FIG. 30. The Hall electromotive force signals Vhall3 and Vhall4 generated in the third Hall element 113 and the fourth Hall element 115 are detected at the third switch circuit 114 and the fourth switch circuit 116 in a form in which the signal component Vsig (B) corresponding the magnetic field B is modulated by the chopper clock. Vhall3 and Vhall4 are demodulated by the chopper clock after being simultaneously shorted.

FIGS. 32A to 32G are views illustrating the electric potentials at the respective terminals of the fourth Hall element 115, and the signal waveforms of the Hall electromotive force signal Vhall4 detected at the fourth Hall element 115 and the Hall electromotive force signal Vhall3 detected at the third Hall element 113 in the Hall electromotive force signal detection circuit illustrated in FIG. 30.

The Hall electromotive force signal detection circuit according to the present embodiment is configured to simultaneously short the Hall electromotive force signal Vhall3 (FIG. 32E) generated in the third Hall element 113 and the Hall electromotive force signal Vall4 (FIG. 32F) generated in the fourth Hall element 115 in the continuous time. As such a result of simultaneously shorting Vhall3 and Vhall4 in the continuous time, the Hall electromotive force signal Vhall_short illustrated in FIG. 32G and the output signal waveforms illustrated in FIGS. 33A to 33C are obtained.

Figure 32:
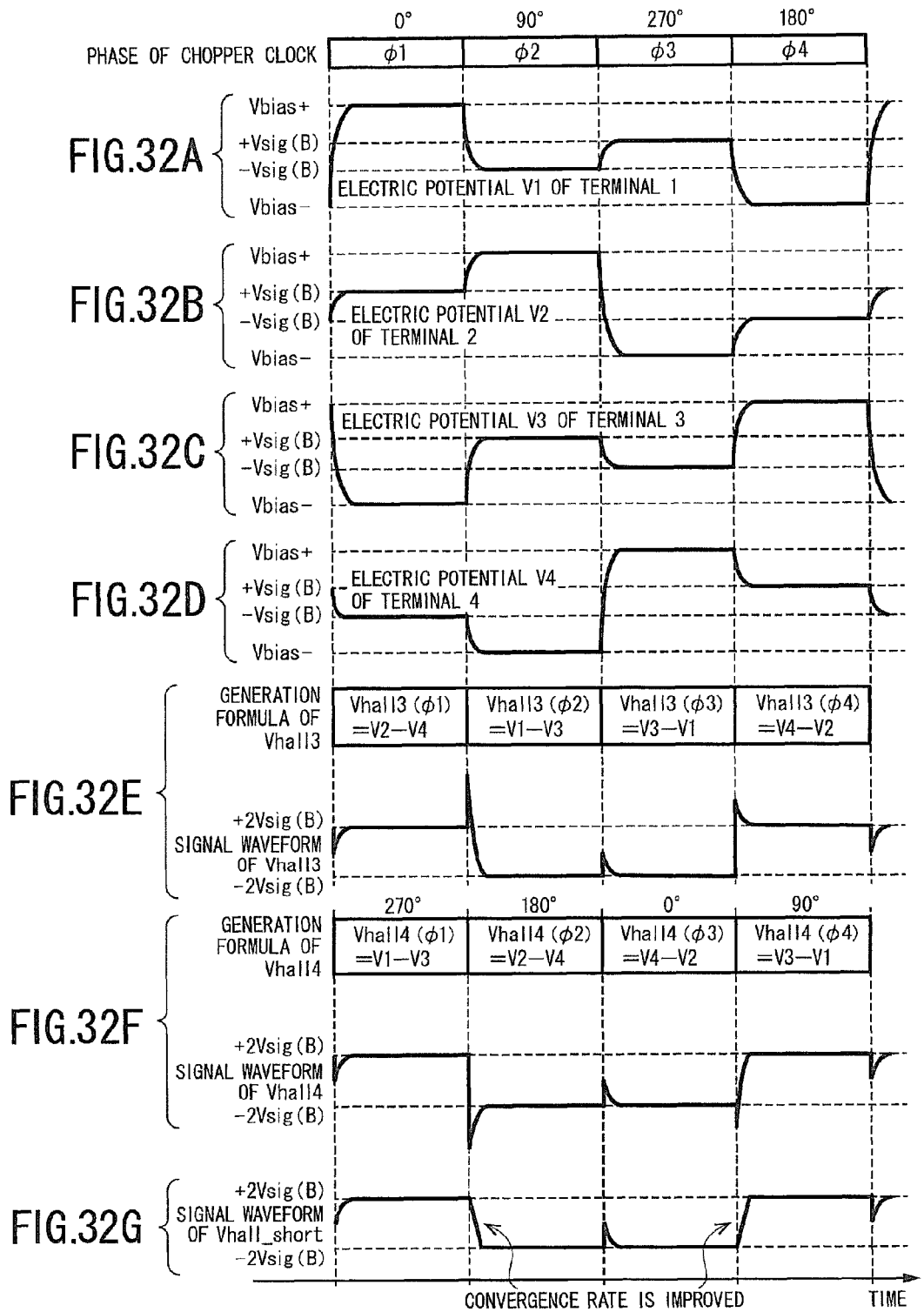
FIGS. 32A to 32G are views illustrating electric potentials at respective terminals of the fourth Hall element, and signal waveforms of the Hall electromotive force signal Vhall4 detected at the fourth Hall element and the Hall electromotive force signal Vhall3 detected at the third Hall element in the Hall electromotive force signal detection circuit illustrated in FIG. 30.
Figure 33:
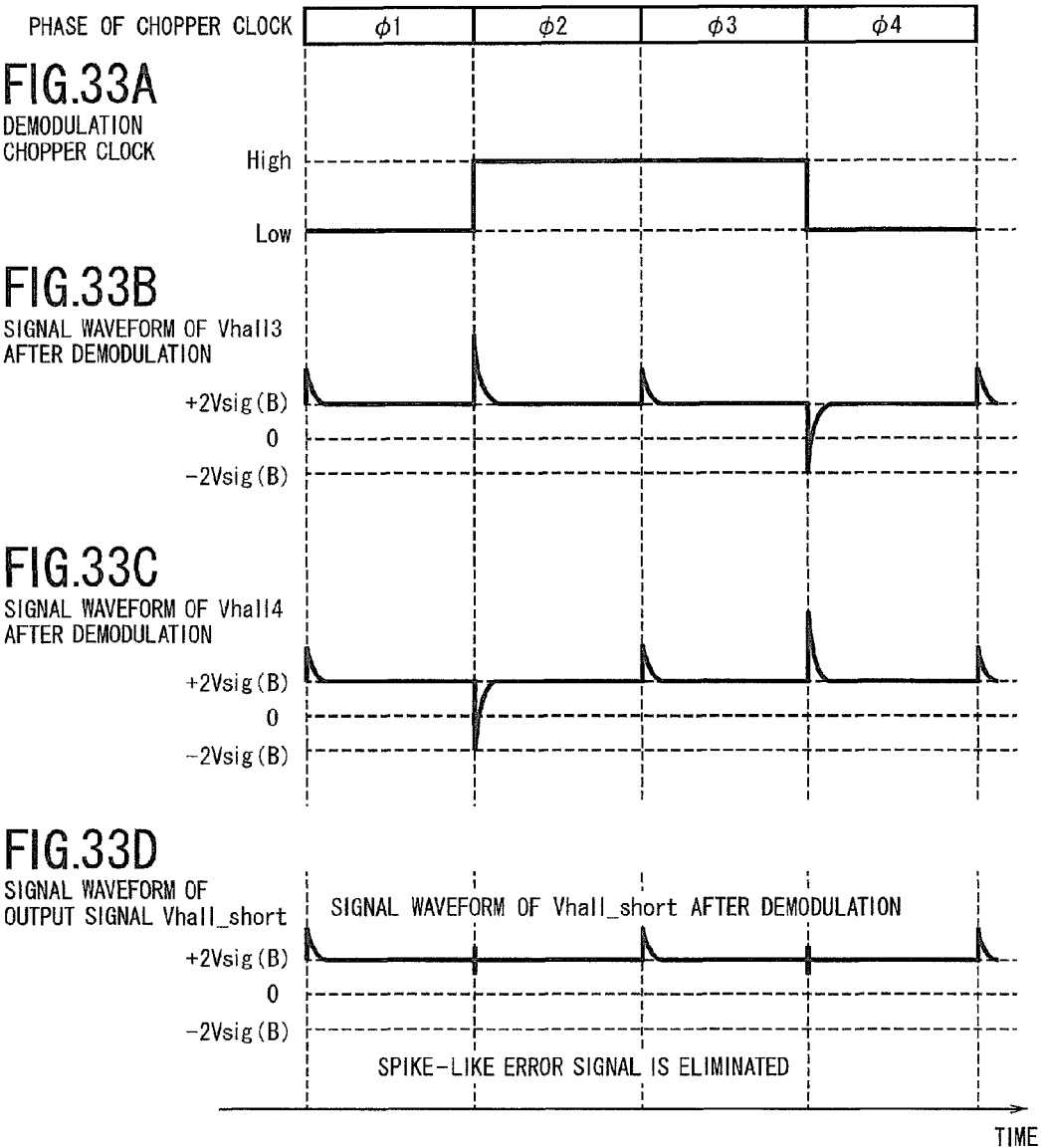
FIGS. 33A to 33D are views illustrating an output signal waveform obtained by simultaneously shorting signal waveforms of Hall electromotive force signals Vhall3 and Vhall4.

Here are the two important results in the waveform illustrated in FIG. 32.

Firstly, the switching operations of the third Hall element 113 and the fourth Hall element 114 are different from each other in FIGS. 32E and 32F. Thus, the spikes occurs so as to have polarities reverse to each other (negative side in FIG. 32E, positive side in FIG. 32F). Then, by shorting these signals, the spikes are eliminated and the Hall electromotive force signal is not eliminated in FIG. 32G.

Next, the third Hall element 113 and the fourth Hall element 115 are connected to each other in parallel via the switch at the moment when the spikes occur due to the switching of the switch circuits. Thus, the output impedance viewed from the Hall electromotive force signal processing circuit at the subsequent stage is reduced. Therefore, since the time constant at the input terminal of the Hall electromotive force signal processing circuit is reduced, there is also an effect of increasing the speed of cancelling and eliminating the spikes.

Accordingly, in the present embodiment, both of the cancellation of the spikes superimposed on the Hall electromotive force signal and the improvement of the speed of eliminating the spikes are achieved, by shorting the outputs of the two Hall element, such as the third Hall element 113 and the fourth Hall element 115, the switching operations of which are different from each other, and the outputs of the respective switch circuits thereof.

FIGS. 33A to 33C are views illustrating the output signal waveform obtained by simultaneously shorting signal waveforms of Hall electromotive force signals Vhall3 and Vhall4. As is known from FIGS. 33A to 33C, in the Hall electromotive force signal detection circuit according to the present embodiment, by simultaneously shorting the two Hall electromotive force signals, it is possible to significantly reduce the occurrence of the spike-like error signal in switching the chopper clock signal. Therefore, the Hall electromotive force signal detection circuit according to the present embodiment is quite effective in achieving a highly-accurate Hall electromotive force signal detection by a circuit configuration based on the continuous-time signal processing method.

Figure 34:
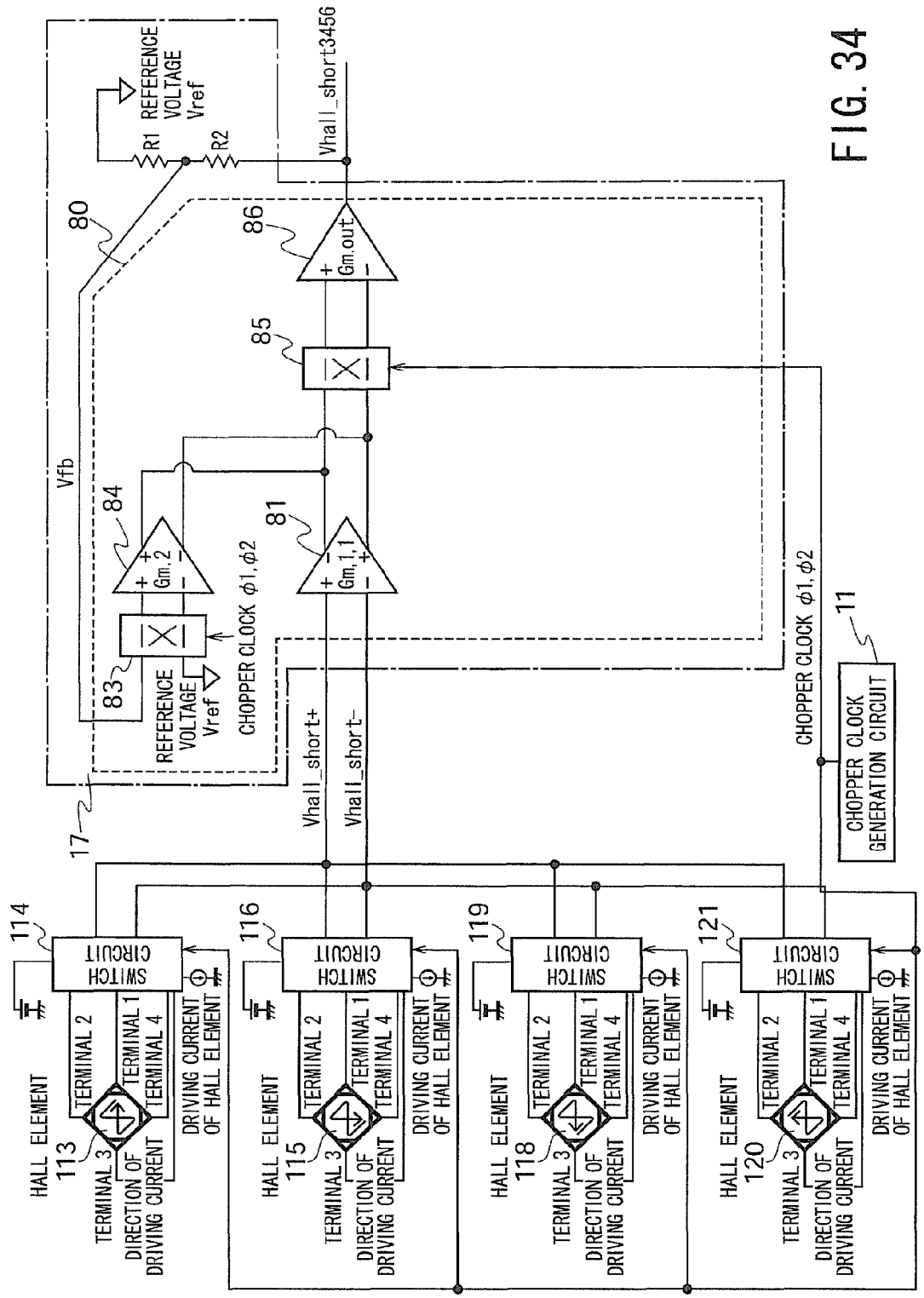
FIG. 34 is a circuit configuration diagram illustrating another specific example of the Hall electromotive force signal detection circuit illustrated in FIG. 29.

FIG. 34 is a circuit configuration diagram illustrating another specific example of the Hall electromotive force signal detection circuit illustrated in FIG. 29. In the drawing, a reference sign 113 denotes the third Hall element, a reference sign 115 denotes the fourth Hall element, a reference sign 118 denotes the fifth Hall element, and a reference sign 120 denotes the sixth Hall element. Furthermore, in the drawing, reference signs 114, 116, 119, and 121 denote the third, the fourth, the fifth, and the sixth switches, respectively. It is to be noted that the same signs are assigned to the components having the same functions as those in FIG. 30.

The Hall electromotive force signal detection circuit includes a one additional Hall element having the first to the fourth terminals to generate the one Hall electromotive force signal voltage, the other additional Hall element having the first to the fourth terminals to generate the other Hall electromotive force signal voltage, a one additional switch circuit configured to select the terminal positions from the four terminals of the one additional Hall element for applying the driving current, and the other additional switch circuit configured to select the terminal positions different from those selected by the one additional switch circuit from the four terminals of the other additional Hall element, as terminal positions for applying the driving current. The output of the one switch circuit, the output of the other switch circuit, the output of the one additional switch circuit, and the output of the other additional switch circuit are shorted.

The Hall electromotive force detection circuit illustrated in FIG. 34 is configured to switch the terminal positions for injecting the driving current as follows.

The third switch circuit 114 is configured to shift the terminal position for injecting the driving current of the third Hall element 113 to the first terminal, the second terminal, the fourth terminal, and the third terminal in this order.

The fourth switch circuit 116 is configured to shift the terminal position for injecting the driving current of the fourth Hall element 115 to the fourth terminal, the third terminal, the first terminal, and the second terminal in this order.

The fifth switch circuit 119 is configured to shift the terminal position for injecting the driving current of the fifth Hall element 118 to the third terminal, the fourth terminal, the second terminal, and the first terminal in this order.

The fifth switch circuit 121 is configured to shift the terminal position for injecting the driving current of the sixth Hall element 120 to the second terminal, the first terminal, the third terminal, and the fourth terminal in this order.

In the Hall electromotive force detection circuit illustrated in FIG. 34, the fifth Hall element 118 connected to the fifth switch circuit 119 and the sixth hall element 120 connected to the sixth switch circuit 121 are added, in comparison with FIG. 30. The outputs with the same polarity of the added fifth switch circuit 119, the added sixth switch circuit 121, and the existing switch circuits 14 and 16 are shorted.

Figure 35:
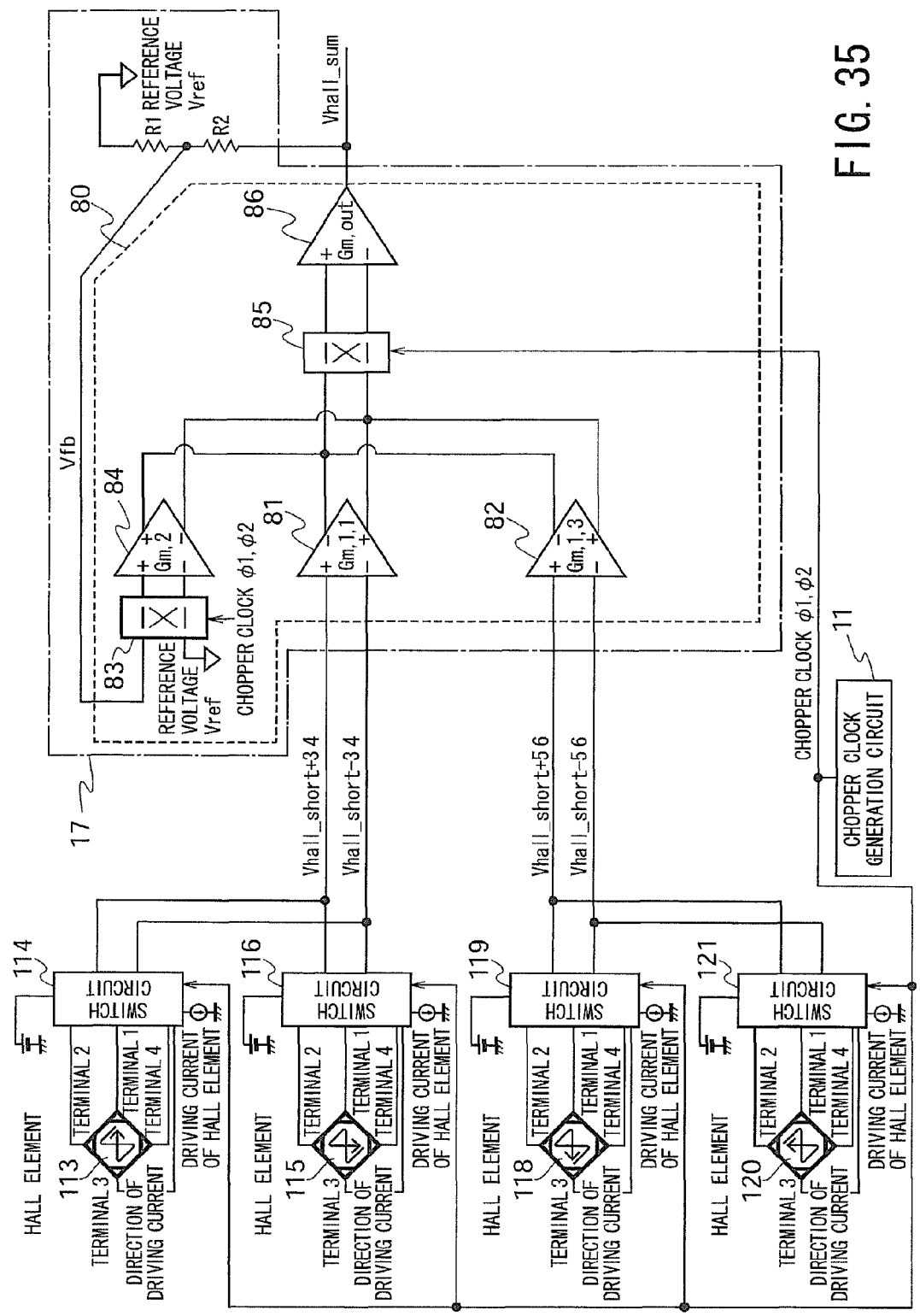
FIG. 35 is a circuit configuration diagram illustrating another specific example of the Hall electromotive force signal detection circuit illustrated in FIG. 29.

FIG. 35 is a circuit configuration diagram illustrating another specific example of the Hall electromotive force signal detection circuit illustrated in FIG. 29. It is to be noted that the same signs are assigned to the components having the same functions as those in FIGS. 30 and 34. A reference sign 82 denotes a transistor differential pair (Gm, 1, 3).

The Hall electromotive force signal detection circuit includes the one additional Hall element having the first to the fourth terminals to generate the one Hall electromotive force signal voltage, the other additional Hall element having the first to the fourth terminals to generate the other Hall electromotive force signal voltage, the one additional switch circuit configured to select the terminal positions from the four terminals of the one additional Hall element for applying the driving current, the other additional switch circuit having an output shorted to the output of the one additional switch circuit and configured to select the terminal positions different from those selected by the one additional switch circuit from the four terminals of the other additional Hall element, as terminal positions for applying the driving current, a Hall electromotive force signal processing circuit 17 configured to simultaneously add the outputs of the one switch circuit and the other switch circuit to the outputs the one additional switch circuit and the other additional switch circuit.

The Hall electromotive force detection circuit illustrated in FIG. 35 is configured to switch the terminal positions for injecting the driving current as follows.

The third switch circuit 114 is configured to shift the terminal position for injecting the driving current of the third Hall element 113 to the first terminal, the second terminal, the fourth terminal, and the third terminal in this order.

The fourth switch circuit 116 is configured to shift the terminal position for injecting the driving current of the fourth Hall element 115 to the fourth terminal, the third terminal, the first terminal, and the second terminal in this order.

The fifth switch circuit 119 is configured to shift the terminal position for injecting the driving current of the fifth Hall element 118 to the third terminal, the fourth terminal, the second terminal, and the first terminal in this order.

The fifth switch circuit 121 is configured to shift the terminal position for injecting the driving current of the sixth Hall element 120 to the second terminal, the first terminal, the third terminal, and the fourth terminal in this order.

That is, the outputs of two Hall elements 113 and 115 are shorted via the switch circuits 114 and 116, and are connected to the transistor differential pair (Gm, 1, 1). The outputs of the other two Hall elements 118 and 120 are shorted via the switch circuits 119 and 121, and are connected to the transistor differential pair (Gm, 1, 3). In this way, it is possible to provide the plural inputs of the Hall electromotive force signal processing circuits. The number of the inputs is not limited to two, and may be more than two.

In the embodiment of the present embodiment, a current feedback instrumentation amplifier with plural inputs is adopted as an example, however, a circuit with a single input, such as an instrumentation amplifier with a three-amplifier composition may be adopted.

It is to be noted that the case where the number of the Hall elements connected in parallel is two has been described in FIG. 30. However, the number of the Hall elements is not limited to two, and may be four or more. Any desired number of Hall elements may be provided as needed. As well as the respective terminals of the Hall elements may be connected in parallel, the configuration in which the respective terminals of the Hall elements are connected in series is practicable.

In FIG. 30, the output impedance of the two Hall elements 113 and 115 connected to the third switch circuit 114 and the fourth switch circuit 116 when viewed from the transistor differential pair (Gm, 1, 1) via the switch circuits is reduced to about half the output impedance of the Hall element in FIG. 13. In FIG. 34, the output impedance of the four Hall elements when viewed from the transistor differential pair (Gm, 1, 1) via the switches is reduced to about half again.

Immediately after switching the chopper clock, the two terminals have been used for applying the driving current to the Hall element until then are switched to be used for extracting the Hall electromotive force signal. The discharging phenomenon while the electric potentials of these two terminals shift from the bias voltages Vbias+ and Vbias− to the electric potentials of the Hall electromotive force signal is the cause for the spike-like error signal. The time constant $\tau$ of the discharging phenomenon is represented as the product of the output impedance R of these two Hall elements when viewed from the transistor differential pair (Gm, 1, 1) and the transistor differential pair (Gm, 1, 3), and the floating capacitance C at this signal node, that is, $\tau$=RC. Then, by connecting the Hall element in parallel to reduce the output impedance R of the Hall element, it is possible to reduce the time constant $\tau$ of the discharging phenomenon, and it is possible to eliminate the spike-like error signal caused in switching the chopper clock signal in a short period. For the above reasons, the Hall electromotive force detection circuit illustrated in FIG. 31 can eliminate the spike-like error signal caused in switching the chopper clock signal in a short period, in comparison with the case of the Hall electromotive force signal detection circuit illustrated in FIG. 14.

In the Hall electromotive force signal detection circuit illustrated in FIG. 29, the spike-like error signal caused in switching of chopper clock is eliminated in a short period. Therefore, it is possible to reduce the influence of the spike-like error signal more effectively, by providing a low-pass filter at the subsequent stage of the Hall electromotive force signal detection circuit illustrated in FIG. 29. By increasing the number of the Hall elements connected in parallel, it is possible to reduce the output impedance of the Hall elements connected in parallel so as to reduce the influence of the spike-like error signal. Therefore, this feature is suitable for a current sensor for inverter current detection, which requires the wide-band property and the high-speed responsivity.

As another additional embodiment, the outputs of the one switch circuit and the other switch circuit may be shorted in the configuration illustrated in FIG. 22, as described with FIG. 29. The above-mentioned respective embodiments may be combined to obtain combined configurations such as, the configuration in which the output signals of the Hall element driven in the figure-eight direction and the Hall element driven in the inverted figure-eight direction are added and averaged (FIG. 10 etc.), the configuration in which the output signals of the Hall element driven in the figure-eight direction and the Hall element driven in the figure-eight direction are added and averaged (FIG. 22 etc.), furthermore, or the configuration in which the output signals of the Hall element driven in the figure-eight direction and the Hall element driven in the inverted figure-eight direction are shorted, the output signals of the Hall element driven in the figure-eight direction and the Hall element driven in the figure-eight direction are shorted, and then both output signals are added.

The above-mentioned Hall electromotive force signal detection circuit according to the embodiment of the present disclosure has been described by the example in which the number of the Hall elements is two. However, as is known from the above description, the number of the Hall elements in the present disclosure is not limited to two, and may be any even number. Generally, an increase in the number of the Hall elements is an effective means to improve the magnetic sensitivity to obtain a magnetic sensor with high sensitivity in detection of the Hall electromotive force signal.

As mentioned above, in the Hall electromotive force signal detection circuit according to the embodiment of the present disclosure, it is possible to significantly reduce the occurrence of the spike-like error signal which is an obstacle to the improvement of the accuracy of the Hall electromotive force signal detection. Then, the Hall electromotive force signal detection circuit according to the embodiment of the present disclosure can be suitably used in the continuous-time signal processing circuit. Furthermore, the Hall electromotive force signal detection circuit according to the embodiment of the present disclosure can be used as the current sensor.

Next, the driving method of the driving circuit of the Hall element will be described.

The driving method of the driving circuit of the Hall element according to the embodiment of the present disclosure is a driving method of the driving circuit of the Hall element in a Hall electromotive force signal detection circuit configured to select the terminal position for applying the driving current to the Hall element including the plural terminals to detect the Hall electromotive force signal voltage.

The terminal position for injecting the driving current into the first Hall element which generates the first Hall electromotive force signal voltage and includes the first terminal and the third terminal facing each other, and the second terminal and the fourth terminal facing each other, the first terminal, the second terminal, the third terminal, and the fourth terminal being arranged in this order in the counterclockwise direction, is shifted, at least, (1) from any terminal position to a terminal located in the counterclockwise direction, (2) from any terminal position to a terminal located in the clockwise direction, or (3) from any terminal position to a terminal at a facing position. The terminal position for injecting the driving current into the second Hall element which generates the second Hall electromotive force signal voltage and includes the first terminal and the third terminal facing each other, and the second terminal and the fourth terminal facing each other, the first terminal, the second terminal, the third terminal, and the fourth terminal being arranged in this order in the counterclockwise direction, is shifted, at least, (1) from any terminal position to a terminal located in the clockwise direction when shifting the terminal position for injecting the driving current in the first Hall element to the terminal located in the counterclockwise direction, (2) from any terminal position to a terminal located in the counterclockwise direction when shifting the terminal position for injecting the driving current in the first Hall element to the terminal located in the clockwise direction, or (3) from any terminal position to a terminal opposite to the any terminal position when shifting the terminal position for injecting the driving current in the first Hall element to the facing position.

Furthermore, the terminal position for injecting the driving current into the first Hall element is shifted, at least, (1) from any terminal position to a terminal located in a direction rotating by +90 degrees and in the counterclockwise direction, (2) from any terminal position to a terminal located in a direction rotating by −90 degrees and in the clockwise direction, or (3) from any terminal position to a terminal located in a direction reversed by ±180 degrees. The terminal position for injecting the driving current into the second Hall element is shifted, at least, (1) from any terminal position to a terminal located in the direction rotating by −90 degrees and in the clockwise direction when shifting the terminal position for injecting the driving current in the first Hall element to the terminal located in the direction rotating by +90 degrees and in the counterclockwise direction, (2) from any terminal position to a terminal located in the direction rotating by +90 degrees and in the counterclockwise direction when shifting the terminal position for injecting the driving current in the first Hall element to the terminal located in the direction rotating by −90 degrees and in the clockwise direction, or (3) from any terminal position to a terminal located in the direction reversed by ±180 degrees when shifting the terminal position for injecting the driving current in the first Hall element to the terminal located in the direction reversed by ±180 degrees.

Furthermore, the Hall electromotive force signal voltage of the first Hall element and the Hall electromotive force signal voltage of the other Hall element are simultaneously added or averaged. Furthermore, when the terminal position for injecting the driving current into the first Hall element is shifted in the counterclockwise direction or the clockwise direction, the polarity of the added or averaged signal is switched.

Furthermore, the terminal position for injecting the driving current in the first Hall element is shifted to the first terminal, the second terminal, the fourth terminal, and the third terminal, of the first Hall element in this order.

Furthermore, the terminal position for injecting the driving current in the second Hall element is shifted (1) to the fourth terminal, the third terminal, the first terminal, and the second terminal, of the second Hall element in this order, (2) to the first terminal, the fourth terminal, the second terminal, and the third terminal, of the second Hall element in this order, (3) to the second terminal, the first terminal, the third terminal, and the fourth terminal, of the second Hall element in this order, or (4) to the third terminal, the second terminal, the fourth terminal, and the first terminal, of the second Hall element in this order.

According to the present disclosure, it is possible to obtain a Hall electromotive force signal detection circuit, a current sensor thereof, and a Hall element driving method suitable for a continuous-time signal processing circuit. Furthermore, it is possible to significantly reduce the occurrence of the spike-like error signal which is an obstacle to the improvement of the accuracy of the Hall electromotive force signal detection.

Furthermore, it is possible to promptly perform a highly-accurate offset cancellation in a short period, the offset cancellation also canceling an influence of the density distribution of the impurity concentration within the respective Hall elements (caused due to a process gradient in manufacturing the semiconductor). Therefore, the Hall electromotive force signal detection circuit according to the embodiments of the present disclosure is effective in obtaining a magnetic sensor which requires a high-speed responsivity such as a current sensor, by using the Hall element.

REFERENCE SIGNS LIST 1, 11 chopper clock generation circuit
2, 12 driving current generation circuit
3 first Hall element
4 first switch circuit
5 second Hall element
6 second switch circuit
7, 17 Hall electromotive force signal adder circuit
13, 13a, 13b, 113 third Hall element (the one Hall element)
14, 114 third switch circuit (the one switch circuit)
15, 15a, 15b, 115 fourth Hall element (the other Hall element)
16, 116 fourth switch circuit (the other switch circuit)
21 chopper modulation switch
22 Hall electromotive force signal adder
23 chopper demodulation switch
70, 80 signal amplifier circuit
71, 81 first transistor differential pair (Gm, 1, 1)
72 second transistor differential pair (Gm, 1, 2)
73, 83 seventh switch circuit
74, 84 fourth transistor differential pair (Gm, 1, 2)
75, 85 eighth switch circuit
76, 86 output stage of Hall electromotive force signal adder circuit
82 third transistor differential pair (Gm, 1, 3)
118 fifth Hall element
119 fifth switch circuit
120 sixth Hall element
121 sixth switch circuit

The invention claimed is:

1. A Hall electromotive force signal detection circuit comprising:
   a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction;
   a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction;
   a first switching circuit configured to select a terminal position for injecting a driving current and terminal positions for outputting the first Hall electromotive force signal voltage, out of the plurality of terminals of the first Hall elements;
   a second switching circuit configured to select a terminal position for injecting a driving current and terminal positions for outputting the second Hall electromotive force signal voltage, out of the plurality of terminals of the second Hall elements; and
   a Hall electromotive force signal processing circuit configured to simultaneously process the first Hall electromotive force signal voltage and the second Hall electromotive force signal voltage, wherein
   the first Hall electromotive force signal voltage output from the first switching circuit and the second Hall electromotive force signal voltage output from the second switching circuit are shorted,
   the first switching circuit is configured to perform switching to shift the terminal position for injecting the driving current, at least:
   (1) from any terminal position to a terminal located in a counterclockwise direction; or
   (2) from any terminal position to a terminal located in a clockwise direction, and the second switching circuit is configured to perform switching to shift the terminal position for injecting the driving current:
(1) from any terminal position to a terminal located in the clockwise direction, when switching to shift the terminal position for injecting the driving current in the first Hall element to the terminal located in the counterclockwise direction; or
(2) from any terminal position to a terminal located in the counterclockwise direction, when switching to shift the terminal position for injecting the driving current in the first Hall element to the terminal located in the clockwise direction, and
wherein
the first switching circuit is configured to perform switching to shift the terminal position for injecting the driving current, at least:
(1) from any terminal position to a terminal located in a direction rotating by +90 degrees and in the counterclockwise direction;
(2) from any terminal position to a terminal located in a direction rotating by −90 degrees and in the clockwise direction; or
(3) from any terminal position to a terminal located in a direction reversed by ±180 degrees, and
the second switching circuit is configured to perform switching to shift the terminal position for injecting the driving current:
(1) from any terminal position to a terminal located in a direction rotating by −90 degrees and in the clockwise direction, when switching to shift the terminal position for injecting the driving current in the first Hall element by +90 degrees and in the counterclockwise direction;
(2) from any terminal position to a terminal located in a direction rotating by +90 degrees and in the counterclockwise direction, when switching to shift the terminal position for injecting the driving current in the first Hall element to shift by −90 degrees and in the clockwise direction; or
(3) from any terminal position to a terminal located in a direction reversed by ±180 degrees, when switching to shift the terminal position for injecting the driving current in the first Hall element by ±180 degrees.

2. The Hall electromotive force signal detection circuit according to claim 1, wherein the first switching circuit is configured to switch the terminal position for injecting the driving current in the first Hall element to the first terminal, the second terminal, the fourth terminal, and the third terminal, of the first Hall element, in this order.

3. The Hall electromotive force signal detection circuit according to claim 2, wherein the second switching circuit is configured to switch the terminal position for injecting the driving current in the second Hall element:
(1) to the fourth terminal, the third terminal, the first terminal, and the second terminal, of the second Hall element in this order;
(2) to the first terminal, the fourth terminal, the second terminal, and the third terminal, of the second Hall element in this order;
(3) to the second terminal, the first terminal, the third terminal, and the fourth terminal, of the second Hall element in this order, or
(4) to the third terminal, the second terminal, the fourth terminal, and the first terminal, of the second Hall element in this order.

4. The Hall electromotive force signal detection circuit according to claim 1, comprising a layout arrangement in which four Hall elements are adjacent and parallel to each other, and the directions of driving currents of the four Hall elements are different from each other.

5. A Hall electromotive force signal detection circuit comprising:
a first Hall element including a first to a fourth terminals and configured to generate a first Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction;
a second Hall element including a first to a fourth terminals and configured to generate a second Hall electromotive force signal voltage, the first terminal and the third terminal facing each other, the second terminal and the fourth terminal facing each other, the first terminal, the second terminal, the third terminal, and the fourth terminal being arranged in this order in the counterclockwise direction;
a first switching circuit configured to select a terminal position for injecting a driving current and terminal positions for outputting the first Hall electromotive force signal voltage, out of the plurality of terminals of the first Hall elements;
a second switching circuit configured to select a terminal position for injecting a driving current and terminal positions for outputting the second Hall electromotive force signal voltage, out of the plurality of terminals of the second Hall elements;
a Hall electromotive force signal adder circuit configured to simultaneously add the first Hall electromotive force signal voltage and the second Hall electromotive force signal voltage; and
a chopper clock generation circuit configured to supply a chopper clock signal to the first switching circuit and the second switching circuit, wherein the first switching circuit and the second switching circuit are configured to switch based on the chopper clock signal,
wherein
the first switching circuit is configured to perform switching to shift the terminal position for injecting the driving current, at least:
(1) from any terminal position to a terminal located in a counterclockwise direction; or
(2) from any terminal position to a terminal located in a clockwise direction, and
the second switching circuit is configured to perform switching to shift the terminal position for injecting the driving current, at least:
(1) from any terminal position to a terminal located in the clockwise direction, when switching to shift the terminal position for injecting the driving current in the first Hall element to the terminal located in the counterclockwise direction; or
(2) from any terminal position to a terminal located in the counterclockwise direction, when switching to shift the terminal position for injecting the driving current in the first Hall element to the terminal located in the clockwise direction,
wherein the chopper clock generation circuit is configured to supply the chopper clock signal with four different phases to the first switching circuit and the second switching circuit, and wherein the first switching circuit is configured to inject the driving current from the first terminal when the chopper clock signal is in a first phase, to inject the driving current from the second terminal when the chopper clock signal is in a second phase, to inject the driving current from the fourth terminal when the chopper clock signal is in a third phase, and to inject the driving current from the third terminal when the chopper clock signal is in a fourth phase.

6. A Hall element driving method comprising:

shifting a terminal position for injecting a driving current into a first Hall element which generates a first Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least,
  (1) from any terminal position to a terminal located in a counterclockwise direction,
  (2) from any terminal position to a terminal located in a clockwise direction, or
  (3) from any terminal position to a terminal at a facing position; and shifting a terminal position for injecting the driving current into a second Hall element which generates a second Hall electromotive force signal voltage and includes a first terminal and a third terminal facing each other, and a second terminal and a fourth terminal facing each other, the first terminal, the second terminal, the third terminal, and the fourth terminal being arranged in this order in the counterclockwise direction, at least,
  (1) from any terminal position to a terminal located in the clockwise direction, when shifting the terminal position for injecting the driving current in the first Hall element to the terminal located in the counterclockwise direction,
  (2) from any terminal position to a terminal located in the counterclockwise direction, when shifting the terminal position for injecting the driving current in the first Hall element to the terminal located in the clockwise direction, or
  (3) from any terminal position to a terminal opposite to the any terminal position, when shifting the terminal position for injecting the driving current in the first Hall element to the facing position,
wherein the terminal position for injecting the driving current into the first Hall element is shifted to the first terminal, the second terminal, the fourth terminal, and the third terminal, of the first Hall element in this order.

7. The Hall element driving method according to claim 6, wherein the terminal position for injecting the driving current into the second Hall element is shifted:
  (1) to the fourth terminal, the third terminal, the first terminal, and the second terminal, of the second Hall element in this order;
  (2) to the first terminal, the fourth terminal, the second terminal, and the third terminal, of the second Hall element in this order;
  (3) to the second terminal, the first terminal, the third terminal, and the fourth terminal, of the second Hall element in this order, or
  (4) to the third terminal, the second terminal, the fourth terminal, and the first terminal, of the second Hall element in this order.

* * * * *